US009533376B2

(12) United States Patent
Veeramani et al.

(10) Patent No.: US 9,533,376 B2
(45) Date of Patent: Jan. 3, 2017

(54) METHODS OF FORMING PARTS USING LASER MACHINING

(71) Applicant: Microfabrica Inc., Van Nuys, CA (US)

(72) Inventors: Arun S. Veeramani, Glendale, CA (US); Heath A. Jensen, Los Angeles, CA (US); Uri Frodis, Los Angeles, CA (US); Christopher G. Wiita, Pasadena, CA (US); Michael S. Lockard, Lake Elizabeth, CA (US); Irina Boguslavsky, Sierra Madre, CA (US); Pavel Lembrikov, Santa Monica, CA (US); Dennis R. Smalley, Newhall, CA (US); Richard T. Chen, Burbank, CA (US)

(73) Assignee: Microfabrica Inc., Van Nuys, CA (US)

( * ) Notice: Subject to any disclaimer, the term of this patent is extended or adjusted under 35 U.S.C. 154(b) by 302 days.

(21) Appl. No.: 14/156,437

(22) Filed: Jan. 15, 2014

(65) Prior Publication Data

US 2014/0197145 A1 Jul. 17, 2014

Related U.S. Application Data

(60) Provisional application No. 61/752,596, filed on Jan. 15, 2013, provisional application No. 61/807,816, (Continued)

(51) Int. Cl.
*B23K 26/00* (2014.01)
*B23K 26/16* (2006.01)
(Continued)

(52) U.S. Cl.
CPC ........... *B23K 26/38* (2013.01); *B23K 26/0624* (2015.10); *B23K 26/18* (2013.01); *B23K 26/40* (2013.01);
(Continued)

(58) Field of Classification Search
CPC ............ B23K 2201/40; B23K 2203/50; B23K 26/0624; B23K 26/18; B23K 26/38; B23K 26/40; G01R 1/06738; G01R 1/06744; G01R 3/00
(Continued)

(56) References Cited

U.S. PATENT DOCUMENTS 4,705,592 A * 11/1987 Bahrle .................. H05K 3/108
204/192.14
4,835,361 A    5/1989 Strom
(Continued)

FOREIGN PATENT DOCUMENTS

JP        2002343747 A    11/2002
WO    WO2013101240 A1    7/2013

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161.
(Continued)

*Primary Examiner* — Sang Y Paik
(74) *Attorney, Agent, or Firm* — Dennis R. Smalley

(57) ABSTRACT

Embodiments are directed to the formation micro-scale or millimeter scale structures or method of making such structures wherein the structures are formed from at least one sheet structural material and may include additional sheet structural materials or deposited structural materials wherein all or a portion of the patterning of the structural materials occurs via laser cutting. In some embodiments, selective deposition is used to provide a portion of the patterning. In some embodiments the structural material or structural materials are bounded from below by a sacrificial bridging material (e.g. a metal) and possibly from above by a sacrificial capping material (e.g. a metal).

1 Claim, 26 Drawing Sheets

Related U.S. Application Data filed on Apr. 3, 2013, provisional application No. 61/888,060, filed on Oct. 8, 2013.

(51) Int. Cl.
| | |
|---|---|
| *B23K 26/38* | (2014.01) |
| *B23K 26/18* | (2006.01) |
| *B23K 26/40* | (2014.01) |
| *G01R 3/00* | (2006.01) |
| *G01R 1/067* | (2006.01) |

(52) U.S. Cl.
CPC ........ *B23K 2201/40* (2013.01); *B23K 2203/50* (2015.10); *G01R 1/06738* (2013.01); *G01R 1/06744* (2013.01); *G01R 3/00* (2013.01)

(58) Field of Classification Search
USPC .......................................... 219/121.6–121.83
See application file for complete search history.

(56) References Cited

U.S. PATENT DOCUMENTS

| | | | |
|---|---|---|---|
| 5,158,645 A * | 10/1992 | Covert ................. | H05K 3/0047 216/105 |
| 5,190,637 A | 3/1993 | Guckel | |
| 5,254,833 A * | 10/1993 | Okiyama ............. | B28D 5/0005 219/121.68 |
| 5,297,967 A | 3/1994 | Baumberger et al. | |
| 5,364,497 A | 11/1994 | Chau et al. | |
| 5,422,574 A | 6/1995 | Kister | |
| 5,500,503 A | 3/1996 | Pernicka et al. | |
| 5,502,292 A | 3/1996 | Pernicka et al. | |
| 5,850,148 A | 12/1998 | Nam | |
| 5,910,260 A | 6/1999 | Gerber | |
| 5,914,614 A | 6/1999 | Beaman et al. | |
| 5,994,152 A | 11/1999 | Khandros et al. | |
| 6,023,041 A * | 2/2000 | Noddin ................. | H01L 21/486 219/121.71 |
| 6,027,630 A | 2/2000 | Cohen | |
| 6,218,203 B1 | 4/2001 | Khoury et al. | |
| 6,250,933 B1 | 6/2001 | Khoury et al. | |
| 6,329,827 B1 | 12/2001 | Beaman et al. | |
| 6,343,369 B1 | 1/2002 | Saunders et al. | |
| 6,552,301 B2 | 4/2003 | Herman et al. | |
| 6,620,731 B1 | 9/2003 | Farnworth et al. | |
| 6,640,432 B1 | 11/2003 | Mathieu et al. | |
| 6,642,476 B2 * | 11/2003 | Hamann ............. | B23K 26/0608 219/121.7 |
| 6,657,448 B2 | 12/2003 | Hasegawa | |
| 6,720,781 B2 | 4/2004 | Ott et al. | |
| 6,722,032 B2 | 4/2004 | Beaman et al. | |
| 6,939,142 B2 | 9/2005 | Maruyama et al. | |
| 6,965,245 B2 | 11/2005 | Kister et al. | |
| 6,982,565 B2 | 1/2006 | Kirby | |
| 6,998,857 B2 | 2/2006 | Terada et al. | |
| 7,053,641 B2 | 5/2006 | Kirby | |
| 7,078,922 B2 | 7/2006 | Kirby | |
| 7,098,118 B2 | 8/2006 | Kobayashi | |
| 7,109,118 B2 | 9/2006 | Cohen et al. | |
| 7,127,811 B2 | 10/2006 | Mathieu et al. | |
| 7,163,875 B2 | 1/2007 | Richerzhagen | |
| 7,173,441 B2 | 2/2007 | Kister et al. | |
| 7,180,315 B2 | 2/2007 | Tunaboylu | |
| 7,388,172 B2 | 6/2008 | Sercel et al. | |
| 7,391,117 B2 | 6/2008 | Kirby et al. | |
| 7,456,642 B2 | 11/2008 | Saulnier et al. | |
| 7,458,816 B1 | 12/2008 | Mathieu et al. | |
| 7,462,800 B2 | 12/2008 | Tunaboylu et al. | |
| 7,586,060 B2 | 9/2009 | Urairi et al. | |
| 7,611,616 B2 | 11/2009 | Cohen et al. | |
| 7,629,807 B2 | 12/2009 | Hirakawa et al. | |
| 7,637,006 B2 | 12/2009 | Tunaboylu et al. | |
| 7,637,007 B2 | 12/2009 | Tunaboylu et al. | |
| 7,638,028 B2 | 12/2009 | Tunaboylu et al. | |
| 7,674,112 B2 | 3/2010 | Gritters et al. | |
| 7,709,768 B2 | 5/2010 | Sercel et al. | |
| 7,721,430 B2 | 5/2010 | Chartarifsky et al. | |
| 7,776,721 B2 | 8/2010 | Furuta | |
| 7,888,958 B2 | 2/2011 | Souma et al. | |
| 7,922,544 B2 | 4/2011 | Chung | |
| 8,033,838 B2 | 10/2011 | Eldridge et al. | |
| 8,198,137 B2 | 6/2012 | Heyl | |
| 8,202,684 B2 | 6/2012 | Hamada et al. | |
| 8,268,156 B2 | 9/2012 | Leavy | |
| 8,299,394 B2 | 10/2012 | Theppakuttai et al. | |
| 8,427,186 B2 | 4/2013 | McFarland | |
| 8,795,278 B2 | 8/2014 | Schmitz et al. | |
| 2003/0001606 A1 | 1/2003 | Bende et al. | |
| 2003/0113990 A1 | 6/2003 | Grube et al. | |
| 2004/0112880 A1 | 6/2004 | Sekiya | |
| 2004/0217768 A1 | 11/2004 | Kister et al. | |
| 2005/0023145 A1 | 2/2005 | Cohen et al. | |
| 2005/0184748 A1 | 8/2005 | Chen et al. | |
| 2005/0242073 A1 | 11/2005 | Nakamura et al. | |
| 2006/0035411 A1 | 2/2006 | Oba et al. | |
| 2006/0043995 A1 | 3/2006 | Williams et al. | |
| 2006/0228650 A1 * | 10/2006 | Matsuo ................. | B23K 26/38 430/311 |
| 2006/0282065 A1 | 12/2006 | Cohen | |
| 2007/0057685 A1 | 3/2007 | Garabedian et al. | |
| 2007/0152685 A1 | 7/2007 | Eldridge et al. | |
| 2007/0158200 A1 | 7/2007 | Cohen et al. | |
| 2007/0287914 A1 | 12/2007 | Cohen | |
| 2009/0079455 A1 | 3/2009 | Gritters | |
| 2009/0139965 A1 | 6/2009 | Mathieu et al. | |
| 2010/0032087 A1 | 2/2010 | Takahashi et al. | |
| 2011/0000898 A1 * | 1/2011 | Rumsby ............... | B23K 26/032 219/121.72 |
| 2011/0100826 A1 | 5/2011 | Leavy | |
| 2011/0169516 A1 | 7/2011 | McFarland | |
| 2012/0176122 A1 | 7/2012 | Hirata et al. | |
| 2012/0276791 A1 | 11/2012 | Boetto et al. | |
| 2012/0286816 A1 | 11/2012 | Kister | |
| 2012/0313660 A1 | 12/2012 | Kister | |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

Zhu, et al., "A New Laser Micromachining Technique Using a Mixed-Mode Ablation Approach", The Fifteenth IEEE International Conference on Micro Electro Mechanical Systems, Las Vegas, NV, Jan. 2002, 6 pages.

(56) References Cited

OTHER PUBLICATIONS

Madou, Mark J., "Fundamentals of Microfabrication—The Science of Miniaturzation", 2nd ed., 2001, pp. 402-412.

* cited by examiner

Main Materials Used in Part (e.g. Probe) Fabrication

A. SHEET STRMAT

B. DEPOSITED BRIDGE SACMAT:

C. SHEET BRIDGE SACMAT

D. X-MATERIAL SACMAT:

E. EXTERNAL X-LAYER STRMAT

F. INTERNAL X-LAYER STRMAT

G. TIP STRMAT or TIPMAT (DEPOSITED OR FROM SHEET)

H. ADHESION LAYER MATERIAL and/or BARRIER LAYER MATERIAL

I. SEED LAYER MATERIAL

J. BONDING MATERIAL or BONDMAT (DEPOSITED OR FROM SHEET)

K. CAPPING MATERIAL (DEPOSITED OR FROM SHEET)

L. CONDUCTIVITY IMPROVEMENT MATERIAL or CONMAT (DEPOSITED OR FROM SHEET)

M. DIELECTRIC MATERIAL or DIMAT (DEPOSITED OR FROM SHEET)

FIG. 1A

Part (e.g. Probe) Materials

A. Probe formed only of a single sheet of SHEET STRMAT

B. Probe formed of multiple sheets of SHEET STRMAT with or without an intermediate bonding or adhesion material C. Probe formed of SHEET STRMAT along with a TIPMAT.

D. Probe formed of SHEET STRMAT along with an additional non-tip STRMAT (e.g. BONDMAT, CONMAT, or DIMAT)

E. Probe formed of SHEET STRMAT along with an additional STRMAT and at least one TIPMAT F. Probe formed of SHEET STRMAT along with an additional EXTERNAL STRMAT and an INTERNAL STRMAT G. Probe formed of SHEET STRMAT along with an additional EXTERNAL STRMAT, an INTERNAL STRMAT, and a TIPMAT

FIG. 1B

| Processing Elements – Part 1 | |
|---|---|
| A. Laser cutting through SHEET STRMAT to form external part (e.g. probe) boundaries without leaving tabs: (1) single side cutting, (2) multiple side cutting, (3) single angle cutting, e.g. perpendicular, or (4) multiple cutting angles | B. Laser cutting though SHEET STRMAT to form external part (e.g. probe) boundaries while leaving tabs (e.g. for use in tethering): (1) single side cutting, (2) multiple side cutting, (3) single angle cutting, e.g. perpendicular, or (4) multiple cutting angles |
| C. Laser cutting through SHEET STRMAT to form recesses within the SHEET STRMAT: (1) single side cutting, (2) multiple side cutting, (3) single angle cutting, e.g. perpendicular, or (4) multiple cutting angles | D. Laser cutting through SHEET STRMAT to form internal holes within the SHEET STRMAT: (1) single side cutting, (2) multiple side cutting, (3) single angle cutting, e.g. perpendicular, or (4) multiple cutting angles |
| E. Laser cutting only part way through BRIDGE SACMAT: (1) single side cutting, (2) single angle cutting, e.g. perpendicular, or (3) multiple cutting angles | F. Laser cutting completely through BRIDGE SACMAT in selected locations: (1) single side cutting, (2) multiple side cutting, (3) single angle cutting, e.g. perpendicular, or (4) multiple cutting angles |

FIG. 1C

Processing Elements – Part 2

| | |
|---|---|
| G. Depositing DEPOSITABLE BRIDGE SACMAT: | H. Depositing one or more layers or partial layers of STRMAT, SACMAT adhesion material, seed layer material, bonding material or the like. |
| I. Depositing one or more SACMATs and one or more STRMATs as parts of each of one or more multi-material layers. | J. Bonding or otherwise adhering separated sheets to one another, deposited layers to one another, and or to each other. |
| K. Selective modification of one or more STRMATs | L. Removal of SACMATs (e.g. X-LAYER SACMAT or bridging SACMAT) by etching, melting, or ablation |
| M. Conformal deposition of a STRMAT (e.g. TIPMAT, CONMAT, BONDMAT, or DIMAT) with structural material (e.g. SHEET MAT) tethering element(s) in place | N. Conformal deposition of a STRMAT with a first SACMAT removed from one area but a second SACMAT located in a different area |
| O. Conformable Deposition of a STRMAT. | |

FIG. 1D

Cut Side View

Top View

Cut Side View

Cut Side View

Top View

Top View

Distal End View

Side View

METHODS OF FORMING PARTS USING LASER MACHINING

RELATED APPLICATIONS

This application claims the benefit of U.S. Provisional Patent Application Nos. 61/752,596, filed Jan. 15, 2013; 61/807,816, filed Apr. 3, 2013 and 61/888,060, filed Oct. 8, 2013. These applications are incorporated herein by reference as if set forth in full herein.

FIELD OF THE INVENTION

The present invention relates generally to the field of forming microstructures or MEMS and in some embodiments to the field of forming micro-scale or millimeter-scale probes or contactors for use in electrical testing or interconnect applications such as wafer level semiconductor device testing and more particularly to processes for forming such structures or devices using laser machining methods.

BACKGROUND OF THE INVENTION

Various methods for forming microprobes have been taught previously. Some of these methods have involved multi-layer, multi-material electrodeposition to produce microprobes. Examples of such methods are set forth in US Patent Application Publication No. 2011/0132767, by Ming Ting Wu et al., and entitled Multi-Layer, "Multi-Material Fabrication Methods for Producing Micro-Scale and Millimeter-Scale Devices with Enhanced Electrical or Mechanical Properties".

Some of these methods have involved the use of laser cutting. Example of such methods are set forth in US Patent Application Publication No. 2012/0286816, by January Kister and entitled "PROBES WITH HIGH CURRENT CARRYING CAPABILITY AND LASER MACHINING METHODS". As exemplified, laser cutting is used to cut out cross-sections of probes from sheets of material such as tungsten, copper-tungsten mixtures, or molybdenum. In the processes, as taught, the sheet material is completely cut through preferably using a plurality of passes of the laser beam such that each pass removes a fraction of the thickness of the sheet. During the cutting the sheet is elevated above a base and once the sheet is cut all the way through individual probes fall away from the sheet. In some embodiments, tip ends and or opposite ends of the probes may be coated with appropriate materials. Such coatings may improve bonding, probe conductivity, and or tip hardness.

Some prior approaches to laser cutting parts from a foil or sheet have included methods of tethering parts to the foil so that they are still minimally attached to the foil following the laser machining process. This modification poses challenges as it still allows movement of the parts in areas that are not tethered, may allow differential heating of various portions of the probes, and requires removal of the tethers without damaging the parts.

A need remains for improved methods for forming microprobes and other microdevices that include materials that are not electrodepositable. A need remains for improved methods of forming microprobes and other microdevices using laser cutting. A need remains for improved methods of forming microdevices and improved microdevices themselves that include both laser cut features and deposited materials.

SUMMARY OF THE INVENTION

It is an object of some embodiments of the invention to provide an improved method for forming multi-layer three-dimensional structures with improved material properties, e.g. probes with improved properties that can be used for testing integrated circuits.

It is an object of some embodiments of the invention to provide an improved method for forming single layer structures with improved material properties, e.g. probes with improved properties that can be used for testing integrated circuits.

It is an object of some embodiments of the invention to provide an improved method for fabricating parts, e.g. probes, using laser machining of sheet material.

It is an object of some embodiments of the invention to provide an improved method for fabricating parts, e.g. probes, from multiple bonded sheets of material using laser machining.

It is an object of some embodiments of the invention to provide an improved method for fabricating parts, e.g. probes, formed from a combination of sheet material and deposited material wherein laser machining is used to define the dimensions of the sheet material but is not used to define the dimensions of the deposited material.

It is an object of some embodiments of the invention to provide an improved method for fabricating probes formed from a combination of sheet material and deposited material wherein laser machining is used to define the dimensions of the sheet material and part of the dimensions of the deposited material or materials.

It is an object of some embodiments of the invention to provide an improved method for fabricating parts, e.g. probes, from a combination of sheet material and deposited material wherein the laser machining is used to define the dimensions of the sheet material and the dimensions of the deposited material or materials.

It is an object of some embodiments of the invention to provide an improved method for fabricating parts, e.g. probes, having a tip material that is different from the sheet material wherein the tip material is deposited on to the sheet material prior to patterning the sheet material.

It is an object of some embodiments of the invention to provide an improved method for fabricating parts, e.g. probes, having a tip material that is different from the sheet material wherein the tip material is deposited on to the sheet material after at least partial patterning the sheet material.

It is an object of some embodiments of the invention to provide an improved method for fabricating parts, e.g. probes, having a conductivity enhancing material that is different from the sheet material wherein the conductivity enhancing material is deposited on to the sheet material prior to patterning the sheet material.

It is an object of some embodiments of the invention to provide an improved method for fabricating parts, e.g. probes, having a conductivity enhancing material that is different from the sheet material wherein the conductivity enhancing material is deposited on to the sheet material after at least partial patterning the sheet material.

It is an object of some embodiments of the invention to provide an improved method for fabricating parts, e.g. probes, having a bonding enhancement material that is different from the sheet material wherein the bonding enhancement material is deposited on to the sheet material prior to patterning the sheet material.

It is an object of some embodiments of the invention to provide an improved method for fabricating parts, e.g. probes, having a bonding enhancement material that is different from the sheet material wherein the bonding enhancement material is deposited on to the sheet material after at least partial patterning the sheet material.

It is an object of some embodiments of the invention to provide an improved method for fabricating parts, e.g. probes, having a contact tip located in a common plane as the sheet material but formed of a different material. In some variations of this object, the tip and the sheet material of the probe may be held together not just by a bonding or joining of the material but by one or more of (1) a mechanical interlocking of the different materials within the plane of the sheet, (2) the tip material wrapping around at least part of one or both opposing sides of the sheet material, (3) the tip material being held by one or more channels or holes in the sheet material that result in a partial surrounding of the tip material by the sheet material, and (4) by a sandwich of either additional sheet material or some other material on at least one side but possibly on two opposing sides of at least a portion of the tip material.

It is an object of some embodiments of the invention to provide an improved method for fabricating parts, e.g. probes, having a part body formed from at least one sheet of material and a part tip which is located on a layer different from a layer that includes the at least one sheet of material.

It is an object of some embodiments of the invention to provide an improved method for fabricating parts, e.g. probes, wherein the parts are formed at least in part from laser cutting of sheets of material where the cutting of a portion of a periphery of one part by a laser beam results in cutting the periphery of a portion of a neighboring part that is being formed from the sheet or sheets.

It is an object of some embodiments of the invention to provide an improved method for fabricating parts, e.g. probes, wherein the parts are formed at least in part from a sheet of material wherein the material of the sheet meets one or more of the following criteria: (1) the material is not electrodepositable from an aqueous solution, and (2) the material comprises a conductive refractory material.

It is an object of some embodiments of the invention to provide an improved method for fabricating parts, e.g. probes, and handling parts wherein a plurality of parts remain tethered to one another after fabrication and removal of a bridging sacrificial material but which are untethered prior to (1) assembly into an array or (2) after assembly but prior to being put to use.

It is an object of some embodiments of the invention to provide an improved method for fabricating parts, e.g. probes, wherein a coating of an additional structural material occurs in whole or in part after removal of a bridging material. In some variations, the parts are tethered together during the removal.

It is an object of some embodiments of the invention to provide an improved method for fabricating parts, e.g. probes, using laser cutting of a sheet material wherein a laser beam is directed onto the sheet with an orientation selected from one or more of: (1) perpendicular to an initial incident surface of the sheet, (2) at a non-perpendicular angle to an initial incident surface of the sheet, (3) at a non-perpendicular angle to and initial incident surface of the sheet wherein the angle varies depending on the region of the part being cut.

It is an object of some embodiments of the invention to provide improved micro-scale or millimeter scale parts, e.g. probes.

It is an object of some embodiments of the invention to provide micro-scale or millimeter-scale parts, e.g. probe devices, incorporating multiple bonded sheets of material. In some variations of this object, the one or more sheets may be laser cut (e.g. to form openings) prior to or after bonding. In other variations, the sheets may be bonded without an intermediate bonding material. In still other variations the sheets may be bonded using one or more intermediate materials located between the sheets.

It is an object of some embodiments of the invention to provide micro-scale or millimeter-scale parts, e.g. probe devices, incorporating a combination of laser cut sheet material and deposited material (e.g. blanket deposited, lithographically patterned, or laser patterned).

It is an object of some embodiments of the invention to provide improved methods for fabricating micro-scale or millimeter parts, e.g. probes, having improved laser cut sidewall features.

It is an object of some embodiments of the invention to provide improved methods for fabricating micro-scale or millimeter parts, e.g. probes, using improved part stabilization during the entire laser cutting process.

It is an object of some embodiments of the invention to provide improved methods for fabricating micro-scale or millimeter parts, e.g. probes, using improved protection against cutting debris accumulation on part surfaces.

It is an object of some embodiments of the invention to provide improved methods for fabricating micro-scale or millimeter parts, e.g. probes, using improved temperature stabilization during laser cutting It is an object of some embodiments of the invention to provide improved methods for fabricating micro-scale or millimeter-scale parts or devices that are not probes.

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, or alternatively may address some other object ascertained from the teachings herein. It is not necessarily intended that all objects be addressed by any single embodiment or aspect of the invention even though that may be the case with regard to some embodiments and/or aspects.

In a first aspect of the invention a method of forming at least one micro-scale or millimeter-scale structure, includes: (a) providing at least one sheet of structural material having a front side and a backside; (b) locating a bridging sacrificial material directly or indirectly on the backside of the at least one sheet of structural material; (c) using a laser beam to cut completely through the at least one sheet from the front side to the backside; and (d) removing the bridging sacrificial material.

Numerous variations of the first aspect of the invention exist and include, for example: (1) the structural material of the sheet includes a metal; (2) the bridging sacrificial material includes a metal; (3) the bridging sacrificial material is deposited directly or indirectly onto the at least one sheet of structural material by electroplating; (4) a sacrificial capping material is located directly or indirectly on the opposite side of the at least one sheet structural material relative to the bridging sacrificial material: (5) the capping sacrificial material of the $4^{th}$ variation can be a metal; (6) the capping sacrificial material of the $4^{th}$ and $5^{th}$ variations can be deposited directly or indirectly onto the at least one sheet of structural material by electroplating; (7) the bridging sacrificial material is attached directly or indirectly to a base; (8) the base of the $7^{th}$ variation comprises a frame to which the bridging sacrificial material is attached; (9) the attachment to the base of the $7^{th}$ variation can include a method selected from the group consisting of (a) locating a solidifiable polymer between the base and the bridging sacrificial material and then solidifying the polymer, (b) electroplating a sacrificial material through openings in the base onto the bridging sacrificial material that is being pressed against the base; (10) the at least one structure is selected from the group consisting of (a) a compliant pin, (b) a probe for use in a probe card for testing integrated circuits, (c) an electrical spring contactor, and (d) a multi-component device; (11) cutting by the laser beam occurs by a method selected from the group consisting of: (a) using a single pass that cuts completely through the sheet material, (b) using multiple passes along a common cutting line, and (c) using multiple passes along a plurality of offset cutting lines; (12) the direct or indirect locating of the bridging sacrificial material on the sheet of structural material comprises indirect locating as at least one intermediate material is positioned between the bridging sacrificial material and the sheet of structural material wherein the at least one material is selected from the group consisting of (a) one single material layer, (b) a plurality of single material layers, (c) a single multi-material layer, (d) a plurality of multi-material layers, (e) a combination of at least one multi-material layer and at least one single material layer; (13) the direct or indirect locating of the capping sacrificial material on the sheet of structural material of the $4^{th}$-$7^{th}$ variation includes indirect locating as at least one intermediate material is positioned between the capping sacrificial material and the sheet of structural material wherein the at least one material is selected from the group consisting of (a) one single material layer, (b) a plurality of single material layers, (c) a single multi-material layer, (d) a plurality of multi-material layers, (e) a combination of at least one multi-material layer and at least one single material layer; (13) the angle of incidence of a laser beam onto the sheet material is different when cutting at least two different portions of the sheet material; (14) the at least one structure formed is inspected and wherein at least one step is implemented that is selected from the group consisting of: (a) flagging any failed structure for special handling; (b) cutting any failed structure into two or more pieces to enable them to be readily distinguished from structures that did not fail inspection; (c) attaching any failed structure to adjacent element; (15) use of at least one planarization operation of to set a boundary level for at least one of the layers; (16) the at least one structure includes a plurality of identical structures; (17) the at least one structure includes a plurality of structures with at least two of the plurality having different configurations; (18) the at least one sheet material includes at least one region that undergoes vertical narrowing by laser ablation prior to cutting out the perimeter region of the at least one structure; (18) the at least one sheet material includes at least one region that undergoes vertical narrowing by laser ablation after cutting out the perimeter region of the at least one structure; (19) the at least one sheet material includes at least one region that undergoes vertical narrowing prior to locating at least one additional layer of material; (20) the at least one sheet material undergoes laser ablation to form at least one through hole prior to locating at least one additional layer of material; (21) during laser cutting the sacrificial bridging material is cut completely through in at least some locations; (22) during laser cutting the sacrificial bridging material is not cut completely through in any locations; (23) laser cutting of the sheet material or of another structural material occurs from both the top and bottom surfaces. These variations may be used as variations of other variations so long as the added variation makes sense and so long as not all benefits of the added variation are eliminated by the combination.

In a second aspect of the invention, a method of forming at least one micro-scale or millimeter-scale structure, includes: (a) providing at least one sheet of structural material having a front side and a backside; (b) locating a bridging sacrificial material directly or indirectly on the backside of the at least one sheet of structural material; (c) using a laser beam to cut completely through the at least one sheet from the front side to the backside but not completely through the bridging sacrificial material such that during the cutting the structural material of the at least one sheet on either side of a cut retains its relative position; and (d) removing the bridging sacrificial material.

Numerous variations of the second aspect of the invention exist and include, for example: (1) the structural material of the sheet includes a metal; (2) the bridging sacrificial material includes a metal; (3) the bridging sacrificial material is deposited directly or indirectly onto the at least one sheet of structural material by electroplating; (4) a sacrificial capping material is located directly or indirectly on the opposite side of the at least one sheet structural material relative to the bridging sacrificial material: (5) the capping sacrificial material of the $4^{th}$ variation can be a metal; (6) the capping sacrificial material of the $4^{th}$ and $5^{th}$ variations can be deposited directly or indirectly onto the at least one sheet of structural material by electroplating; (7) the bridging sacrificial material is attached directly or indirectly to a base; (8) the base of the $7^{th}$ variation comprises a frame to which the bridging sacrificial material is attached; (9) the attachment to the base of the $7^{th}$ variation can include a method selected from the group consisting of (a) locating a solidifiable polymer between the base and the bridging sacrificial material and then solidifying the polymer, (b) electroplating a sacrificial material through openings in the base onto the bridging sacrificial material that is being pressed against the base; (10) the at least one structure is selected from the group consisting of (a) a compliant pin, (b) a probe for use in a probe card for testing integrated circuits, (c) an electrical spring contactor, and (d) a multi-component device; (11) cutting by the laser beam occurs by a method selected from the group consisting of: (a) using a single pass that cuts completely through the sheet material, (b) using multiple passes along a common cutting line, and (c) using multiple passes along a plurality of offset cutting lines; (12) the direct or indirect locating of the bridging sacrificial material on the sheet of structural material comprises indirect locating as at least one intermediate material is positioned between the bridging sacrificial material and the sheet of structural material wherein the at least one material is selected from the group consisting of (a) one single material layer, (b) a plurality of single material layers, (c) a single multi-material layer, (d) a plurality of multi-material layers, (e) a combination of at least one multi-material layer and at least one single material layer; (13) the direct or indirect locating of the capping sacrificial material on the sheet of structural material of the $4^{th}$-$7^{th}$ variation includes indirect locating as at least one intermediate material is positioned between the capping sacrificial material and the sheet of structural material wherein the at least one material is selected from the group consisting of (a) one single material layer, (b) a plurality of single material layers, (c) a single multi-material layer, (d) a plurality of multi-material layers, (e) a combination of at least one multi-material layer and at least one single material layer; (13) the angle of incidence of a laser beam onto the sheet material is different when cutting at least two different portions of the sheet material; (14) the at least one structure formed is inspected and wherein at least one step is implemented that is selected from the group consisting of: (a) flagging any failed structure for special handling; (b) cutting any failed structure into two or more pieces to enable them to be readily distinguished from structures that did not fail inspection; (c) attaching any failed structure to adjacent element; (15) use of at least one planarization operation of to set a boundary level for at least one of the layers; (16) the at least one structure includes a plurality of identical structures; (17) the at least one structure includes a plurality of structures with at least two of the plurality having different configurations; (18) the at least one sheet material includes at least one region that undergoes vertical narrowing by laser ablation prior to cutting out the perimeter region of the at least one structure; (19) the at least one sheet material includes at least one region that undergoes vertical narrowing by laser ablation after cutting out the perimeter region of the at least one structure; (20) the at least one sheet material includes at least one region that undergoes vertical narrowing prior to locating at least one additional layer of material; and (21) the at least one sheet material undergoes laser ablation to form at least one through hole prior to locating at least one additional layer of material. These variations may be used as variations of other variations so long as the added variation makes sense and so long as not all benefits of the added variation are eliminated by the combination.

In a third aspect of the invention, a method of forming at least one micro-scale or millimeter-scale structure, includes: (a) providing at least one sheet of structural material having a front side and a backside; (b) locating bridging sacrificial material directly or indirectly on the backside of the at least one sheet of structural material; (c) locating the bridging sacrificial material directly or indirectly on a base, wherein the sheet of structural material and the base are located on opposite sides of the bridging sacrificial material; (d) using a laser beam to cut completely through the at least one sheet and the bridging sacrificial material from the front side to the backside to define a perimeter of the structure; and (e) removing the bridging sacrificial material to separate the structure from the base.

Numerous variations of the third aspect of the invention exist and include, for example: (1) the structural material of the sheet includes a metal; (2) the bridging sacrificial material includes a metal; (3) the bridging sacrificial material is deposited directly or indirectly onto the at least one sheet of structural material by electroplating; (4) a sacrificial capping material is located directly or indirectly on the opposite side of the at least one sheet structural material relative to the bridging sacrificial material: (5) the capping sacrificial material of the $4^{th}$ variation can be a metal; (6) the capping sacrificial material of the $4^{th}$ and $5^{th}$ variations can be deposited directly or indirectly onto the at least one sheet of structural material by electroplating; (7) the attachment to the base includes a method selected from the group consisting of (a) locating a solidifiable polymer between the base and the bridging sacrificial material and then solidifying the polymer, (b) electroplating a sacrificial material through openings in the base onto the bridging sacrificial material that is being pressed against the base; (8) the at least one structure is selected from the group consisting of (a) a compliant pin, (b) a probe for use in a probe card for testing integrated circuits, (c) an electrical spring contactor, and (d) a multi-component device; (9) cutting by the laser beam occurs by a method selected from the group consisting of: (a) using a single pass that cuts completely through the sheet material, (b) using multiple passes along a common cutting line, and (c) using multiple passes along a plurality of offset cutting lines; (10) the direct or indirect locating of the bridging sacrificial material on the sheet of structural material comprises indirect locating as at least one intermediate material is positioned between the bridging sacrificial material and the sheet of structural material wherein the at least one material is selected from the group consisting of (a) one single material layer, (b) a plurality of single material layers, (c) a single multi-material layer, (d) a plurality of multi-material layers, (e) a combination of at least one multi-material layer and at least one single material layer; (11) the direct or indirect locating of the capping sacrificial material on the sheet of structural material of the $4^{th}$-$7^{th}$ variation includes indirect locating as at least one intermediate material is positioned between the capping sacrificial material and the sheet of structural material wherein the at least one material is selected from the group consisting of (a) one single material layer, (b) a plurality of single material layers, (c) a single multi-material layer, (d) a plurality of multi-material layers, (e) a combination of at least one multi-material layer and at least one single material layer; (12) the angle of incidence of a laser beam onto the sheet material is different when cutting at least two different portions of the sheet material; (14) the at least one structure formed is inspected and wherein at least one step is implemented that is selected from the group consisting of: (a) flagging any failed structure for special handling; (b) cutting any failed structure into two or more pieces to enable them to be readily distinguished from structures that did not fail inspection; (c) attaching any failed structure to adjacent element; (13) use of at least one planarization operation of to set a boundary level for at least one of the layers; (14) the at least one structure includes a plurality of identical structures; (15) the at least one structure includes a plurality of structures with at least two of the plurality having different configurations; (16) the at least one sheet material includes at least one region that undergoes vertical narrowing by laser ablation prior to cutting out the perimeter region of the at least one structure; (17) the at least one sheet material includes at least one region that undergoes vertical narrowing by laser ablation after cutting out the perimeter region of the at least one structure; (18) the at least one sheet material includes at least one region that undergoes vertical narrowing prior to locating at least one additional layer of material; and (19) the at least one sheet material undergoes laser ablation to form at least one through hole prior to locating at least one additional layer of material. These variations may be used as variations of other variations so long as the added variation makes sense and so long as not all benefits of the added variation are eliminated by the combination.

In a fourth aspect of the invention a method of forming at least one micro-scale or millimeter-scale structure, includes: (a) providing at least one sheet of structural material having a front side and a backside; (b) locating bridging sacrificial material directly or indirectly on the backside of the at least one sheet of structural material; (c) using a laser beam to cut completely through the at least one sheet of structural material along a perimeter of the structure except at at least one location such that a tethering element is formed of a portion of the at least one sheet material that continues to connect the sheet structural material on either side of an opening through the at least one sheet of structural material cut by the laser beam; and (d) removing the bridging sacrificial material and cutting the tethering element to separate the structure from the substrate and to separate the structure from other structural material of the at least one sheet.

Numerous variations of the forth aspect of the invention exist and include, for example: (1) the structural material of the sheet includes a metal; (2) the bridging sacrificial material includes a metal; (3) the bridging sacrificial material is deposited directly or indirectly onto the at least one sheet of structural material by electroplating; (4) a sacrificial capping material is located directly or indirectly on the opposite side of the at least one sheet structural material relative to the bridging sacrificial material: (5) the capping sacrificial material of the 4$^{th}$ variation can be a metal; (6) the capping sacrificial material of the 4$^{th}$ and 5$^{th}$ variations can be deposited directly or indirectly onto the at least one sheet of structural material by electroplating; (7) the bridging sacrificial material is attached directly or indirectly to a base; (8) the base of the 7$^{th}$ variation comprises a frame to which the bridging sacrificial material is attached; (9) the attachment to the base of the 7$^{th}$ variation can include a method selected from the group consisting of (a) locating a solidifiable polymer between the base and the bridging sacrificial material and then solidifying the polymer, (b) electroplating a sacrificial material through openings in the base onto the bridging sacrificial material that is being pressed against the base; (10) the at least one structure is selected from the group consisting of (a) a compliant pin, (b) a probe for use in a probe card for testing integrated circuits, (c) an electrical spring contactor, and (d) a multi-component device; (11) cutting by the laser beam occurs by a method selected from the group consisting of: (a) using a single pass that cuts completely through the sheet material, (b) using multiple passes along a common cutting line, and (c) using multiple passes along a plurality of offset cutting lines; (12) the direct or indirect locating of the bridging sacrificial material on the sheet of structural material comprises indirect locating as at least one intermediate material is positioned between the bridging sacrificial material and the sheet of structural material wherein the at least one material is selected from the group consisting of (a) one single material layer, (b) a plurality of single material layers, (c) a single multi-material layer, (d) a plurality of multi-material layers, (e) a combination of at least one multi-material layer and at least one single material layer; (13) the direct or indirect locating of the capping sacrificial material on the sheet of structural material of the 4$^{th}$-7$^{th}$ variation includes indirect locating as at least one intermediate material is positioned between the capping sacrificial material and the sheet of structural material wherein the at least one material is selected from the group consisting of (a) one single material layer, (b) a plurality of single material layers, (c) a single multi-material layer, (d) a plurality of multi-material layers, (e) a combination of at least one multi-material layer and at least one single material layer; (13) the angle of incidence of a laser beam onto the sheet material is different when cutting at least two different portions of the sheet material; (14) the at least one structure formed is inspected and wherein at least one step is implemented that is selected from the group consisting of: (a) flagging any failed structure for special handling; (b) cutting any failed structure into two or more pieces to enable them to be readily distinguished from structures that did not fail inspection; (c) attaching any failed structure to adjacent element; (15) use of at least one planarization operation of to set a boundary level for at least one of the layers; (16) the at least one structure includes a plurality of identical structures; (17) the at least one structure includes a plurality of structures with at least two of the plurality having different configurations; (18) the at least one sheet material includes at least one region that undergoes vertical narrowing by laser ablation prior to cutting out the perimeter region of the at least one structure; (18) the at least one sheet material includes at least one region that undergoes vertical narrowing by laser ablation after cutting out the perimeter region of the at least one structure; (19) the at least one sheet material includes at least one region that undergoes vertical narrowing prior to locating at least one additional layer of material; (20) the at least one sheet material undergoes laser ablation to form at least one through hole prior to locating at least one additional layer of material; (21) during laser cutting the sacrificial bridging material is cut completely through in at least some locations; (22) during laser cutting the sacrificial bridging material is not cut completely through in any locations; (23) laser cutting of the sheet material or of another structural material occurs from both the top and bottom surfaces; (24) the using of a laser beam to cut completely through the at least one sheet of structural material along a perimeter of the structure except at at least one location comprises leaving at least two separated regions uncut such that at least two tethering elements are formed; (25) the removing of the bridging sacrificial material occurs prior to the cutting of the tethering element or elements; (26) the removing the bridging sacrificial material occurs after the cutting of the tethering element or elements; (27) the at least one structure includes a plurality of structures and wherein an order of cutting tethers and removing bridging sacrificial material is selected from the group consisting of: (a) each tethering element for structures that did not fail in fabrication are cut prior to removing the bridging sacrificial material whereas at least one tethering element for each of any structures that failed in fabrication are not cut prior to removing the bridging sacrificial material and (b) each tethering element for any structures that failed fabrication process are cut prior to removing the bridging sacrificial material whereas at least one tethering element for each structure that did not fail fabrication are not cut prior to removing the bridging sacrificial material; (28) after removal of the bridging sacrificial material of but prior to cutting at least some of the tethering elements, applying one or more coatings of at least one structural material to at least a portion of the at least one structure. These variations may be used as variations of other variations so long as the added variation makes sense and so long as not all benefits of the added variation are eliminated by the combination.

In a fifth aspect of the invention, a method of forming at least one micro-scale or millimeter-scale structure, includes: (a) providing at least one sheet of structural material having a front side and a backside; (b) locating bridging sacrificial material directly or indirectly on the backside of the at least one sheet of structural material; (c) using a laser beam to cut completely through the at least one sheet of structural material along a perimeter of the structure; (d) locating at least one deposited single structural material layer or multi-material layer directly or indirectly in contact with the at least one sheet of structural material, wherein the at least one deposited single structural material layer or multi-material layer provides at least one tethering element of structural material that connects the sheet structural material on either side of an opening through the at least one sheet of structural material cut by the laser beam; and (e) removing the bridging sacrificial material and cutting the at least one tethering element to separate the structure from the substrate and to separate the structure from other structural material of the at least one sheet.

Numerous variations of the fifth aspect of the invention exist and include, for example: (1) the structural material of the sheet includes a metal; (2) the bridging sacrificial material includes a metal; (3) the bridging sacrificial material is deposited directly or indirectly onto the at least one sheet of structural material by electroplating; (4) a sacrificial capping material is located directly or indirectly on the opposite side of the at least one sheet structural material relative to the bridging sacrificial material: (5) the capping sacrificial material of the $4^{th}$ variation can be a metal; (6) the capping sacrificial material of the $4^{th}$ and $5^{th}$ variations can be deposited directly or indirectly onto the at least one sheet of structural material by electroplating; (7) the bridging sacrificial material is attached directly or indirectly to a base; (8) the base of the $7^{th}$ variation comprises a frame to which the bridging sacrificial material is attached; (9) the attachment to the base of the $7^{th}$ variation can include a method selected from the group consisting of (a) locating a solidifiable polymer between the base and the bridging sacrificial material and then solidifying the polymer, (b) electroplating a sacrificial material through openings in the base onto the bridging sacrificial material that is being pressed against the base; (10) the at least one structure is selected from the group consisting of (a) a compliant pin, (b) a probe for use in a probe card for testing integrated circuits, (c) an electrical spring contactor, and (d) a multi-component device; (11) cutting by the laser beam occurs by a method selected from the group consisting of: (a) using a single pass that cuts completely through the sheet material, (b) using multiple passes along a common cutting line, and (c) using multiple passes along a plurality of offset cutting lines; (12) the direct or indirect locating of the bridging sacrificial material on the sheet of structural material comprises indirect locating as at least one intermediate material is positioned between the bridging sacrificial material and the sheet of structural material wherein the at least one material is selected from the group consisting of (a) one single material layer, (b) a plurality of single material layers, (c) a single multi-material layer, (d) a plurality of multi-material layers, (e) a combination of at least one multi-material layer and at least one single material layer; (13) the direct or indirect locating of the capping sacrificial material on the sheet of structural material of the $4^{th}$-$7^{th}$ variation includes indirect locating as at least one intermediate material is positioned between the capping sacrificial material and the sheet of structural material wherein the at least one material is selected from the group consisting of (a) one single material layer, (b) a plurality of single material layers, (c) a single multi-material layer, (d) a plurality of multi-material layers, (e) a combination of at least one multi-material layer and at least one single material layer; (13) the angle of incidence of a laser beam onto the sheet material is different when cutting at least two different portions of the sheet material; (14) the at least one structure formed is inspected and wherein at least one step is implemented that is selected from the group consisting of: (a) flagging any failed structure for special handling; (b) cutting any failed structure into two or more pieces to enable them to be readily distinguished from structures that did not fail inspection; (c) attaching any failed structure to adjacent element; (15) use of at least one planarization operation of to set a boundary level for at least one of the layers; (16) the at least one structure includes a plurality of identical structures; (17) the at least one structure includes a plurality of structures with at least two of the plurality having different configurations; (18) the at least one sheet material includes at least one region that undergoes vertical narrowing by laser ablation prior to cutting out the perimeter region of the at least one structure; (18) the at least one sheet material includes at least one region that undergoes vertical narrowing by laser ablation after cutting out the perimeter region of the at least one structure; (19) the at least one sheet material includes at least one region that undergoes vertical narrowing prior to locating at least one additional layer of material; (20) the at least one sheet material undergoes laser ablation to form at least one through hole prior to locating at least one additional layer of material; (21) during laser cutting the sacrificial bridging material is cut completely through in at least some locations; (22) during laser cutting the sacrificial bridging material is not cut completely through in any locations; (23) laser cutting of the sheet material or of another structural material occurs from both the top and bottom surfaces; (24) the at least one tethering element includes at least two tethering elements for a single structure; (25) the removing of the bridging sacrificial material occurs prior to the cutting of the tethering element or elements; (26) the removing the bridging sacrificial material occurs after the cutting of the tethering element or elements; (27) the at least one structure includes a plurality of structures and wherein an order of cutting tethers and removing bridging sacrificial material is selected from the group consisting of: (a) each tethering element for structures that did not fail in fabrication are cut prior to removing the bridging sacrificial material whereas at least one tethering element for each of any structures that failed in fabrication are not cut prior to removing the bridging sacrificial material and (b) each tethering element for any structures that failed fabrication process are cut prior to removing the bridging sacrificial material whereas at least one tethering element for each structure that did not fail fabrication are not cut prior to removing the bridging sacrificial material; and (28) after removal of the bridging sacrificial material but prior to cutting at least some of the tethering elements, applying one or more coatings of at least one structural material to at least a portion of the at least one structure. These variations may be used as variations of other variations so long as the added variation makes sense and so long as not all benefits of the added variation are eliminated by the combination.

In a sixth aspect of the invention a method of forming at least one micro-scale or millimeter-scale structure, includes (a) providing at least one sheet of structural material having a front side and a backside; (b) locating at least one multi-material layer comprising a structural material in some lateral regions and a sacrificial material in other lateral regions of the multi-material layer indirectly or directly to the backside of the at least one sheet of structural material; (c) using a laser beam to cut completely through the at least one sheet from the front side to the back side but not completely through the at least one multi-material layer such that during the cutting the structural material from the at least one sheet on either side of a cut retains its position relative to another side of the cut; and (d) removing the sacrificial material from the at least one multi-material layer.

Numerous variations of the sixth aspect of the invention exist and include, for example: (1) the structural material of the sheet includes a metal; (2) a sacrificial capping material is located directly or indirectly on the opposite side of the at least one sheet structural material relative to the bridging sacrificial material; (3) the capping sacrificial material of the second variation includes a metal; (4) the capping sacrificial material of the third variation is deposited directly or indirectly onto the at least one sheet of structural material by electroplating; (5) the at least one multi-material layer is attached directly or indirectly to a base; (6) the base of the fifth variation includes a frame to which attachment is made; (7) the attachment to the base of the fifth variation includes a method selected from the group consisting of (a) locating a solidifiable polymer between the base and the at least one multi-material layer and then solidifying the polymer, (b) electroplating a sacrificial material through openings in the base onto at least one multi-material layer that is being pressed against the base; (8) the at least one structure is selected from the group consisting of (a) a compliant pin, (b) a probe for use in a probe card for testing integrated circuits, (c) an electrical spring contactor, and (d) a multi-component device; (9) cutting by the laser beam occurs by a method selected from the group consisting of: (a) using a single pass that cuts completely through the sheet material, (b) using multiple passes along a common cutting line, and (c) using multiple passes along a plurality of offset cutting lines; (10) the direct or indirect locating of the capping sacrificial material on the sheet of structural material of the second to fourth variations includes indirect locating as at least one intermediate material is positioned between the capping sacrificial material and the sheet of structural material wherein the at least one material is selected from the group consisting of (a) one single material layer, (b) a plurality of single material layers, (3) a single multi-material layer, (d) a plurality of multi-material layers, (e) a combination of at least one multi-material layer and at least one single material layer; (11) the angle of incidence of a laser beam onto the sheet material is different when cutting at least two different portions of the sheet material; (12) the at least one structure formed is inspected and wherein at least one step is implement that is selected from the group consisting of (a) flagging any failed structure for special handling, (b) cutting any failed structure into two or more pieces to enable them to be readily distinguished from structures that did not fail inspection, (c) attaching any failed structure to adjacent element; (13) at least one planarization operation is used to set a boundary level for at least one of the layers; (14) the at least one structure comprises a plurality of identical structures; (15) the at least one structure comprises a plurality of structures with at least two of the plurality having different configurations; (16) the at least one sheet material includes at least one region that undergoes vertical narrowing by laser ablation prior to cutting out the perimeter region of the at least one structure; (17) the at least one sheet material includes at least one region that undergoes vertical narrowing prior to locating at least one additional layer of material; (18) the at least one sheet material undergoes laser ablation to form at least one through hole prior to locating at least one additional layer of material; and (19) laser cutting of the sheet material or of another structural material occurs from both the top and bottom surfaces.

In a seventh aspect of the invention a method of forming at least one micro-scale or millimeter-scale structure, includes: (a) providing at least one sheet of structural material having a front side and a backside; (b) using a laser beam to cut at least one opening completely through the at least one sheet from the front side to the back side in one or more regions to define at least one sheet material end of a structure to be formed; (c) depositing at least one single material layer or multi-material layer directly or indirectly onto at least a portion of both sides of the at least one sheet material such the at least one single material not only is located on at least selected locations on both sides of the at least one sheet material but also occupies at least a portion of a side wall of the at least one opening in the at least one sheet material; (d) locating a sacrificial material onto any exposed surface of the at least one single material layer or multi-material layer or onto a material that was previously deposited thereon; (e) using a laser beam to cut completely through the at least one sheet of structural material, the at least one single material or multi-material layer, and completely through the sacrificial material located on at least a front side of the at least one sheet of structural material and at least partially through the sacrificial material located on the back side of the at least one sheet of structural material; (f) removing the sacrificial material from the at least one single material layer or multi-material layer and from the at least one sheet of structural material, such that the structure is formed from a portion of the at least one sheet structural material and the at least a portion of the one single material layer or multi-material layers and wherein the at least one single material layer or multi-material layer defines a distal end of the structure or is located between a distal end of the structure and a distal end of the at least one sheet of structural material that forms part of the structure.

Numerous variations of the seventh aspect of the invention are possible. Some such variations may be understood from the variations of the other aspects of the invention and from variations set forth in other parts of this specification. Variations set forth with regard to other aspects can be applied to this aspect so long as the variation makes sense in the context of the seventh aspect and so long as it retains at least some benefit.

Other independent aspects of the invention will be understood by those of skill in the art upon review of the teachings herein. Other independent aspects of the invention, or variations thereof, may involve combinations of the above noted aspects of the invention. Other aspects of the invention may involve apparatus that can be used in implementing one or more of the above method aspects of the invention or may be directed to probes or other devices that have certain features and which may be formed by one of the methods set forth herein or may be formed by some other method. Still other independent aspects of the invention may involve the uses of the devices described herein as part of a probe card or other assembly during integrated circuit testing, other electrical circuit testing applications, other electrical connection applications, or spring force applications, or the like.

These other independent aspects, or their variations, may use various combinations of the aspects presented above as well as provide other configurations, structures, functional relationships, and processes that have not been specifically set forth above. Still other independent aspects, or their variations, may provide methods for using the devices formed according to the above noted aspects.

BRIEF DESCRIPTION OF THE DRAWINGS

FIG. 1A provides a listing of example materials that may be used in various combinations in the various embodiments of the invention.

FIG. 1B provides a sample listing of different material combinations that can be used to form parts or structures (e.g. probes) having different material configurations wherein the structures themselves may take on a variety of different structural configurations as is known in the art.

FIGS. 1C and 1D together provide a sample listing of different process steps or operations that may be used in the process of fabricating parts or structures according to the various embodiments of the invention and the various desired final structure configurations.

FIG. 2D-2 is similar to FIG. 2D-1 with the exception that 12 structures are shown and each structure shares a cut region with one or more neighboring structures such that a vast majority of the regions of sheet structural material cut through define the perimeter of more than one structure.

FIGS. 7A and 7B provide schematic illustrations of a potential relationship between a sheet of structural material, a body of sacrificial material, and a support or base structure that may be used in some embodiments of the invention wherein FIG. 7A shows the materials and base initially separated while FIG. 7B shows the materials and base after being bought and held together and wherein the sacrificial material is located between the structural material and the base.

FIGS. 8A and 8B provide schematic illustrations of a potential relationship between a sheet of structural material, a body of sacrificial material, and support or base frame wherein FIG. 8A shows the materials and frame initially separated while FIG. 8B shows the materials and frame after being bought and held together and wherein the sheet of structural material is located between the frame and the sacrificial material.

FIGS. 9A and 9B provide schematic illustrations of another potential relationship between a sheet of structural material, a body of sacrificial material, and support or base frame wherein FIG. 9A shows the materials and frame initially separated while FIG. 9B shows the materials after being bought and held together and wherein the sacrificial material is located between the frame and the structural material.

DETAILED DESCRIPTION OF PREFERRED EMBODIMENTS

Figure 2A:
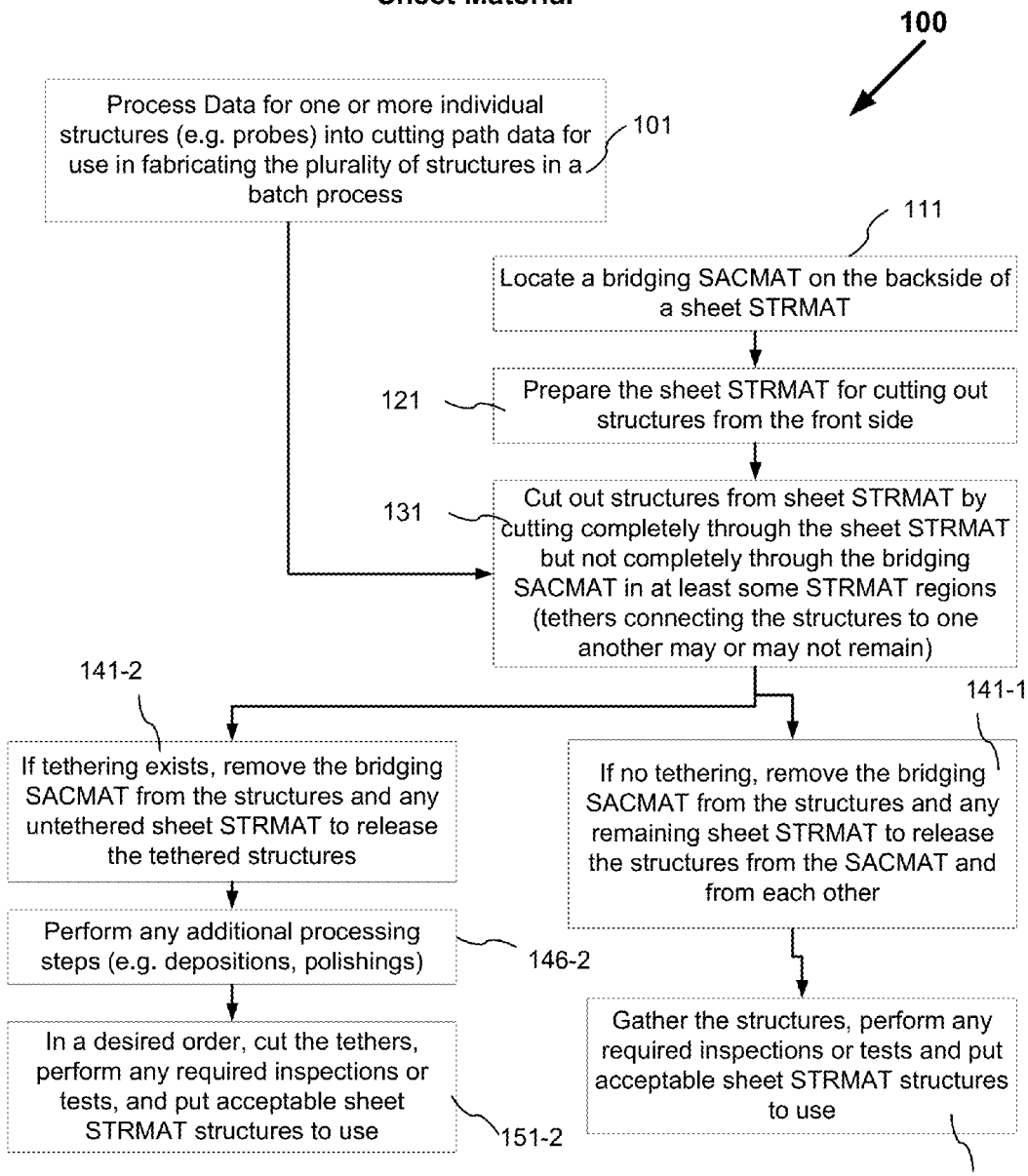
FIG. 2A provides a block diagram showing the major steps involved in a first method embodiment of the invention that includes forming a part or structure (e.g. probe) from a laser machined sheet of structural material (e.g. tungsten) and wherein prior to machining a sacrificial bridging material is located on the sheet material and wherein during machining the laser cuts completely through the sheet structural material (from the side opposite the sacrificial material) using one or more passes of the laser around the perimeter of the structure (with the possible exception of tab or tethering locations—not shown) but where the laser doesn't cut completely through the sacrificial material such that the sacrificial material connects the individual structures (or bridges the gaps between them) until the sacrificial material is removed (e.g. by etching).

Some potentially useful probe materials (e.g. tungsten, molybdenum) and materials useful in micro scale or milli-meter scale devices, cannot be deposited from an aqueous solution (e.g. electrodeposited or electroless deposited). Such materials may, for example, have improved properties related to current carrying capacity, e.g. based on their ability to maintain yield strength, at elevated temperatures. As noted above it has been previously proposed that such materials may be used as probe materials and that they may be supplied in sheet or foil form and may be shaped by laser processing. Some useful materials may be electrodepositiable but still might benefit from use in sheet form (e.g. palladium or platinum).

Embodiments of the present application provide commercially significant enhancements over the previously proposed methods noted above. Some preferred embodiments involve enhanced methods of securing the sheets, or foils, of structural material and the individual parts or structures being formed therefrom during laser machining processes. Some methods provide for improved thermal management during the laser cutting process. Such securing and thermal management is made desirable by the small nature of the structures being formed (e.g. 1-5 mm in length and 25-200 microns in thickness and width) which could allow the parts or structures to move under very small forces during or after cutting (e.g. from heat induced stresses, gravity, internal stresses within the sheets, vibrations, etc.) which could result in degraded cutting accuracy and unreliable structure formation. Furthermore, since foils from which the structures are to be cut have relatively little thermal mass, the structures may be heated during cutting or trimming to a degree where material properties are adversely or unpredictably affected.

In some embodiments, it is preferred that the foil or sheet of structural material be attached to another material, such as a sacrificial material (e.g. copper), before cutting. After cutting the sacrificial material is removed. Such removal may occur by use of an etchant that dissolves the sacrificial material without dissolving any exposed structural material. Alternatively, in some embodiments sacrificial material may be removed in whole or in part by other means such as by melting, by further laser trimming, or possibly by machining (e.g. lapping or fly cutting, or the like). This sacrificial material can provide support during machining, hold the parts (e.g. probes, partially formed probes, or other structures) in place after cutting, and may act as a heat sink to remove or more uniformly distribute heat during the machining process. In some embodiments, tethering via thin and/or narrow segments of either structural sheet material or deposited structural material may also be used to attach structures to one another or to attach them to other structures until such time as they are to be released in preparation for assembly or after assembly. Such tethering may be removed during, before, or after release from a bridging sacrificial material. In some embodiments, tethering may be provided by a second sacrificial material that is located in selected locations and that is not dissolved by an etchant that removes a first sacrificial material. The second sacrificial material may be removed after removal of the first sacrificial material and possibly after performance of one or more intermediate processes such as depositions of structural materials to selected locations on previously laser shaped structural material.

In some embodiments, prior to laser cutting, some surfaces (e.g. a surface opposite to that of the sacrificial bridging material) may be coated with one or more capping sacrificial materials (e.g. metals such as copper, tin, silver or the like) so that any structural material evaporated during cutting doesn't redeposit on to structure surfaces but on to such sacrificial material which can be removed after laser cutting has been completed. This sacrificial material may also provide for elimination or minimization of laser cutting surface effects that may result in misshaping of the structural material if the structural material were not overlaid by such capping sacrificial material. This capping material may also provide some additional heat sink capacity. In some embodiments, sacrificial material on each side of the structural material may act as a capping sacrificial material and a bridging sacrificial material particularly when laser cutting may occur from both sides of a sheet or foil structural material.

Thickness of bridging sacrificial materials and capping sacrificial materials may be dictated in different embodiments by different control needs or desires. In some embodiments the thickness of a bridging sacrificial material may be, at least in part set, based on a desired that the bridging sacrificial material not be cut all the way through and that sufficient bridging material remain to provide adequate structural integrity, adequate planarity, or an adequate heat flow path. In other embodiments such integrity, planarity or heat flow may be at least in part provided by a substrate on which the bridging sacrificial material is located and thus the cut through avoidance might not be a controlling parameter. In some embodiments, the thickness of a capping sacrificial material may be dictated by a desired to minimize laser cutting time and a desire that the cutting of structural material be at a sufficient depth that surface, spot size, focus, field of view effects, and the like (e.g. that might result in side wall tapering) are minimized or eliminated.

Laser machining as contemplated by the various embodiments of the invention may employ any laser cutting system that is conventionally known to be useful for cutting the materials being operated on, with appropriate depth control (Z-direction—direction perpendicular to the planes of the sheets being cut) and XY positioning control. Such laser systems may employ lasers and scanning systems with various parameters: (1) pulse periods or widths such as, for example, pulses having widths in the nano-second, pico-second, or fempto-second range; (2) various powers per pulse such as, for example, powers of less than 10 uJ (microjoules) per pulse to more than 100 uJ per pulse; (3) various repetition rates such as, for example, in the thousands to hundreds of thousands or more pulses per second; (4) various scanning speeds such as, for example, 0.1 mm/second to 500 mm/second or more with effective cut rates ranging, for example, from 0.1 to 1 or more millimeters per second for complete cut through after all necessary passes; (5) various beam shapes, such as, for example (a) Gaussian—TEM 00, (b) donut—TEM 01, or (c) other higher order intensity distributions, (6) various beam diameters, such as, for example 0.1 um to 20 ums or more), (7) correlation between scanning speed and pulse diameter to allow sufficient pulse to pulse overlap during scanning, such as, for example from 10% to 90% overlap; (8) various wavelengths may be used, such as, for example IR, visible or UV from various sources including, for example, visible or UV radiation from the fundamental frequency of an Nd:YAG or excimer laser or from a frequency multiplied version of the fundamental, for example, 2 or 4 times the fundamental of an Nd:YAG or excimer laser. Such laser systems will include scanning systems that can move the laser beam and/or the workpiece at appropriate relative speeds to allow efficient and controlled cutting of the material (e.g. rotational scanning mirrors for the laser beams and/or translation systems for the workpieces). Such laser systems will include scanning protocols that provide for appropriate and controlled relative positioning of the laser beam on the workpieces so that cutting occurs only at appropriate positions on the work piece while the beam is moving and pulsing at appropriate synchronized rates. Such systems include fast shutters such as, for example, acousto-optical modulators to turn the beam on when appropriately positioned and scanning at appropriate speeds with appropriate pulse power and to turn the beam off when not properly positioned, not traveling at an appropriate speed, or outputting appropriate pulse power. Such systems will include computer or other control systems for translating device geometries into appropriate scanning control commands. Such systems may perform cutting completely through the structural material or materials in a single pass of the laser beam, in a series of exactly repeated passes of the laser beam to achieve desired cutting depths, or in a series of offset but overlapping passes. In some implementations, non-laser cutting operations may be performed between some or all successive passes such as, for example, cleaning operations deposition operations, chemical etching operations, or the like. Depending on the material or materials being cut and the method of removal, such exposures may occur in normal atmosphere (i.e. air or dry air), an inert atmosphere (e.g. $N_2$ or Ar), a reducing atmosphere (e.g. $H_2$), an oxidizing atmosphere (e.g. $O_2$), in a surrounding body of liquid non or low radiation absorbing liquid, or the like. Such systems may include the ability to change the scanning direction of the laser beam from the front side of a workpiece to a back side of the workpiece along with appropriate calibration and registration protocols to ensure adequate registration of cutting locations from side-to-side. Some embodiments may include the ability to rotate or translate the workpiece to change the beam cutting direction from, for example, front side to back side or from one incident angle on the front side to a different incident angle on the front side, or the like. Some embodiments may use dual laser cutting systems to cut on opposite sides of a work piece simultaneously. Some embodiments may use focal length adjustment systems or translation systems of scanning mirrors or for workpieces to ensure minimal variation in beam size at a working location on a work piece and or to minimize variations in angle of incidence from position to position. Such systems may rely on data that takes into consideration effective beam diameters (i.e. cutting radius between the position of the beam center and the removal boundary) or alternatively may position the beam using required offsets based on data supplied in uncompensated form.

As noted above, other methods of forming structures have involved the electrodeposition of various materials such that structures are built up from a plurality of adhered layers of multiple materials where each layer includes at least one sacrificial material and at least one structural material. In some such embodiments, two or more structural materials along with at least one sacrificial material are deposited as part of each layer. Each layer is typically planarized after formation to set accurate vertical part dimensions. Example of such fabrication methods and probes formed from such fabrication methods can be found in the following US Patents and Patent Application Publications. Each of these patents and publications is incorporated herein by reference.

| Patent or Publication No. | Title/Topic |
|---|---|
| 7,273,812 | Microprobe Tips and Methods for Making |
| 2006-0108678 | Probe Arrays and Methods for Making |
| 7,531,077 | Electrochemical Fabrication Process for Forming Multilayer Multi-material Microprobe Structures (including encapsulation of a core material by a shell material) |
| 2005-0184748 | Pin-Type Probes for Contacting Electronic Circuits and Methods for Making Such Probes |
| 7,557,595 | Cantilever Microprobes For Contacting Electronic Components and Methods for Making Such Probes |
| 2006-0238209 | Vertical Microprobes for Contacting Electronic Components and Method for Making Such Probes |
| 2007-0158200 | Electrochemical Fabrication Processes Incorporating Non-Platable Materials and/or Metals that are Difficult to Plate On |
| 2008-0050524 | Methods of Forming Three-Dimensional Structures Having Reduced Stress and/or Curvature |
| 2010-0134131 | Electrochemically Fabricated Microprobes |
| 2011-0132767 | Multi-Layer, Multi-Material Fabrication Methods for Producing Micro-Scale and Millimeter-Scale Devices with Enhanced Electrical or Mechanical Properties |

Though some embodiments of the invention form probes and other devices only from sheet material that is laser cut, other embodiments of the invention use various single material or multi-material, single layer or multi-layer deposition methods in combination with sheets and laser cutting, and possibly in combination with additional elements and/or steps to provide new and improved fabrication methods and/or new and improved structures, parts, or devices (e.g. probes).

Some embodiments form probes or other structures from one or more layers of sheet material. Sheet material may include for example tungsten (W), tungsten-rhenium (WRe), molybdenum (Mb), beryllium-Copper (BeCu), palladium (Pd), platinum (Pt), Iridium (Ir), platinum-iridium (Pt—Ir), titanium (Ti), nickel (Ni), copper (Cu), gold (Au), silver (Ag) and alloys containing these and possibly other metals, and even containing dielectric materials. These materials may be patterned into desired cross-sectional shapes by the cutting out desired configurations. In some multi-sheet embodiments, the sheets may be bonded to one another prior to any laser machining while in other embodiments some laser machining may occur on one more sheets prior to bonding and with the final perimeter cross-sections of parts being cut out after bonding has occurred or possibly the cutting may cause or enhance bonding of these perimeters as it occurs.

Some embodiments will add one or more multi-material layers to the sheet or sheets of material to form enhanced structures. The multi-material layers may be formed by one or more of the processes as set forth in the patents, patent applications, or other publications set forth in the table above. In some embodiments these multi-material, multi-layer structures will be formed on the sheet material or formed separately and then bonded to the sheet material. When forming a first multi-material layer on a sheet of material, an adhesion layer (e.g. W—Ti, Cu, or Au) having a thickness of the order of 1s to 10s to 100s of nanometers) may be initially deposited by sputtering, PVD, or the like as necessary. Next, a seed layer may be deposited (e.g. Cu, Au, Ni, or the like) may be deposited by sputtering, PVD or electroless deposition as necessary. Alternatively, if the original adhesion layer is adequate, a strike deposition may be used to provide an activated surface for receiving subsequent electrodeposited material. Thereafter, a first material may be pattern deposited via openings in a photolithographically fabricated mask, pattern deposited via openings formed by direct ablation of a masking material, patterned deposited via a direct selective deposition process. After deposition of one or more materials as part of a given layer, a subsequent material forming part of the given layer may be deposited in a patterned manner or blanket manner into a mold of previously deposited material or materials. After deposition of all or part of the materials forming a given planarization operations (e.g. lapping, fly cutting, CMP, other machining, or the like) may be used to smooth planarized the surface, set an orientation for the surface and in in the end to set a final thickness for the given layer. In such embodiments, one of two deposited materials is generally a sacrificial material while the other is a structural material. Basic processes for such formation are set forth in U.S. Pat. Nos. 6,027,630 and 5,190,673. In more advanced embodiments, where more than two materials form part of a given layer (exclusive of seed layers and adhesion layers) one or more of the deposited materials are structural materials and one or more are sacrificial materials. In some advanced processes, interlacing of materials deposited in association with specific layers occurs and may provide enhanced adhesion or strengthening of interlayer bonds. Examples of such processes are found in U.S. Pat. No. 7,252,861 which is incorporated herein by reference. Such multi-material deposits may be made over sheets, or sheets with deposited material, that already contains laser cut patterns such that the subsequently deposited material or materials not only lay on the top or bottom surfaces of the sheet material or on top or bottom surfaces of other deposited materials but also are located on the sides of the cut regions.

In some embodiments, deposited material for a layer might be in the form of a single material as opposed to being in multi-material form. Such deposits of single materials may or may not benefit significantly from planarization. Such deposits of single materials may take on desired patterns by subsequent laser cutting or ablation. Such deposits may be made over sheets, or sheets with deposited material, that already contains laser cut patterns such that the subsequently deposited material or materials not only lay on the top or bottom surfaces of the sheet material or on top or bottom surfaces of other deposited materials but also are located on the sides of the cut regions.

FIG. 1A provides a sample listing of some materials that may be used in various combinations in the various method embodiments of the invention. In some embodiments all such materials may be used, in other embodiments only a portion of the materials may be used. In some embodiments, some materials may be used multiple times. Some such materials may form part of the structure while other materials may be separated from the structures (e.g. probes) prior to putting them to use (i.e. these might be considered sacrificial materials and reuseable materials such as substrates, bases, frames, and the like). In the various embodiments of the invention, structures may be formed using one or more of: (A) sheet structural material, i.e. sheet STRMAT, (B) bridge sacrificial material, i.e. bridge SACMAT or BSACMAT, that is formed by depositing it; (C) bridge SACMAT that is supplied in sheet form, (D) sacrificial material that is a part of a multi-material layer, i.e. X-MAT SACMAT or just SACMAT, (E) structural material that may be used as an exposed part of a layer, i.e. external STRMAT, (F) structural material that will not be used as an exposed part of a layer and thus may have different properties from external STRMAT, i.e. internal STRMAT, (G) a structural material used as a contact material, i.e. TIPMAT or tip STRMAT, (H) an adhesion layer material and/or barrier layer material, (I) a seed layer material, (J) a bonding material, i.e. BONDMAT, for either aiding in the bonding of layers or for aiding in the bonding of the structure to another element, wherein such bonding material may be supplied in sheet form or in deposited form; (K) capping material, i.e. CAPMAT, which may be a sacrificial material used to protect a structural material from debris when laser cutting and which may be provided in deposited or sheet form; (L) conductivity improvement material, i.e. CONMAT, which may be a structural material having a lower melting point than the sheet material but which provides for enhanced current carrying capacity without necessarily relying on the yield strength of this CONMAT for structural properties, such as spring coefficient at operating temperature, and which may be initially provided in deposited or sheet form; and (M) dielectric material, i.e. DIMAT, which may be a structural material which may, for example, provide some insulation or shorting protection between adjacent electrical elements. In some implementations, structures formed according to the methods of the present invention may include only conductive materials (e.g. metals) while in others they may include dielectrics, semiconductors, or the like. Some structures may include ceramics.

FIG. 1B provides a listing of examples of different material combinations that can form structures having different material configurations. For example, probes may take on a variety of different structural configurations as is known in the art (e.g. vertical probe configurations, cantilever probe configurations, multi-beam cantilever probe configurations, pin probe configurations, torsional probe configurations, solder mounting configurations, slot or hole mounted configurations, and the like). In the examples of FIG. 1B, structures or parts (e.g. probes) may be formed of: (A) a single sheet of sheet STRMAT, (B) multiple sheets of sheet STRMAT with or without intermediate adhesion or bonding material, (C) one or more sheets of sheet STRMAT along with a TIPMAT, (D) one or more sheets of sheet STRMAT along with one or more regions of additional non-tip STRMAT such as a BONDMAT, a CONMAT, and/or a DIMAT, (E) one or more sheets of sheet STRMAT along with one or more regions of additional STRMAT and one or more regions of at least one TIPMAT, (F) one or more sheets of STRMAT along with one or more regions of additional external STRMAT and one or more regions of internal STRMAT, or (G) one or more sheets of sheet STRMAT along with one or more regions of additional external STRMAT, one or more regions of internal STRMAT, and one or more regions of TIPMAT. As needed any of these material configurations may additionally include adhesion materials and seed layer materials.

Method Embodiment Steps

FIGS. 1C and 1D together provide a listing of example process steps or operations that may be mixed and matched in the processes of some of the method embodiments of the invention (e.g. for fabricating probes). Steps or operations A-F are set forth in FIG. 1C while Steps or operations G-N are set forth in FIG. 1D. Most embodiments will only use a portion of the indicated steps though some steps may be used multiple times and in varying orders. For example, many embodiments will use a single deposited bridging sacrificial material while others may use two separate bridging sacrificial materials while still others may use no bridging sacrificial material. Bridging sacrificial material, whether deposited or in sheet form, may be formed on or bonded to the sheet STRMAT or formed on or bonded to some other layer from which the structures will be formed. As another example, some embodiments may form a single region of one or more multi-material layers while other embodiments may use multiple regions of one or more layers with each formed from multiple deposited materials occupying different lateral extents or positions of their respective layer(s), while still other embodiments may not use any regions formed from one or more multiple material layers. As another example, some embodiments may form a single region or one or more single material layers while other embodiments may use multiple regions of one or more single material layers while still other embodiments may use no regions of one or more layers of single materials (other than a sheet material). As a further example, some embodiments may have regions including one or more multi-material layers as well as one or more single material layers. As a final example, some embodiments may make holes in sheet material or other deposited material layers that will be occupied by one or more subsequently deposited materials. After review of the teachings herein, one of skill in the art will understand that that steps set forth herein may be used in various combinations to form structures having a variety of properties and material configurations. It is applicant's intent that method embodiments of the invention include each possible combination and subcombination of these steps that may be used to produce viable structures, components, or assemblies. The most preferred embodiments are directed to micro-scale structures and millimeter-scale structures (e.g. structures having Z heights, perpendicular to the plane of the layers, in the range of 10 um to 5 mm, X and Y dimensions on the order or 10 um to several centimeters, with a feature resolution on the order of 1-100 um) but in some cases the structures may be larger or smaller. Example steps include:

(A) Laser cutting through sheet STRMAT to form external probe boundaries without leaving tabs or tethers. This cutting may occur by cutting with (1) one or more laser beams incident on the sheet from a single side of the sheet, e.g. from the top or the bottom, (2) one or more laser beams incident on the sheet from multiple sides either in series or simultaneously (e.g. from the top of the sheet and then from the bottom of the sheet), (3) one or more laser beams using a single incident angle, e.g. cutting with the laser beam having an incident angle that is perpendicular to the surface, cutting with the laser beam being held at a fixed, constant, and non-perpendicular angle relative to the surface being cut (i.e. not parallel to a local surface normal), or (4) one or more laser beams having incident angles changing depending on the specific feature of the probe being formed, e.g. tips may be formed to have features that tapper in Z so that they have contact regions thinner than the thickness of the sheet material or deposited materials from which they are formed or such that material from which they are formed may mechanically interlock with other materials. A beam or beams with fixed or changeable incident angles may be incident upon one or both surfaces of a sheet or other material to be cut. Cutting of sheet material may occur before or after bonding any other sheet materials or after deposition or bonding of depositable materials. This step may also be used to cut boundaries or perimeters around deposited structural materials or even sacrificial materials. This step may occur by cutting through a front side capping sacrificial material but not completely through a backside bridging sacrificial material. This step may occur by cutting through a front side capping sacrificial material and completely through a back side sacrificial material. This step may occur by cutting from a front side completely through a capping sacrificial material but not completely through a bridging sacrificial that is on the backside and thereafter a front side bridging sacrificial material may be applied after which cutting may occur from the backside through the original bridging sacrificial material that is now acting as a capping material wherein the cutting continues until a depth of cutting reaches completely through the structural material but not completely through the front side bridging sacrificial material.

(B) Laser cutting though sheet STRMAT to form external probe boundaries while leaving tabs (e.g. for use in tethering). This step includes options similar to those noted for step (A). This step may be used to leave tabs in selected locations of a deposited structural material and/or in sheet STRMAT. This step may cut completely through portions of the bridging sacrificial material while leaving selected regions of bridging sacrificial material uncut. This step may be applied in the presence of two sacrificial materials occupying different lateral regions of one or more layers such that removal of one of the sacrificial materials still leaves the structure tethered by a second sacrificial material.

(C) laser cutting or machining of notches or grooves into sheet STRMAT to form recesses within the sheet STRMAT. This step includes options similar to those noted for step (A). This step may also be used to cut notches or grooves into other structural materials or even in sacrificial materials in preparation for deposition of additional structural materials. This step may be used to define features of narrower thickness than that of the sheet material or that of the combination of structural materials (e.g. narrow tip regions).

(D) laser cutting or machining sheet STRMAT to form internal holes within the sheet STRMAT. These holes may, for example, form external boundaries of the structures, e.g. regions between the beams of a multi-beam cantilever probe, or alternatively they may form openings for receiving additional structural material. This step includes options similar to those noted for step (A). This step may also be used to cut or machine openings in other structural materials or even in sacrificial materials (e.g. bridging sacrificial materials). The openings cut may be specific to individual parts or they may be extended to define common portions of multiple parts (e.g. ends of probes such as tip regions or base regions particularly when those end portions are to receive a deposit of one or more structural materials before laser cutting defines the side profiles of the probes. The openings may be extended while still defining specialized features for individual parts (e.g. curved tip regions for individual probes represented by a plurality of individual bulges within a substantially rectangular cut that extends past a plurality of probes. This process may define common guide holes extending perpendicularly from a front surface to a back surface which may be used as alignment marks when cutting part outlines from both sides of a sheet or a material stack.

(E) Laser cutting only part way through BRIDGE SACMAT. In embodiments where a single region of BRIDGE SACMAT is used, this step allows the BRIDGE SACMAT to act as a bridge that retains structures in known and controlled locations during and after complete cutting through the sheet STRMAT and possibly through other materials. This step includes options similar to those noted for step (A).

(F) Laser Cutting completely through BRIDGE SACMAT in selected locations. This step may be used, in a variety of circumstances, e.g. where selected features of a structure, formed of either sheet STRMAT or some other STRMAT are intended to be cut, machined, or trimmed and access is only available from the backside (or bridge SACMAT side). This step may be used when the bridging SACMAT is to be bonded to a substrate which can provide the needed dimensional stability. This step includes options similar to those noted for steps (A) and (D).

(G) Depositing BRIDGE SACMAT onto a substrate (e.g. a reusable substrate, a sheet STRMAT, a multi-material region, or on some other STRMAT to form a combined STRMAT and bridge SACMAT workpiece). In some embodiments the substrate may be a temporary substrate with the deposited bridge SACMAT eventually being transferred, relatively speaking, to the sheet STRMAT, a multi-material region, or some other STRMAT.

(H) Depositing one or more layers or partial layers of a STRMAT, a SACMAT, adhesion material, seed layer material, barrier material, bonding material, or the like. Such layers may be planarized after deposition to ensure appropriate thickness and uniformity. If partial layers are to be formed, they may be formed by controlled and targeted deposition or by deposition in a temporary molding material (e.g. photoresist) which may then be removed. These layers may be deposited directly on a surface to which they will permanently remain or on a temporary surface from which they will eventually be transferred or removed. STRMAT deposited in this manner, in the case of spring-like electrical contacts, may take the form of tip or contact material, additional spring material, a material of high electrical conductivity, a material to enhance bonding of the contact element when forming an assembly, and the like. The deposits of such materials may occur onto a sheet material. For example, the deposit of STRMAT or SACMAT on to a sheet material (e.g. tungsten) may involve sputtering of a seed or adhesion layer, an electroplated strike (e.g. acid strike) deposit, followed by a thicker electrodeposit of the desired material. The sputtering and strike may involve deposition of materials that are the same or different from one another and that are the same or different from the electroplated STRMAT or SACMAT.

(I) Depositing one or more SACMATs and one or more STRMATs as parts of a multi-material layer. These deposits may form a layer that in turn receives one or more additional deposits that form one or more additional multi-material layers or single material layers. If necessary, such multi-material layers may be planarized after deposition to ensure appropriate thickness and uniformity of the layers formed. Methods for forming such multi-material layers may include one or more selective depositions, a combination of selective depositions and blanket depositions, a combination of blanket depositions and selective etching operations, and possibly one or more planarization operations. Selective deposition operations may include controlled and targeted deposition, selective deposition via lithographic methods or direct laser ablation methods. Depositions may occur, for example, by electrodeposition methods, electroless deposition, spray metal deposition methods, and the like. Planarization may occur using single step or multi-step lapping, CMP, fly cutting, or the like. These layers may be formed on and bonded directly on a surface to which they will permanently remain or on a temporary surface from which they will eventually be transferred or removed. STRMAT deposited in this manner, in the case of spring-like electrical contacts, may take the form of tip or contact material, a spring material (possibly in addition to any spring properties provided by a sheet material), a material of high electrical conductivity, a material to enhance bonding of the contact element when forming an assembly, and the like. Numerous methods for forming such layers are set forth in many of the patents and patent applications incorporated herein by reference.

(J) Bonding or otherwise adhering sheets to one another, bonding or otherwise adhering deposited layers to one another, bonding or otherwise adhering sheets to layers. When structures are to be formed of multiple sheets, layers of material(s), or a combination of layers and sheets, steps must be taken to ensure adequate adhesion or cohesion of materials. Such adhesion may be aided by cleaning and activation of surfaces, and maintaining surfaces in appropriate atmospheres (inert, vacuum, reducing, and the like). Such adhesion may be occur by the direct deposition of one of the materials, e.g. via electrodeposition or electroless deposition, on the other with or without first using an adhesion material and possibly a seed layer material. Adhesion may be promoted by deposition of an adhesion material and if necessary a barrier material on one or both pre-formed surfaces and then bringing the coated surfaces together to cause bonding. Pressure, heat, or vacuum, may be used to enhance such bonding. Depending on the final application, application of an adhesive bonding agent on one or both surfaces may be adequate to provide the desired level of bonding. Depending on the types of materials being bonded and the dimensions of the structures being formed, appropriate laser cutting methods may also provide a welding of the edges of the sheets or layers to one another. In some cases, using a laser to form notches or even undercuts in one or both surfaces may aid in forming mechanical interconnections when pressing materials together. Such undercuts may also be useful when depositing one material on another to improve adhesion. These methods may, for example, be used to provide bonding between a bridge SACMAT and a sheet STRMAT, bridge SACMAT and a multi-material region or a single material region, some other STRMAT, a sheet STRMAT and a multi-material region or a single material region, or a multi-material region and a single material region. In some more specific examples, one may start with a sheet STRMAT and then deposit a bridging SACMAT on one or both sides of it; one may start with a STRMAT and then deposit a multi-material region on one side of it and then deposit a SACMAT on either the other side of the sheet STRMAT or on the multi-material region; one may start with a sheet STRMAT and then deposit a multi-material regions on one side of it followed by depositing an adhesion material (e.g. titanium, chromium, gold) on the multi-material region and on one side of a second sheet STRMAT and then pressing the side of the second sheet STRMAT with the adhesion material to the adhesion material on the multi-material region (possibly while heating) to cause bonding.

(K) Selective modification of one or more STRMATs. In some embodiments it may be desirable to change the properties of one or more STRMATs before or after laser cutting or even before or after completing the stacking and bonding of layers and sheets. Such modifications can take a variety of forms depending on the materials being used and the final properties to be obtained. Heating and cooling of selected material may be used to change their properties (e.g. to change the crystal structures of metal), heating and pressure may be used not only to cause bonding but to cause alloy formation. Heating may occur in a variety of atmospheres to yield different results. Adding of dopants along with heating may be used to obtain improved surface properties, e.g. hardening tungsten by carburization, e.g. heating at a temperature of 1400-2000° C. of tungsten with carbon black in the presence of a reducing atmosphere or in vacuum. In such modification processes the treatment material can be selectively applied and/or heating can be selectively applied so that modifications occur at desired locations under appropriate control.

(L) Removal of sacrificial materials (SACMATs). Removal may occur in a variety of ways and depending on the SACMAT or SACMATs to be removed, it may occur after laser cutting is complete, between multiple laser cutting operations, before and/or after all layers or sheets are formed or bonded. Removal may occur, for example, by etching, ablation, or melting. Different SACMATs may be removed at different times based on different etching requirements, melting temperatures, or selective application of ablation. Some retained SACMATs may act as tethers that may be later removed without need for further cutting operations and the difficulties, problems, and/or extra processing time that they might involve.

(M) Conformal deposition of a STRMAT (e.g. TIPMAT, CONMAT, BONDMAT, or DIMAT) with structural material (e.g. SHEET MAT) tethering element(s) in place. Such depositions may occur on one or both sides of a sheet material or on a sheet material with previously deposited material. They may also be applied in openings that have been cut partially into or completely through the sheet material or previously applied coatings.

(N) Conformal deposition of a STRMAT with a first SACMAT removed from one lateral area but a second SACMAT located in a different lateral area. The second SACMAT may be conductive or dielectric. The second SACMAT may act as form of tethering, as a deposition barrier, as a shield for inhibiting deposition of the SRTMAT to selected areas which may become overplated with the STRMAT and then allowing the STRMAT to be removed from only the overplated areas via a planarization process.

(O) Conformable deposition of a STRMAT. Such depositions may in a selective or blanket manner and may occur on one or both sides of a sheet material or on a sheet material with previously deposited material. They may also be applied in openings that have been cut partially into or completely through the sheet material or previously applied coatings. They may be deposited in the presence of masking materials (e.g. patterned photoresist) or previously deposited sacrificial or structural materials and they may be partially removed from all lateral areas by planarization or completely from some areas by planarization.

As noted above, different method embodiments of the invention may mix the above steps in a variety of different ways to yield not only different fabrication methods but also to yield structures (e.g. probes) with different structural, material, and functional properties. For example, a BRIDGE SACMAT may be located on the same side of sheet STRMAT as X-LAYER STRMAT or on the opposite side. In some embodiments the formation steps may be performed to build up structures on a substantially planar layer-by-planar layer basis. In some embodiments, the formation steps may result in interlacing of material between at least some successive layers. In some embodiments laser cutting may occur multiple times during formation of a part (e.g. a probe wherein the multiple laser cutting steps are separated by other steps (e.g. deposition operations, etching operations, planarization operations, bonding operations, or the like). In some embodiments laser cutting may be used to at least partially define structural boundaries of deposited STRMAT as well as sheet STRMAT. In some embodiments additional steps may be used in the formation process as will become apparent to those of skill in the art upon review of the teachings herein.

Method Embodiment No. 1

A first specific method embodiment of the invention provides for the formation of a plurality of structures from a foil or sheet material in conjunction with the use of a bridging SACMAT. FIG. 2A provides a block diagram showing the major steps involved in this first method embodiment 100 of the invention wherein a structure or structures (e.g. probes) are formed from a laser machined sheet of structural material (e.g. tungsten) and wherein prior to machining a sacrificial bridging material is located on the sheet material and wherein during machining the laser cuts completely through the sheet structural material using one or more passes of the laser around the perimeter of the structures or perimeters of the structures (with the possible exception of tab or tethering locations) and wherein the laser doesn't cut completely through the sacrificial material such that the sacrificial material connects the individual structures (or bridges the gaps between them) until the sacrificial material is eventually removed (e.g. by etching).

In a first step 101, data for one or more individual structure types (e.g. more than one type of structure configuration may be formed from the same sheet during a given process) are processed into cutting path data for use in fabricating a plurality of structures in a batch process. This data processing may involve defining the cutting paths to be followed by the laser around the perimeters of the pins. The processing may involve offsetting of the laser cutting paths from the boundary perimeters of the structures to account for effective laser beam cutting widths or different widths if variable cutting depths are to be employed. The data processing may involve use of automatic or manual setting of processing parameters or preferences such as pulse power, pulse during, pulse width, pulse repetition rate, beam incident angle, cutting depth, depth of cut per pass, offset per pass, incident surface identification (e.g. top or bottom). This information is used in a fourth process step as discussed below. In alternative embodiments, though less preferred, it is possible to produce laser cutting path data without necessarily deriving it from data descriptive of the part or parts to be formed.

In a second step 111, a bridging SACMAT (or sacrificial material) is located on the backside of a sheet STRMAT (or structural material). In some variations of this process the bridging sacrificial material is a metal, such as copper. Depending on the initial form of the bridging SACMAT locating may occur by bonding a sheet of bridging SAC-MAT to the sheet of STRMAT or by the deposition of bridging SACMAT on to the sheet of STRMAT. Such deposition may require or benefit from first applying an adhesion layer and then a seed layer or strike layer in the case of electrodepositing of the bridging SACMAT.

In a third step 121, the sheet STRMAT, and possibly the bridging SACMAT are prepared so that structures may be cut out from the front side. This preparation may occur completely before step 111, in part before step 111, or completely after step 111. This preparation may involve locating the bridging SACMAT or the sheet STRMAT on a base or frame for holding or moving during the laser cutting operation. This preparation may involve locating the sheet STRMAT and associated bridging SACMAT in a laser cutting machine. In some embodiments, this preparation work may be largely eliminated if the locating of the SACMAT on the sheet STRMAT occurs in the laser cutting apparatus.

In a fourth step 131, the material to be cut and the processed data are brought together in the laser cutting system and cutting is made to occur such that the sheet STRMAT is cut completely through but the bridging SAC-MAT is not cut completely through such that the bridging SACMAT provides a bridge of material that continues to hold the cut structures in place. In some alternatives implementations as noted in below, tethering elements of structural material may remain such that structures remain connected to one another or to a frame network.

Next the process moves forward to a fifth step which involves one of two options. If no tethering exists, step 5 takes the form of block 141-1 but if tethering exists the step takes the form of block 141-2. In block 141-1, bridging SACMAT is removed from the structures and any remaining sheet STRMAT to release the structures from the SACMAT and from each other.

From block 141-1 the process moves to a sixth step as illustrated by block 151-1 which calls for the gathering of the structures, performance of any required inspections or tests and putting the acceptable sheet STRMAT structures to use.

If tethering exists, the fifth step, as illustrated by block 141-2, calls for the removal of the bridging SACMAT from the structures and any remaining sheet STRMAT to release the tethered structures, 141-2. From step 141-2 the process move forward to a sixth optional step of performing any additional processing steps (e.g. depositions) that might be desired before removing the tethers.

From block 146-2 the process moves forward to a seventh step, as illustrated by block 151-2, that calls for, in a desired order that is not dictated, cutting of the tethers, performing of any required inspections or tests, and putting the acceptable sheet STRMAT structures to use.

Figure 2B:
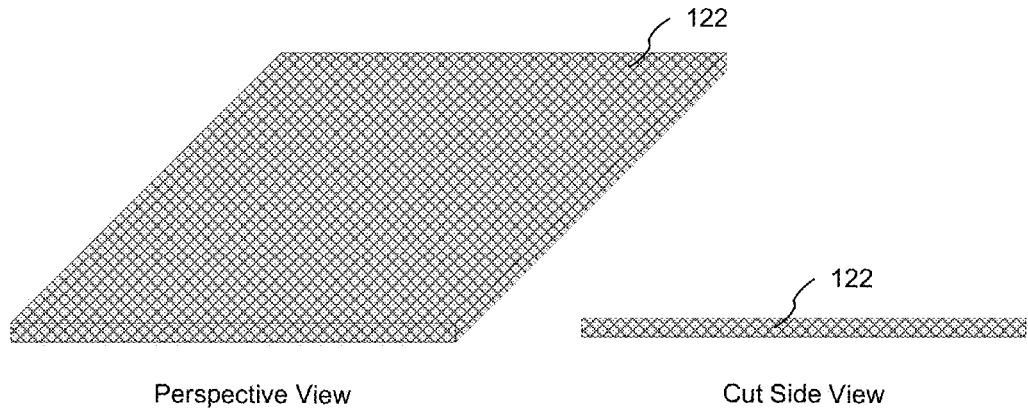
FIG. 2B provides a perspective view (on the left of the page) and a cut side view (on the right of the page) of an example sheet of sheet structural material that can be used as a structural material according to the first embodiment.

FIG. 2B illustrates a perspective view (on the left of the page) and a cut side view (on the right of the page) of an example sheet of sheet structural material 122 that can be used as a structural material (STRMAT) according to the first embodiment.

Figure 2C:
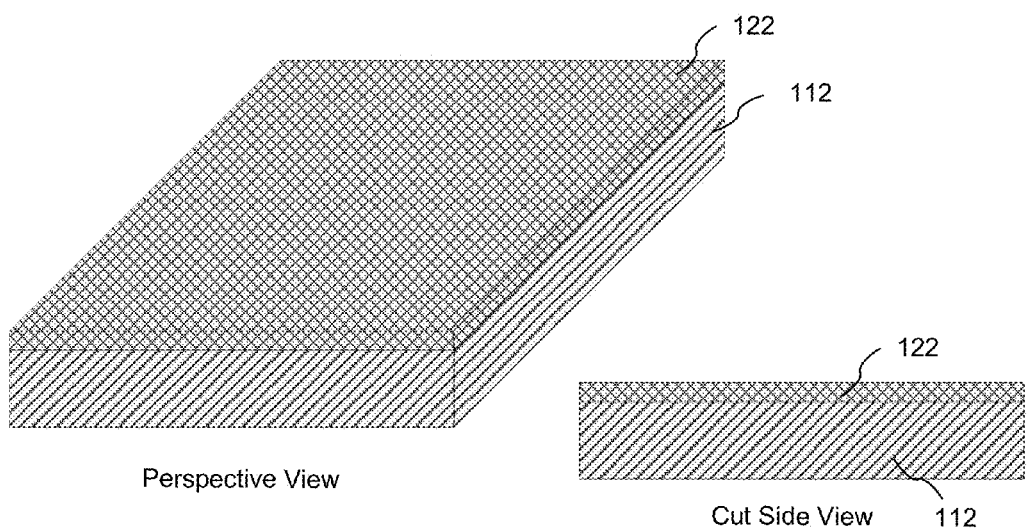
FIG. 2C provides a perspective view and a cut side view of an example sheet of structural material bonded to or otherwise joined to a thickness of sample sacrificial bridging material (e.g. deposited layer or layers, bonded sheet or sheets) as part of the process of forming a structure according to the first embodiment.

FIG. 2C illustrates a perspective view and a side cut view of an example sheet of structural material bonded to, or otherwise joined to, a thickness of sample sacrificial bridging material (e.g. deposited layer or layers or bonded sheet or sheets) 112 as part of the process of forming a structure according to the first embodiment.

Figures 1, 2D:
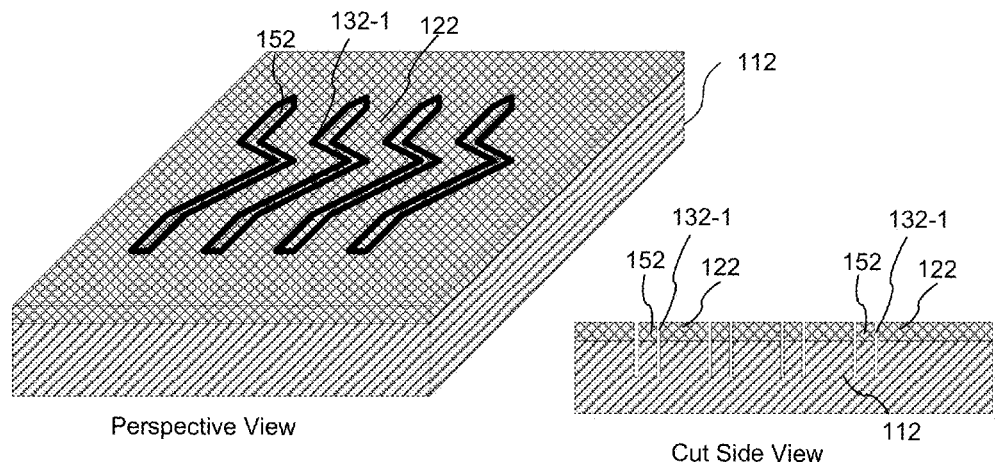
FIG. 2D-1 provides a perspective view and a cut side view of four sample structures) having their outlines defined by laser cutting through the sheet structural material and leaving the structures held in their original positions by the presence of bridging sacrificial material that has not been completely cut through and wherein the cutting used to define each structure is completely independent of the cutting that is used to define every other structure.

FIG. 2D-1 illustrates a perspective view and a side cut view of four sample structures 152 having their outlines 132-1 defined by laser cutting through the sheet structural material 112 and leaving the structures held in their original positions by the presence of bridging sacrificial material that has not been completely cut through and wherein the cutting 132-1 used to define each structure 152 is completely independent of the cutting that is used to define every other structure.

Figures 2, 2D:
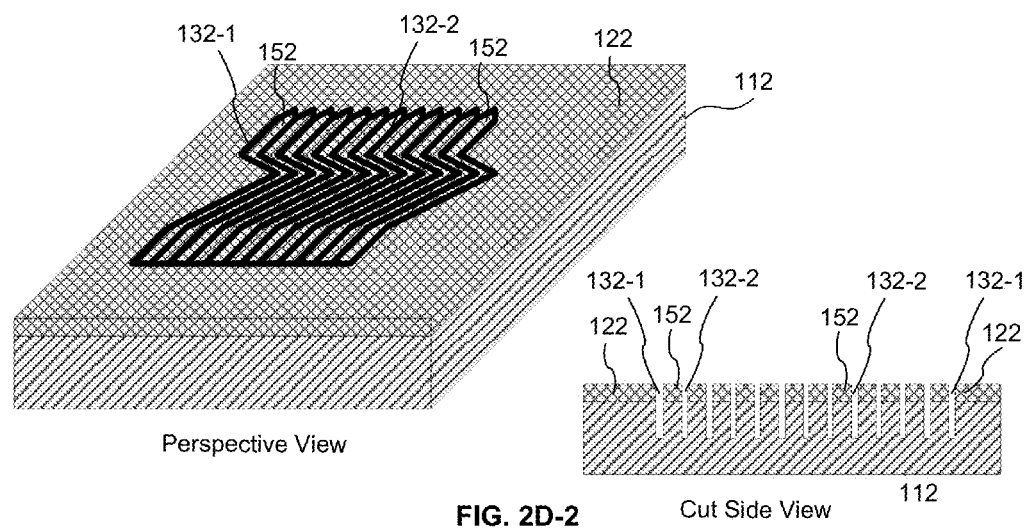

FIG. 2D-2 is similar to FIG. 2D-1 with the exception that 12 structures 152 are shown and each structure shares a cut region 132-2 with one or more neighboring structures such that a vast majority of the regions of sheet structural material 122 cut through define the perimeter of more than one structure while some cut regions 132-1 define the boundary of a single structure.

Figure 2E:
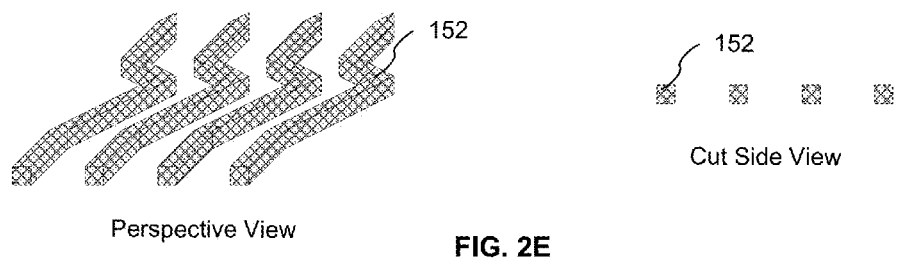
FIG. 2E illustrates a perspective view and a cut side view of the four structures of FIG. 2D-1 after release from the bridging sacrificial material such that the four structures are separated.

FIG. 2E illustrates a perspective view and a side cut view of the four structures of FIG. 2D-1 after release from the bridging sacrificial material and sheet structural material that was not part of a formed structure such that the four structures are separated one from another.

In some variations of the process of FIGS. 2A-2E, in addition to use of a bridging sacrificial material, a capping sacrificial may have been plated or otherwise located on the front side of the sheet so that debris from laser cutting could not redeposit onto the upper surface of the sheet STRMAT. In these alternatives, the capping sacrificial material may be removed when the bridging sacrificial material is removed. In other variations of this first embodiment, the sacrificial bridging material may be attached to a substrate or frame prior to laser cutting. In such variations the substrate may provide the needed structural support and it may be possible to cut completely through the bridging sacrificial material during laser cutting.

Methods for Forming Sheet STRMAT and Bridging SACMAT Workpieces

Figure 3A:
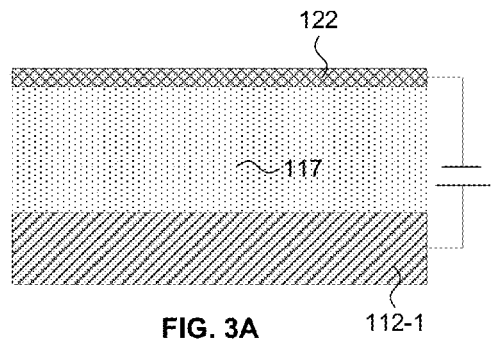
FIG. 3A provides a schematic illustration of one state in a process of locating bridging sacrificial material on the sheet structural material wherein the sheet material is set up for receiving an electrodeposit of sacrificial material.

FIG. 3A provides a schematic illustration of one state in a process of locating bridging sacrificial material on the sheet structural material 122 wherein the sheet material (e.g. tungsten) is set up for receiving an electrodeposit of bridging sacrificial material from anode 112-1 via plating solution 117. In some variations of the process, an adhesion layer and seed layer may be located on the sheet structural material, e.g. by cleaning and then applying an adhesion material (e.g. titanium, chromium, tungsten, gold, or a combination by sputtering) and then a seed layer material (e.g. gold, silver, copper, nickel, or the like by sputtering) prior to beginning electrodeposition of the sacrificial material (e.g. Cu). In still other alternatives, a seed layer may be used without a separate adhesion layer. In still other alternatives, neither an adhesion layer nor a seed layer may be needed. In still other variations, a strike or flash deposition may be initially used (i.e. plating using a high current density along with a plating bath with a low ion concentration) which may be followed by further electroplating.

Figure 3B:
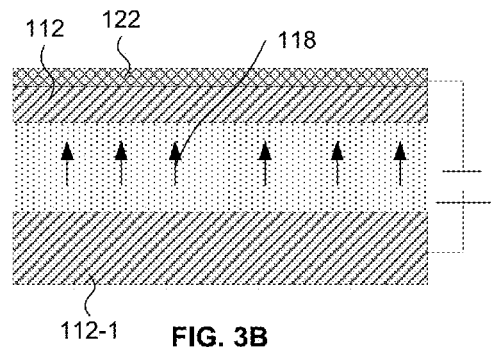
FIG. 3B provides a schematic illustration of another state of the process of FIG. 3A wherein the deposition of the sacrificial bridging material on the sheet structural material has begun.

FIG. 3B provides a schematic illustration of another state of the process of FIG. 3A wherein the deposition of the sacrificial bridging material 112 on the sheet structural material 122 has begun as shown by the arrows 118. In some variations, the deposited sacrificial material 112 may be planarized after deposition to ensure a desired thickness, desired co-planarity with the surface of the sheet structural material, or simply to obtain a desired level of planarity of the surface of the deposited material. In some variations of the process of FIGS. 3A and 3B a second anode may be used simultaneously or in series to deposit a capping SACMAT on the other side of the sheet material. The deposition of materials on opposite sides of the sheet may result in the same or different thicknesses of deposit. It is believed that in general a capping SACMAT may not require a thickness as great as that of the bridging SACMAT.

Figure 4A:
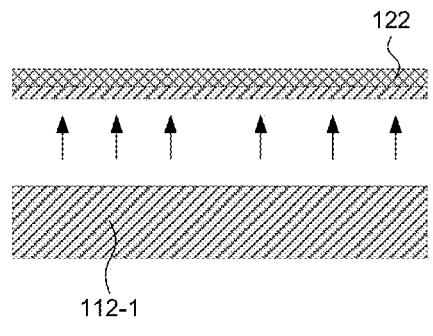
FIGS. 4A and 4B provide schematic illustrations of two states in an alternative process of locating a sacrificial material onto the sheet structural material wherein deposition of the sacrificial material occurs by a means other than electrodeposition (e.g. electroless deposition, spray metal deposition, CVD, PVD, or the like).
Figure 4B:
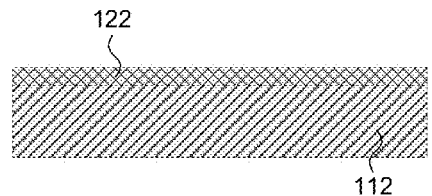

FIGS. 4A and 4B provide schematic illustrations of two states in an alternative process of locating a sacrificial material 112 onto the sheet structural material 122 wherein deposition of the sacrificial material occurs by a means other than electrodeposition (e.g. electroless deposition, sputtering, PVD, spray metal deposition, or the like) from source 112-1. FIG. 4A shows the state of the process just after deposition begins while FIG. 4B shows the state of the process after deposition has been completed and possible planarization has occurred. As with the example of FIGS. 3A and 3B, a variation of the process of FIGS. 4A and 4B may involve deposition of a second body of SACMAT on the opposite side of the sheet material.

Figure 5:
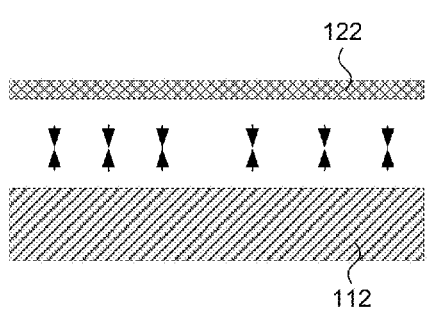
FIG. 5 provides a schematic illustration of a third alternative method of locating a sacrificial material onto the sheet structural material wherein a sheet of sacrificial material is adhered or bonded to the sheet of structural material (e.g. via diffusion bonding, ultrasonic bonding, or the like).

FIG. 5 provides a schematic illustration of a third example alternative method of locating a sacrificial material 112 onto the sheet structural material 122 wherein a sheet of sacrificial material is adhered or bonded to the sheet of structural material. For example, this may occur using diffusion bonding, ultrasonic bonding, or bonding via an adhesive property of the sacrificial material itself.

Figure 6:
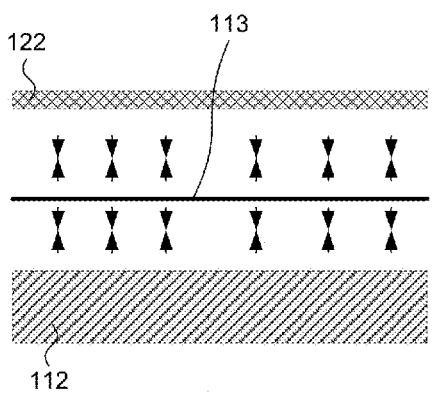
FIG. 6 provides a schematic illustration of a fourth alternative method of locating a sacrificial material onto the sheet structural material wherein a sheet of sacrificial material is adhered or bonded to the sheet of structural material via an intermediate bonding or adhesion material.

FIG. 6 provides a schematic illustration of a fourth alternative method of locating a sacrificial material onto the sheet structural material wherein a sheet of sacrificial material 112 is adhered or bonded to the sheet of structural material 122 via an intermediate bonding or adhesion material 113 which may be formed on a surface of one or both of the sheets to be bonded (not shown) or alternatively may be a sheet material (as shown) which is located between the other two sheets.

Figure 7A:
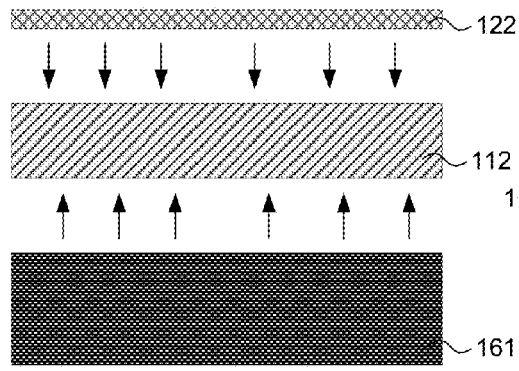
Figure 7B:
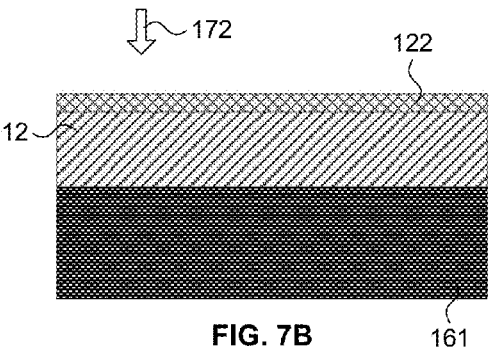

FIGS. 7A and 7B provide schematic illustrations of a potential relationship between a sheet of structural material 122, a body of sacrificial material 112, and a support or base structure 161 that may be used in some embodiments of the invention. FIG. 7A shows the materials and base initially separated while FIG. 7B shows the materials and base after being bought and held together (e.g. attached, bonded, vacuum held, or the like) wherein the sacrificial material is located between the structural material and the base. If the sacrificial material and the base are not to be cut through, primary laser cutting must occur from the top side of the assembly as shown by the arrow 172 in FIG. 7B. In some variations of this embodiment, a polymer based bonding material may be located between the substrate and the bridging SACMAT (e.g. copper, tin, iron).

Figure 8A:
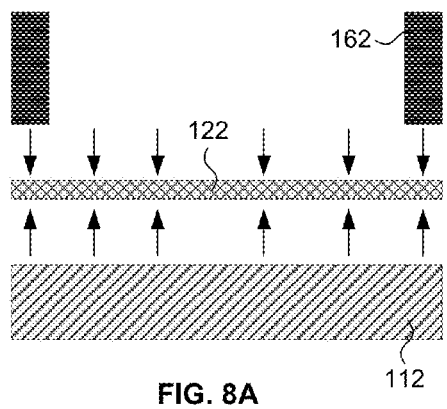
Figure 8B:
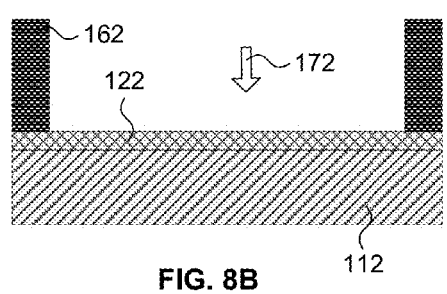

FIGS. 8A and 8B provide schematic illustrations of a potential relationship between a sheet of structural material 122, a body of sacrificial material 112, and support or base frame 162. FIG. 8A shows the materials and frame initially separated while FIG. 8B shows the materials and frame after being bought and held together and wherein the sheet of structural material is located between the frame and the sacrificial material which results in a need for primary laser cutting to occur from the top side of the assembly as shown by the arrow 172 in FIG. 8B. In some variations of this embodiment, a polymer based bonding material may be located between the frame and the sheet material.

Figure 9A:
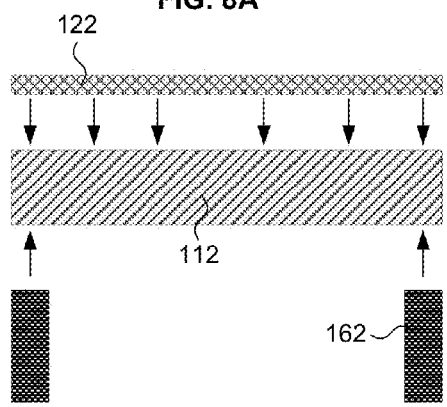
Figure 9B:
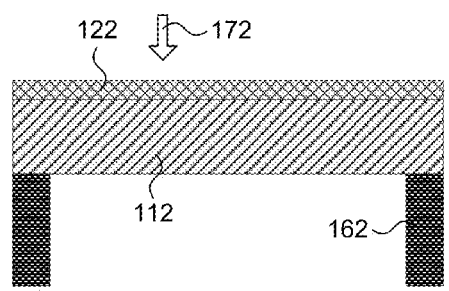

FIGS. 9A and 9B provide schematic illustrations of another potential relationship between a sheet of structural material 122, a body of sacrificial material 112, and a support or base frame 162. FIG. 9A shows the materials and frame initially separated while FIG. 9B shows the materials after being bought and held together wherein the sacrificial material is located between the frame and the structural material base which results in a need for primary laser cutting to occur from the top side of the assembly as shown by the arrow 172 in FIG. 9B. In some variations of this embodiment, a polymer based bonding material may be located between the frame and the sheet material.

Other potential relationships between a sheet of structural material, a body of bridging sacrificial material, and a support or base frame or structure are also possible. For example, a top or bottom frame may be used in combination with a frame only or solid support or base structure which is located on the opposite side of the materials. In still other alternatives, as will be discussed hereafter, the relationships between these elements may also involve additional intermediate materials or capping materials. In some alternatives, sacrificial material may be located on both sides of the sheet STRMAT wherein only one of the regions of sacrificial material may act as a bridging material or both may act, at least in part, as a bridging material.

Examples of Sheet and/or Layer Stacking Useful in Some Method Embodiments of the Invention FIGS. 10A-10I provide nine example material stacking or deposition arrangements that may occur in some method embodiments when a solid base is used to the support the bridging sacrificial material.

Figure 10A:
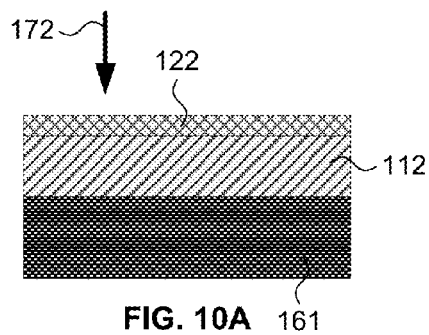
FIGS. 10A-10I provide nine example material stacking or deposition arrangements that may occur in some method embodiments when a solid base is used to the support the bridging sacrificial material.

FIG. 10A provides a schematic illustration of a possible relationship between a sheet of structural material 122, a bridging sacrificial material 112, and a base 161 such that laser cutting will occur from the upper surface as shown by arrow 172 and a resulting structure, or plurality of structures, to be formed will include material from the sheet of structural material (after removal of the bridging sacrificial material).

Figure 10B:
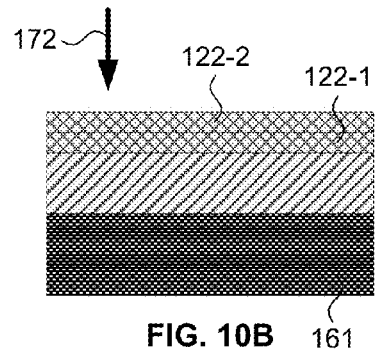

FIG. 10B provides a schematic illustration of a possible relationship between a first sheet of structural material 122-1, a second sheet of structural material 122-2, a bridging sacrificial material 112, and a base 161 such that laser cutting will occur from the upper surface as shown by arrow 172 and a resulting structure, or plurality of structures, to be formed will include material from the first and second sheets of structural material.

Figure 10C:
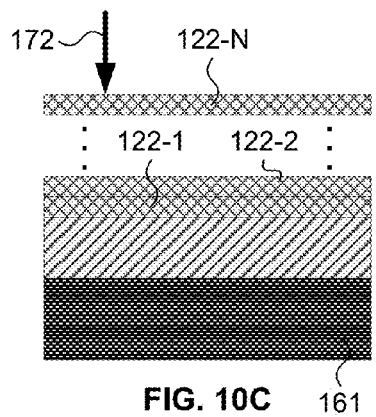

FIG. 10C provides a schematic illustration of a possible relationship between a first sheet of structural material 122-1 to an Nth sheet of structural material 122-N, a bridging sacrificial material 112, and a base 161 such that laser cutting will occur from the upper surface as shown by arrow 172 and a resulting structure, or structures, will include material from the first to Nth sheets of structural material.

Figure 10D:
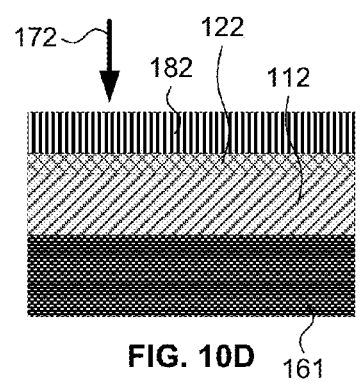

FIG. 10D provides a schematic illustration of a possible relationship between extra-structural material in the form of one or more multi-material layers 182 of structural and sacrificial material, a sheet of structural material 122, bridging sacrificial material 112, and a base 161 wherein laser cutting will occur from the upper surface as shown by arrow 172 and a resulting structure, or plurality of structures formed, can include not only the sheet structural material but also one or more layers of overlying structural material and possibly encapsulated sacrificial material which formed part of each of the one or more multi-material layers of deposited material.

Figure 10E:
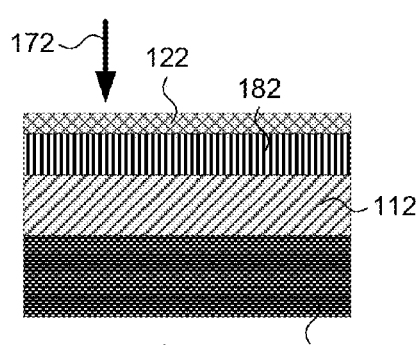

FIG. 10E provides a schematic illustration of another possible relationship between extra-structural material in the form of one or more multi-material layers 182 of structural and sacrificial material, a sheet of structural material 122, bridging sacrificial material 112, and a base wherein the relationship is different from that of FIG. 10D since the multi-material layers in FIG. 10E are located below the sheet of structural material as opposed to above it. To avoid cutting through the base and the bridging sacrificial material the cutting direction is from above as shown by arrow 172.

Figure 10F:
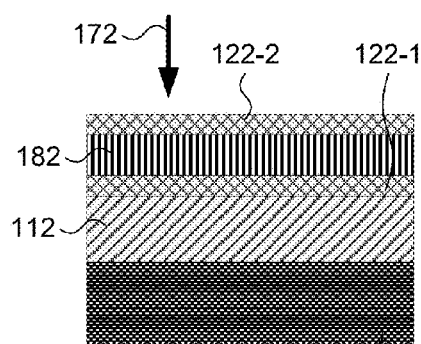

FIG. 10F provides a schematic illustration of a possible relationship between extra-structural material in the form of one or more multi-material layers 182 of structural and sacrificial material, two sheets of structural material 122-1 and 122-2, bridging sacrificial material 112, and a base 161 wherein laser cutting will occur from the upper surface as shown by arrow 172 and a resulting structure, or plurality of structures formed, can include not only one sheet structural material but two sheet structural materials and also one or more layers of intermediate structural material and possibly encapsulated sacrificial material.

Figure 10G:
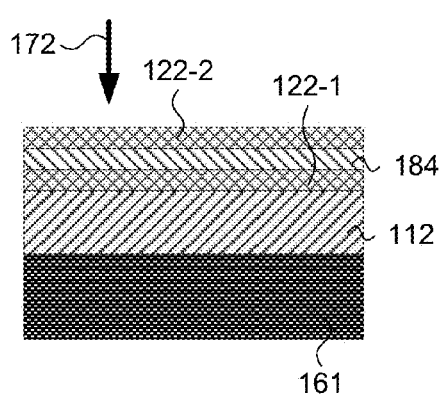

FIG. 10G provides a schematic illustration of a possible relationship between one or more layers of a material 184 that are located between sheets of structural material 122-1 and 122-2, bridging sacrificial material 112, and a base 161 wherein laser cutting will occur from the upper surface as shown by arrow 172 and a resulting structure, or plurality of structures formed, can include not only two sheets of structural material but also material from the intermediate layer or layers of material (e.g. to improve conductivity).

Figure 10H:
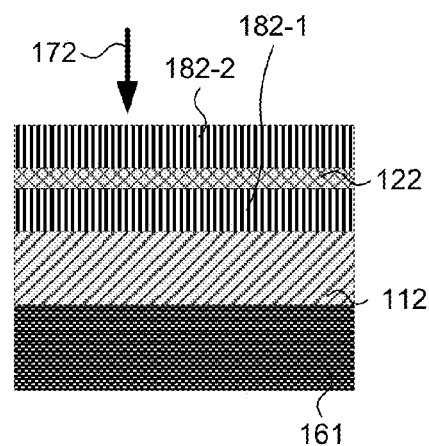

FIG. 10H provides a schematic illustration of a possible relationship between two separate regions of one or more multi-material layers 182-1 and 182-2 which are separated by a sheet of structural material 122, bridging sacrificial material 112, and a base 161 wherein laser cutting will occur from the upper surface as shown by arrow 172 and a resulting structure, or plurality of structures, to be formed can include not only the sheet of structural material by one or more layers of deposited material on both sides of the sheet. The double sided location of deposited material may be achieved in a number of different ways including direct deposition to each side simultaneously or separately followed by adhesion to a separately formed body of bridging sacrificial material or direct deposition of bridging sacrificial material to a surface of one of the multi-material regions. Alternatively, transfer of separately formed multi-material layers to one or both sides of the sheet structural material can occur and then diffusion bonding or an adhesive based bonding can occur. In an alternative to this embodiment and the other FIG. 10 embodiments noted as using one or more multi-material layers, the one or more multi-material layers may be replaced by one or more single material layers or a combination of single material and multi-material layers.

Figure 10I:
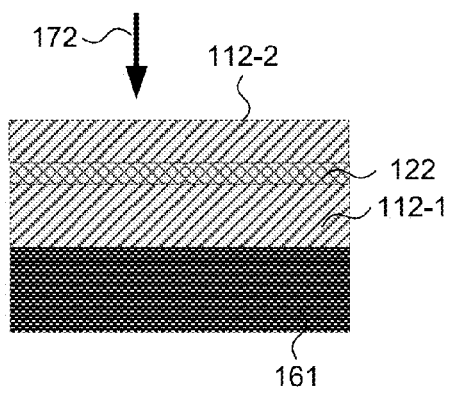

FIG. 10I provides a schematic illustration of a possible relationship between a sheet of structural material 122, a bridging sacrificial material 112-1, a capping sacrificial material 112-2, and a base 161 such that laser cutting will occur from the upper surface as shown by arrow 172 through the capping sacrificial material into the structural material and possibly even partially or perhaps completely through the bridging sacrificial material and where the resulting structure, or plurality of structures, to be formed will include material from the sheet of structural material (after removal of both the bridging sacrificial material and remaining regions of capping sacrificial material). The capping sacrificial material of this embodiment may be applied to the other embodiments set forth in FIGS. 10A-10I.

Other potential relationships between different types and different numbers of structural materials are possible. In some embodiments where one material layer has been shown to exist, two or more, materials layers may exist. In other some embodiments, additional sheet materials may be used. In still other variations, additional deposited materials may be used. In some embodiments various combinations of sheet STRMAT, multi-material regions, and other material regions may exist.

FIG. 11A-11J provide ten additional example material stacking or deposition arrangements that may occur in some method embodiments when a hollow base frame is used as opposed to the solid base of FIGS. 10A-10I which may allow laser cutting to occur from either above or below or both depending on the relationship of any bridging SACMAT or SACMATs and structural materials.

Figure 11A:
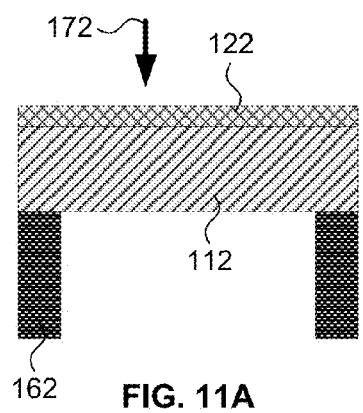
FIG. 11A-11J provide nine additional example material stacking or deposition arrangements that may occur in some method embodiments when a hollow base frame is used as opposed to the solid base of FIGS. 10A-10H.

FIG. 11A shows a relationship between a sheet of structural material 122, a bridging sacrificial material 112 and a frame 162 similar to that shown in FIG. 9B wherein primary laser cutting will occur from the upper surface as shown by arrow 172 and a resulting structure, or plurality of structures, to be formed will include only sheet structural material.

Figure 11B:
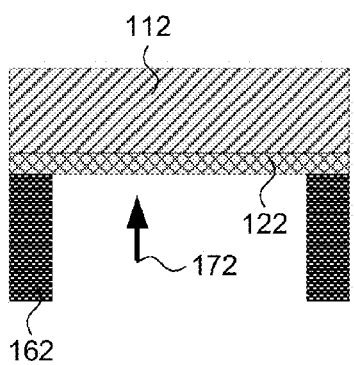

FIG. 11B shows a relationship between a sheet of structural material 122, a bridging sacrificial material 112 and a frame 162 similar to that shown in FIG. 8B wherein primary laser cutting will occur from the lower surface as shown by arrow 172 and a resulting structure, or plurality of structures, to be formed will include only sheet structural material.

Figure 11C:
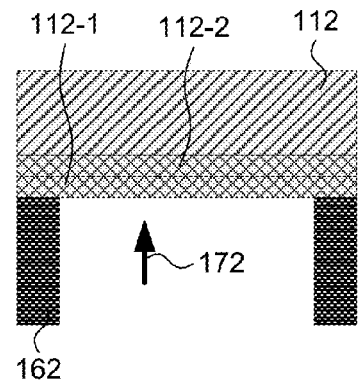

FIG. 11C shows a relationship between two sheets of structural material 122-1 and 122-2, a bridging sacrificial material 112 and a frame 162 which is opposite to that shown in FIG. 10B wherein primary laser cutting will occur from the lower surface as shown by arrow 172 and a resulting structure, or structures, to be formed will include material from the two sheets of structural material. Of course in other alternative embodiments, more than two sheets of structural material may be used.

Figure 11D:
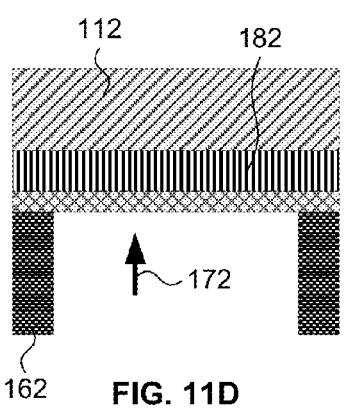

FIG. 11D shows a relationship between a sheet of structural material 122, a region formed from one or more multi-material layers 182, a bridging sacrificial material 112, and a frame 162 where the sheet of structural material is connected to the frame while one or more overlying multi-material layers are located above the sheet and a body of the bridging sacrificial material. In this embodiment, primary laser cutting occurs from the bottom so that the bridging sacrificial material need not be cut all the way through. In some variations of this embodiment, and the other embodiments that contain multi-material layers, laser cutting of the multi-material layers may or may not be used to define the geometry of the structure since patterned depositions of the multi-material layer materials may be used in whole, in part, or not at all to set the geometry of the structural regions of the multi-material layers. In some alternative embodiments, the bridging sacrificial material may be located below the lower sheet of structural material and mounted to the frame wherein primary laser cutting would occur from the upper surface.

Figure 11E:
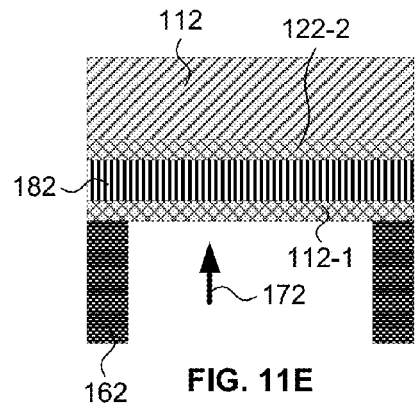

FIG. 11E depicts a relationship of materials similar to that of FIG. 11D with the exception that an additional sheet of structural material 122-2 is located between the region of the multi-material layer(s) 182 and the bridging sacrificial material 112. In some alternative embodiments, the bridging sacrificial material may be located below the lower sheet of structural material and mounted to the frame wherein primary laser cutting would occur from the upper surface as opposed to the lower surface as shown by arrow 172.

Figure 11F:
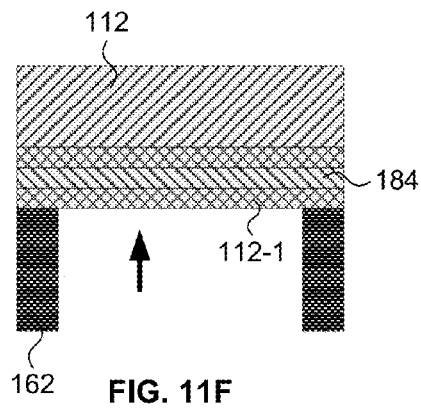

FIG. 11F shows a relationship where one or more layers of a material 184 are located between two sheets of structural material 122-1 and 122-2, where a base frame 162 is located below the lower sheet and above the upper sheet is a body of bridging sacrificial material 112. In this embodiment, primary laser cutting occurs from the bottom as shown by arrow 172. In some alternative embodiments, the bridging sacrificial material may be located below the lower sheet of structural material and mounted to the frame wherein primary laser cutting would occur from the upper surface.

Figure 11G:
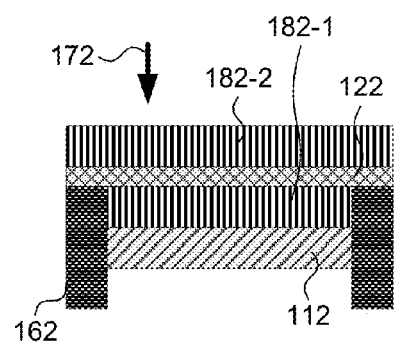

FIG. 11G shows a relationship where a single sheet of structural material 122 is bounded from above and partially from below by one or more multi-material layers 182-1 and 182-2 and wherein the sheet is also bounded, in part, from below around at least a portion of its periphery by a base frame 162 while the lower one or more multi-materials layers 182-1 is bounded from below by a region of bridging sacrificial material 112. In this embodiment, both the upper and lower groups of multi-material layers may be formed directly on the sheet material and then the bridging sacrificial material formed on the bottom of the lower multi-material layer(s). Alternatively formation can occur separately and then transfer and bonding can be made to occur. In this embodiment, primary laser cutting occurs from above as shown by arrow 172. In some alternative embodiments, the upper portion of the frame could be mounted to the bottom of the lower multi-material region or the bottom of the bridging sacrificial material as opposed to the bottom of the sheet.

Figure 11H:
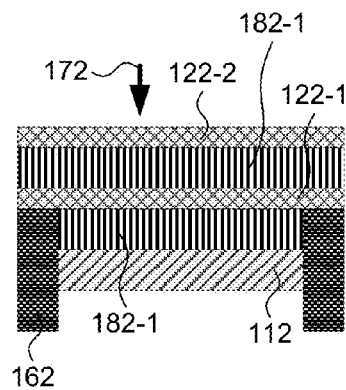

FIG. 11H shows a relationship where two sheets of structural material 122-1 and 122-2 are used along with two multi-material layer regions 182-1 and 182-2 along with a lower sacrificial bridging material 112 and a base frame 162. In this embodiment primary laser cutting occurs from above as shown by arrow 172. In this embodiment different bonding methods are possible, e.g. direct deposition of the one or more multi-material layers between the two sheets can occur partially on each sheet and then bonding of the intermediate region made to occur, deposit can occur completely on one sheet and then bonding to the other sheet made to occur, or deposition made to occur on one or more separate substrates and then transfer and bonding to both sheets made to occur. Similar possibilities exist for the bridging sacrificial material. In some alternative embodiments the upper portion of the frame could be mounted to the bottom of the lower multi-material region or the bottom of the bridging sacrificial material as opposed to the bottom of the lower sheet.

Figure 11I:
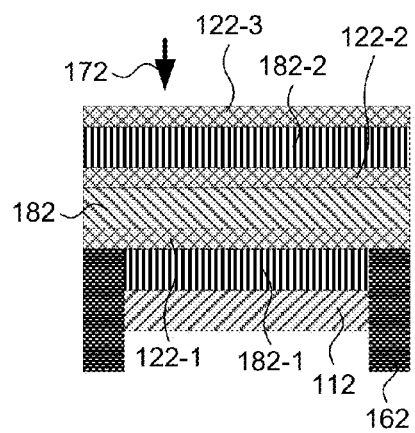

FIG. 11I illustrates another example of a multi-region material stack where the stack includes, from top to bottom, a sheet structural material 122-3, a region formed from one or more multi-material layers 182-2, a sheet structural material 122-2, a region formed from one or more single material layers 184, a sheet of structural material 122-1, a region formed from one or more multi-material layers 182-1, and a bridging sacrificial material region 112. The stack as illustrated is supported by a frame 162 that bounds the bottom of the lower sheet structural material. As shown by arrow 172 the primary cutting direction is from above. In some alternative embodiments the upper portion of the frame could be mounted to the bottom of the lower multi-material region or the bottom of the bridging sacrificial material as opposed to the bottom of the lower sheet. In an alternative to this embodiment and the other FIG. 11 embodiments that are noted as using one or more multi-material layers, the one or more multi-material layers may be replaced by one or more single material layers or a combination of single material and multi-material layers. Similarly, in other alternatives, the single material layers as shown in this and the other FIG. 11 examples may be replaced by one or more multi-material layers or a combination of one or more multi-material layers and one or more single material layers.

Figure 11J:
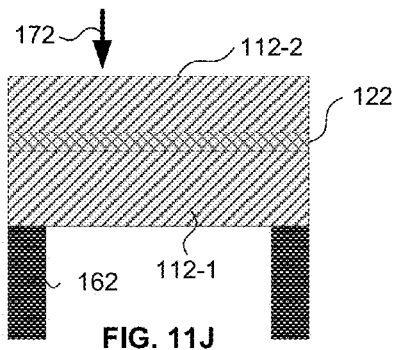

FIG. 11J provides a schematic illustration of a possible relationship between a sheet of structural material 122, a bridging sacrificial material 112-1, a capping sacrificial material 112-2, and a base frame 162 such that laser cutting will occur from the upper surface as shown by arrow 172 through the capping sacrificial material into the structural material and possibly even partially or perhaps completely through the bridging sacrificial material and where the resulting structure, or plurality of structures, to be formed will include material from the sheet of structural material (after removal of both the bridging sacrificial material and remaining regions of capping sacrificial material). Of course the positions of the capping and bridging sacrificial material in this embodiment may be reversed along with the incident surface of the cutting laser beam. The capping sacrificial material of this embodiment may be applied to the other embodiments set forth in FIGS. 11A-10I.

Figure 12A:
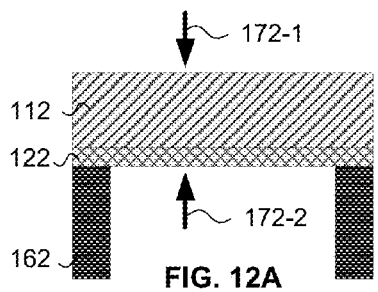
FIGS. 12A and 12B illustrate that in some embodiments like those shown in FIGS. 11A-11F, laser cutting can occur from both sides.
Figure 12B:
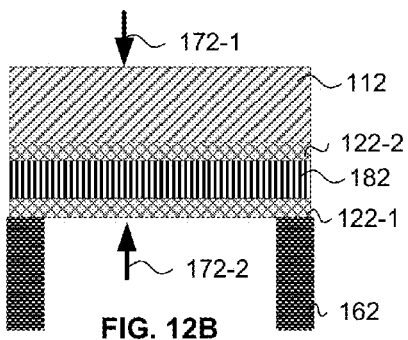

FIGS. 12A and 12B illustrate that in embodiments like those shown in FIGS. 11A-11I, laser cutting can occur from both sides. Laser cutting opposite the bridging sacrificial material may be used to cut out complete or partial outlines of the structures through the sheet material and at least partially into the bridging sacrificial material or into the one or more multi-material layers depending on whether the laser is intending to cut completely through structural material on the multi-material layer(s). The laser cutting from the same side as the bridging sacrificial material may be used to cut or trim specialized features in the sheet material or in the structural material of the multi-material layer(s), e.g. to trim down structure tips regions, or simply to trim a portion of the outlines of the structures. FIG. 12A does not include any multi-material layers while FIG. 12B does.

Those of skill in the art will understand, from a review of the teachings herein, that numerous other material stacking possibilities exist such that structures may have enhanced material properties or functional properties that are provided by such stacking variations. Those of skill in the art will understand from the teachings herein that laser cutting or trimming, in some embodiments, may be used to provide substantially all geometric features of the structures, while in other embodiments, only a portion of the geometric features of a structure may be defined by laser cutting or trimming while additional features may be defined by providing selective placement of structural material and sacrificial materials, e.g. by photoresist based mask or direct write lithography, by selectively etching and removal of sacrificial material and subsequent deposition of structural material, and/or by planarization of sacrificial and structural materials. Those of skill in the art will understand, upon review of the teachings herein, that laser cutting of structural material may occur in a single pass, multiple passes, multiple partially overlapping passes, multiple cutting or trimming operations that may directly follow one another or be separated by deposition, planarization, bonding, or other non-laser cutting or trimming operations. Those of skill in the art will understand, upon review of the teachings herein that structures may become completely isolated from one another (except for bridging supplied by the bridging SAC-MAT) after laser cutting or that they may remain connected in some manner via tethers of sheet structural material, tethers of other structural material, tethers of selectively located sacrificial material until complete separation is desired (at which time cutting or other removal of tethers can occur). Those of skill in the art will understand from the teachings herein, that during laser cutting, the beam power, pulse width, wavelength, pulse duration, pulse repetition rate, beam orientation relative to the orientation of the material being cut may vary to achieve different cutting effects.

It will be understood by those of skill in art that not every embodiment needs to include a separately formed bridging sacrificial material region. In some alternative embodiments, no bridging sacrificial material need be used. In some alternative embodiments, bridging sacrificial material may be included as part of one or more multi-material layers particularly where a multi-material layer that is not cut completely through has structural features not defined by laser cutting but by patterned existence of structural material such that there is no need to cut completely through at least one of the multi-material layers and thus its sacrificial material may serve the function of the bridging sacrificial material.

Side View Configurations of Sample Structure Embodiments Formable According to Some Method Embodiments of the Invention FIGS. 13A-15K depict side views of different embodiments of structures formed from one or more layers of sheet material and in some embodiments one or more layers of deposited material which may involve either multiple materials per layer (e.g. different materials located in different lateral regions of a single layer whose upper and lower boundaries may be set by planarization) or a single material per layer. In some embodiments the structures may be compliant contact structures (e.g. probes) and may include a tip material having improved contact properties relative to another material used in forming a body of the structure which in turn may provide better spring properties. In some embodiments, improved material properties in one or more regions of a structure are obtained by modifying the material properties of structural materials. In some embodiments tip material may be limited to the distal ends (right most sides in the figures) while in other embodiments tip material may extend to base ends or proximal ends of the structures (left most sides as illustrated). In some structures that are formed, embodiments may also include formation of regions containing other specialized materials such as materials that provide enhanced conductivity, materials that provide enhanced or more reliable bonding capability to other structures, materials that provide enhanced or more reliable bonding or joining of different structural materials, materials that provide dielectric properties, and the like. In some embodiments, such specialized properties may be obtained by use of different materials or by modification of existing materials.

Figure 13A:
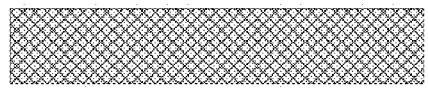
FIGS. 13A-13L depict side views of different embodiments of structures formed from one or more layers of sheet material.

FIG. 13A depicts a schematic representation of a side view of structure formed from a single sheet of structural material having a uniform thickness in Z (i.e. the direction perpendicular to the plane of the sheet material from which it was formed) from proximal to distal ends and having a desired material shape and configuration in the XY plane (e.g. bent or S-shaped—not shown other than as overall length).

Figure 13B:
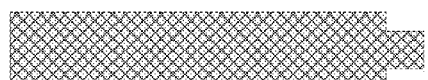

FIG. 13B depicts a schematic representation of a side view of a structure formed form a single sheet of structural material where laser cutting was used to cut a desired configuration in the XY dimensions of the structure (not shown other than as overall length) and to trim down the tip region from above and from below such that the tip has a generally rectangular shape but is thinner than the sheet in thickness in Z.

Figure 13C:
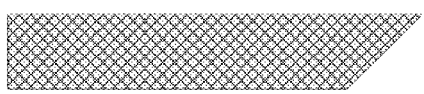

FIG. 13C depicts a schematic representation of a side view of a structure formed form a single sheet of structural material where laser cutting was used to cut a desired configuration in the XY dimensions (not shown other than as overall length) of the structure and to trim the tip region from above or below at an angle such that the tip has a generally triangular shape in a side view in the Z-dimension. The tip may form a point, an elongated straight line, a curved line, a plurality of points, or the like along its distal end as may be seen from a top or bottom view (not shown).

Figure 13E:
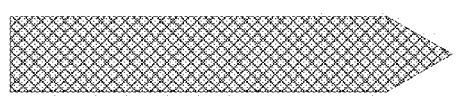
Figure 13D:
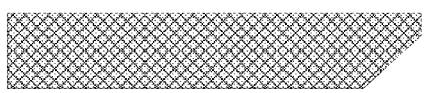

FIG. 13D depicts a schematic representation of a side view of a structure formed form a single sheet of structural material where laser cutting was used to cut a desired configuration in the XY dimensions of the structure and to trim the tip region from above or below at an angle such that the tip has a generally truncated triangular shape in a side view while it may form a point, a line, a curved surface, a multi-point surface, or the like along its distal end in a top view (not shown).

FIG. 13E depicts a schematic representation of a side view of a structure formed form a single sheet of structural material where laser cutting was used to cut a desired configuration in the XY dimensions of the structure (not shown other than as overall length) and to trim the tip region from above, from below, from both above and below along one or more non-perpendicular axes such that the shape of the tip is generally triangular with its peak located toward the central axis (in the Z-dimension) and which may form a point, a blunt point, an elongated configuration, a multi-tip configuration or some other configuration along its distal end as may be seen from a top view or bottom view (not shown).

Figure 13F:

FIG. 13F depicts a schematic representation of a side view of a structure formed form a single sheet of structural material where laser cutting was used to cut a desired configuration in the XY dimensions of the structure (not shown other than as overall length) and to trim the tip region from above and below to form a thinned neck section and from above, below, or both along one or more non-perpendicular axes such that the shape of the tip that extends from the neck is generally triangular with its peak located toward the central axis (in the Z-dimension) and which may form a blunt point, elongated configuration, or some other configuration along its distal end as seen from a top or bottom view.

Figure 13G:
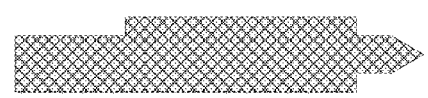
Figure 13H:
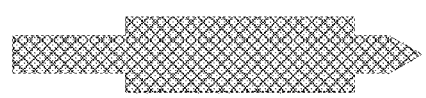

FIGS. 13G and 13H depict schematic representations of side views of structures formed form a single sheet of structural material where laser cutting was used to cut a desired configuration in the XY dimensions (not shown other than as overall length) of the structure to form tips like that shown in FIG. 13F wherein additional laser trimming is used to form notches or narrowed regions at the proximal ends of the structures (e.g. left ends). In the case of FIG. 13G the notching or narrowing of the proximal end occurs along only the top of the structure while in FIG. 13H the notching or narrowing of the proximal end occurs along both the top and bottom of the structure.

Figure 13I:
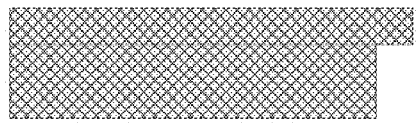

FIG. 13I depicts a schematic representation of a side view of a structure formed from two sheets of structural material, which may or may not be of the same material, which have been bonded together and machined such that the distal end of structure formed from one sheet extends further than the distal end formed from the other sheet. The formation of the pattern shown in this figure may be achieved by bonding and then performing all laser cutting or by performing some laser cutting, then bonding, and then additional laser cutting.

Figure 13K:
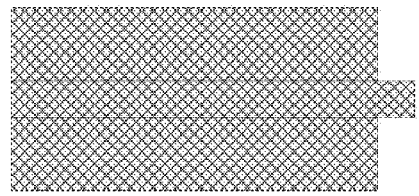
Figure 13J:
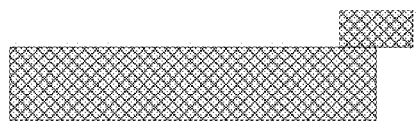

FIG. 13J depicts a schematic representation of a side view of a structure similar to that of FIG. 13I with the exception that the retained portion of the upper sheet extends beyond the distal end of the retained portion of the lower sheet while the proximal and central regions of the lower sheet are allowed to extend beyond that of the upper sheet. Such a configuration may be obtained by trimming and/or cutting from both top and bottom of the sheets or may occur as noted with regard to FIG. 13I by forming some openings before bonding and completing trimming and cutting after bonding.

FIG. 13K depicts a schematic representation of a side view of a structure formed from three sheets of structural material which have been bonded together with the retained part of the second sheet extending distally beyond the retained parts of the first and third sheets. Such configurations, as with FIGS. 13I and 13J may be formed in a variety of ways. Some feature formation (via laser cutting) may occur before bonding or all of it may occur after bonding. For example, holes over tip regions in the upper and lower sheets may be formed prior to bonding and then cutting of structure perimeters may occur through all three sheets after bonding).

Figure 13L:
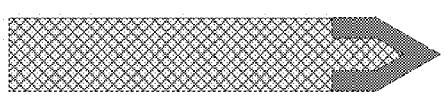

FIG. 13L depicts a schematic representation similar to that of FIG. 13E with the exception that a tip region (right most side of the structure) has been modified by a treatment to change its properties (e.g. it may undergo heat treating or some other treatment such as a shallow carburization, e.g. to a depth of 1 to 10 microns). In some alternative embodiments, heat treatment or other treatments such as carburization may occur over the entire surface of the structure, over one or both surfaces of the sheet prior to laser cutting. In other embodiments, such treatment may be applied to a single sheet of a multi-sheet structure.

Figure 14A:
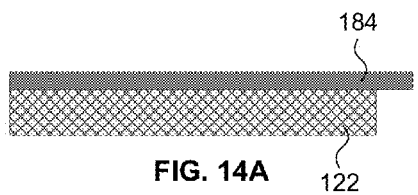
FIGS. 14A-14Q depict side views of different example embodiments of structures formed from one or more layers of sheet material and one or more layers or deposits of a single material per layer (e.g. a tip material).

FIG. 14A provides a schematic representation of a side view of a structure similar to that of FIG. 13I with the exception that the regions of distally extending structural material 184 include deposited material (i.e. second structural material, e.g. tip material) instead of sheet material 122. The formation of such a structure may occur in a variety of ways. For example, formation may occur according to the following steps: (1) before depositing the second structural material, form openings in the sheet material in regions that will be overlaid by extended second structural material, (2) deposit or otherwise locate a sacrificial or fill material into the openings, (3) if needed, planarize the sheet material and the sacrificial or fill material, (4) deposit the second structural material in a patterned or blanket manner, (5) cutout the structures using a cross-sectional pattern which may be based on a Boolean union of the structural areas of the sheet and the structural area of the second structural material or if the second structural material was deposited in a patterned manner, the laser cut regions may deviate from an exact match in the tip region as the laser cutting or trimming would not necessarily need to be used to define the tip region. In other variations, in addition to using Boolean operations to define laser cutting areas, boundary offsetting may be used (e.g. based on incremental erosion algorithms or incremental expansion algorithms).

Figure 14B:
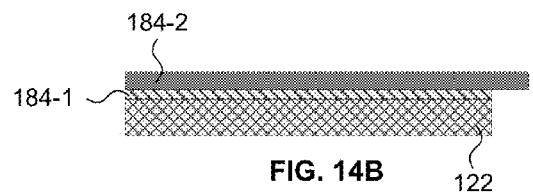

FIG. 14B provides a schematic illustration of a structure similar to that of FG, 14A with the exception that an intermediate layer 184-1 of a deposited material is located between the sheet structural material 112 and the second structural material 184-2. This intermediate material 184-1 may be a third structural material or may be an adhesion layer material, a seed layer material, a barrier material (e.g. to limit diffusion or migration between the sheet structural material and the second structural material) or a combination that provides for improved adhesion, bonding, and/or integration of the sheet and second structural materials.

Figure 14C:
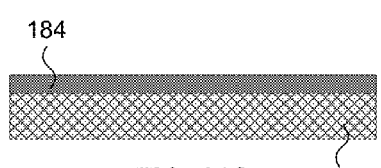

FIG. 14C provides a schematic illustration of a structure according to another embodiment wherein the second structural material (e.g. tip material) 184 doesn't extend beyond the XY dimensions of the retained sheet structural material but instead simply matches it but due to the harder tip material properties it is worn away more slowly during use such that it tends to protrude further than the retained sheet material and thus provides a primary contact surface after being put to use and undergoing a relative small number of scrubbing contacts.

Figure 14D:
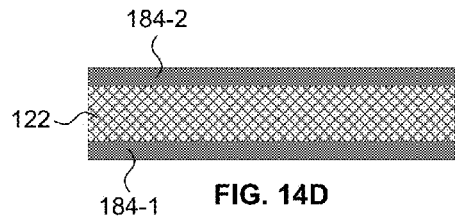

FIG. 14D provides a schematic illustration of a structure according to another embodiment wherein a second structural material 184-1 is provided on one side of the sheet material 122 while a third structural material 184-2 (which may be the same as or different from the second structural material) is provided on the other side of the sheet material.

Figure 14E:
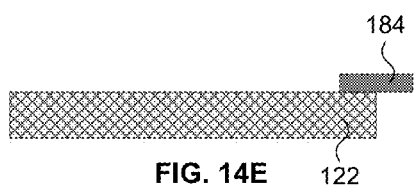

FIG. 14E provides a schematic illustration of a structure similar to that of FIG. 13J with the exception that the second material 184 is a deposited material and the deposited material extends distally beyond the sheet material 122. The formation of such a structure may occur in a variety of ways. For example blanket deposited second structural material may be cut (on the perimeter of the structure) by a laser and trimmed down or removed by controlled depth ablation by a laser. Similarly the distal end of the sheet material may also be trimmed by a laser (e.g. ablating from below). In another implementation, the second structural material may be patterned deposited thus reducing the amount of laser trimming necessary. In still other implementations, patterned deposition of the second structural material may occur after openings have already been formed in the sheet material and filled with a sacrificial material which a portion of the second structural material will overlay.

Figure 14F:

FIG. 14F provides a schematic illustration of a structure similar to that of FIG. 14E with the exception that prior to deposition of the second structural material 184 a notch, e.g. a reentrant notch (as shown) or a notch with vertical side walls (not shown), may be laser machined into selected portions of the sheet material 122 to provide for an interlocked volume of second structural material after deposition.

Figure 14G:
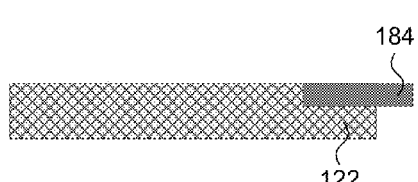

FIG. 14G provides a schematic representation of a side view of a structure formed from sheet of structural material 122 and a second structural material 184 which is deposited, in part, into a groove, slot, or channel cut into the retained portion of the sheet structural material.

Figure 14H:
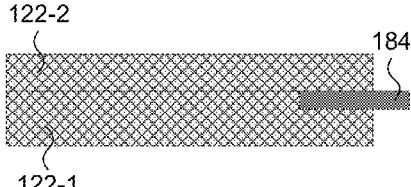

FIG. 14H depicts a schematic representation of a side view of a structure formed from two sheets 122-1 and 122-2 with a notch in the lower sheet for holding a second structural material 184 (e.g. a tip material) such that the two sheets of material provide at least partial entrapment of the second structural material.

Figure 14I:
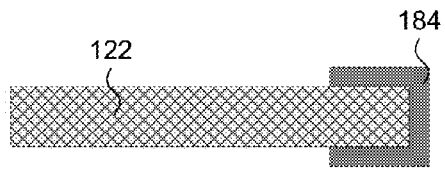

FIG. 14I depicts a schematic representation of a side view of a structure formed from a single sheet of structural material 122 which has received a deposit of a second structural material 184 (e.g. a tip material) around its distal end. Such a structure may be formed by cutting holes through the sheet material at distal end of the intended structure region or regions and there after selectively depositing the second structural material or blanket depositing it and then etching away material from regions that are supposed to be free of it.

Figure 14J:
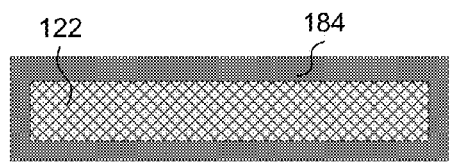

FIG. 14J depicts a schematic representation of a side view of a structure formed from a single sheet of structural material 122 which has received a deposit of a second structural material 184 (e.g. a tip material) around a large portion of, if not its entire, periphery. In some variations of this probe, the coating material may be limited to the top, bottom, distal, and proximal ends while in other variations the coating material may also cover the sides of the sheet material as well. Formation of such a structure may occur by the method outlined above with regard to FIG. 14I if a through hole is made not just at the distal end but also at the proximal end of the structural region or regions.

Figure 14K:
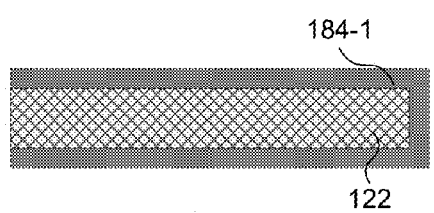

FIG. 14K depicts a schematic representation of a side view of a structure formed from a sheet material 122 and a deposited material 184-1 that covers the top and bottom faces as well as the distal end of the structure. Such coating features may be formed by forming a through hole in the sheet material in the distal region of the part and then depositing the material 184-1 onto the top and bottom surfaces such that it plates into the through hole at the same time. After which bridging and/or capping materials may be deposited if desired and then probe boundaries cut out. The laser cutting may or may not be used to define the tip regions depending on how wide the through-hole was and whether the deposited material completely filled the gap.

Figure 14L:
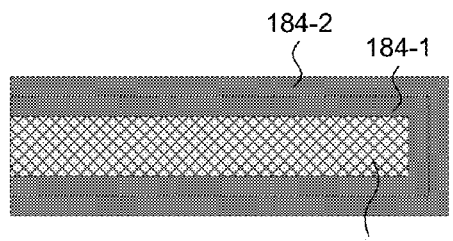

FIG. 14L is similar to that of FIG. 14K with the exception that a second deposited material 184-2 covers the first deposited material on the top, bottom, and distal end. A process of forming a structure like that of FIG. 14L may be implemented similar to that noted for FIG. 14K with the exception that the deposition of the first deposited material 184-1 is followed by a deposition of the second deposited material 184-2.

Figure 14M:
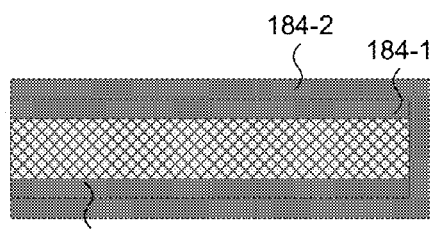

FIG. 14M depicts a schematic representation of a side view of a structure formed from a sheet material 122 and a top and bottom coating material 184-1 that does not coat either the distal or proximal ends of the structure and a second coating material 184-2 that in addition to coating the top and bottom surfaces also coats the distal end. A process for forming such a configuration may involve deposition of material 184-1 on the top and bottom surfaces, followed by laser ablation of the sheet material in the distal end region to form a through hole, and then deposition of the second deposited material 184-2. After deposition of the second material further laser cutting may be performed to define the perimeter of the structure or structures being formed.

Figure 14N:
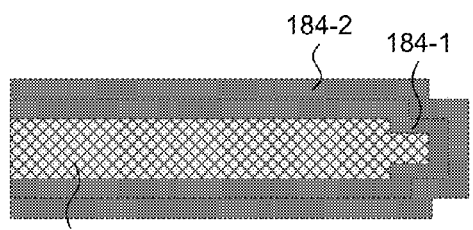

FIG. 14N depicts a schematic representation of a side view of a structure formed from a sheet material 122 and two coating of material 184-1 and 184-2. The deposition of the coating materials may occur after trimming down the distal or tip region and forming a through hole.

Figure 14O:
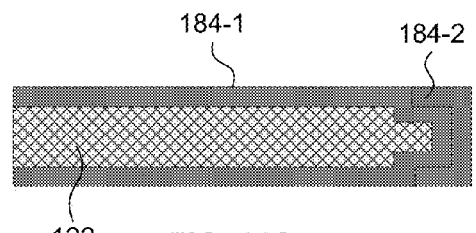

FIG. 14O depicts a structure similar to that of FIG. 14N with the exception that the $2^{nd}$ coating material 184-2 only occupies the distal region around the first coating material 184-1. A first coating may be formed in a manner similar to that discussed above with regard to FIGS. 14I-14N and thereafter either selectively depositing the second coating to the distal region or blanket depositing it to both sides and then planarizing both sides to remove the second coating material from the side regions.

Figure 14P:
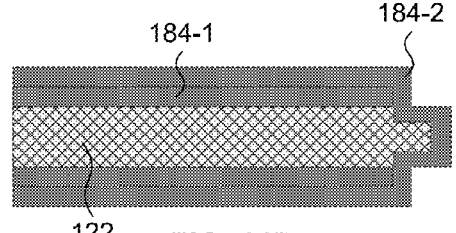

FIG. 14P depicts a structure similar to that of FIG. 14M but with a trimmed down tip region. The structure of FIG. 14P may be formed in a manner similar to that of FIG. 14M with the exception that instead of forming a simple through hole, the tip region is trimmed down from both top and bottom and a through hole is formed adjacent to the trimmed down region after which the coating of material 184-2 occurs.

Figure 14Q:
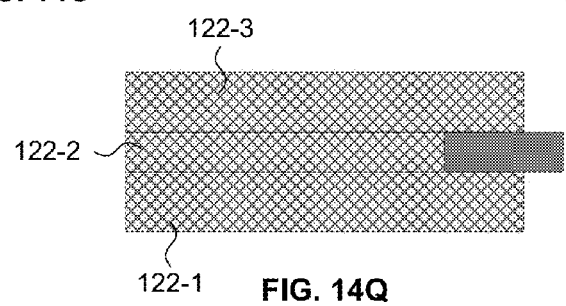

FIG. 14Q depicts a schematic representation of a side view of a structure formed from three sheets of structural material 122-1, 122-2, and 122-3 with a deposition of a second structural material 184 (e.g. a tip material) in a recess within the second sheet 122-2.

Figure 15A:
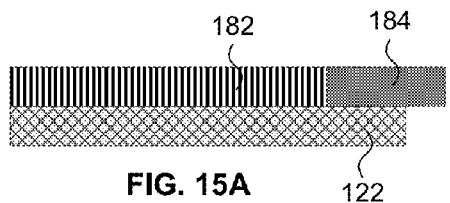
FIGS. 15A-15K depict side views of different embodiments of structures formed from one or more layers of sheet material, one or more multi-material layers of deposited material, and one or more layers of depositions of a tip material that may or may not be part of the multi-material layers.

FIG. 15A depicts a schematic representation of a side view of a structure formed from a single sheet of structural material 122 with an upper region formed from one or more multi-material layers 182 of deposited materials including a tip region formed from a third structural material 184 that may be different than a structural material forming other parts of the multi-material layer(s).

Figure 15B:
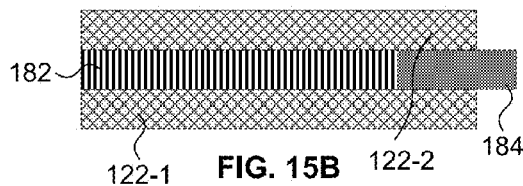

FIG. 15B depicts a schematic representation of a side view of a structure formed from two sheets of structural material 122-1 and 122-2 with central region formed from one or more multi-material layers 182 of deposited materials including a tip region formed from a third structural material 184 (e.g. a tip material) that may be different than a structural material forming other parts of the multi-material layer(s).

Figure 15C:
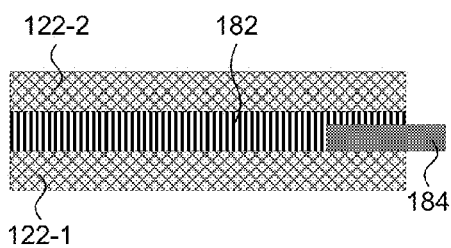

FIG. 15C depicts a schematic representation of a side view of a structure formed from two sheets of structural material 122-1 and 122-2 with central region formed from one or more multi-material layers 182 of deposited materials including a tip region that is formed from a third structural material 184, which may be the same or different from a structural material forming other parts of the multi-material layers and which is thinner than the thickness of the multi-material region.

Figure 15D:
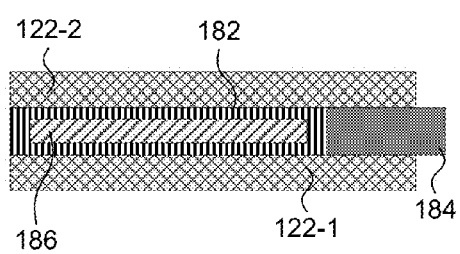

FIG. 15D depicts a schematic representation of a side view of a structure formed from two sheets of structural material 122-1 and 122-2 with central region formed from one or more multi-material layers 182 of deposited materials including (1) a tip region formed from a third structural material 184 that may be different from a structural material forming other parts of the multi-material layer(s) and (2) a central or internal region formed of a core material 186 that has a higher conductivity than a surrounding shell material.

Figure 15E:
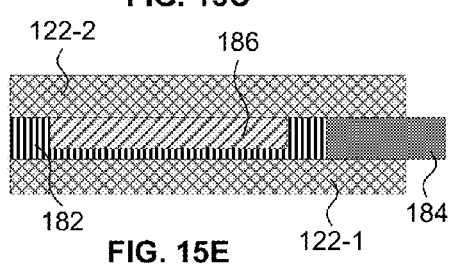

FIG. 15E depicts a schematic representation of a side view of a structure formed from two sheets of structural material 122-1 and 122-2 with central region formed from one or more multi-material layers 182 of deposited materials including (1) a tip region formed from a third structural material 184 that may be different from a structural material forming others part of the multi-material layer(s) and (2) a central region having an up-facing core material 186 that is surrounded on the sides and bottom by a shell material.

Figure 15F:
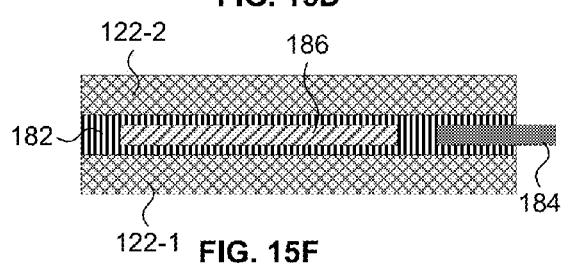

FIG. 15F depicts a schematic representation of a side view of a structure formed from two sheets of structural material 122-1 and 122-2 with central region formed from one or more multi-material layers 182 of deposited materials including (1) a tip region that is thinner than the height of the central region and formed from a third structural material 184 that may be different from a structural material used in forming other parts of the multi-material layer(s) and (2) a core region formed of a core material 186 that may have a higher conductivity than a surrounding shell material.

Figure 15G:
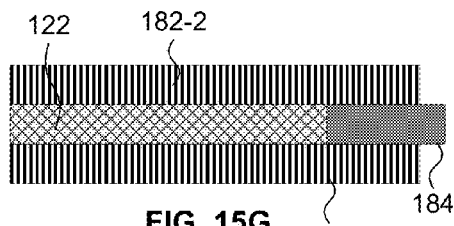

FIG. 15G depicts a schematic representation of a side view of a structure formed from two multi-material single or multi-layer regions 182-1 and 182-2 separated by a central region formed from at least one sheet of structural material 122 and a tip material 184 that extends beyond the distal ends of the multi-material regions.

Figure 15H:
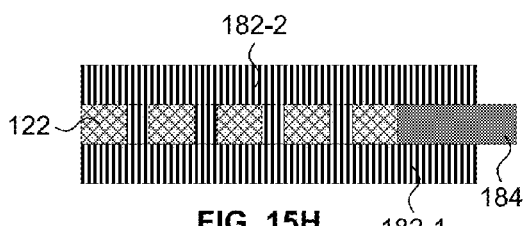

FIG. 15H depicts a schematic representation of a side view of a structure formed from two multi-material single or multi-layer regions 182-1 and 182-2 separated by a central region formed from at least one sheet of structural material 122 with a plurality of holes extending through it and a tip material 184 that extends beyond the distal ends of the multi-material regions. Due to the presence of the holes extending through the central sheet region, some of the material deposited in association one or both of the multi-material regions penetrates into the openings in the sheet such that a continuous volume of deposited structural material extends from the lower to upper surface of the structure.

Figure 15I:
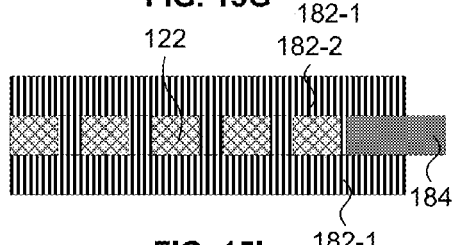

FIG. 15I depicts a schematic representation of a cut side view of a structure formed similar to that of FIG. 15H but the at least one deposited structural material forming a portion of the top and bottom multi-material regions 182-1 and 182-2 (in the Z-direction) extends through holes in the sheet material 122 and also surrounds at least part of the sides of the sheet material (not shown in the cut side view of FIG. 15I).

Figure 15J:
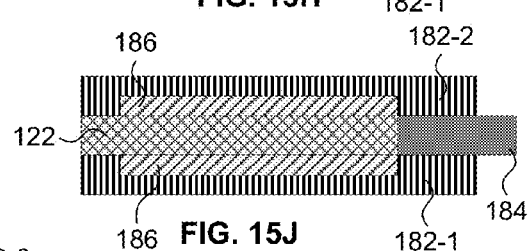

FIG. 15J depicts a schematic representation of the a side view of a structure formed similar to that of FIG. 15G with the exception that the formation of multi-material layer or layers forming the regions 182-1 and 182-2 on the top and bottom of the structure result in encapsulation of a core or internal structural material 186 by a shell of external structural material.

Figure 15K:
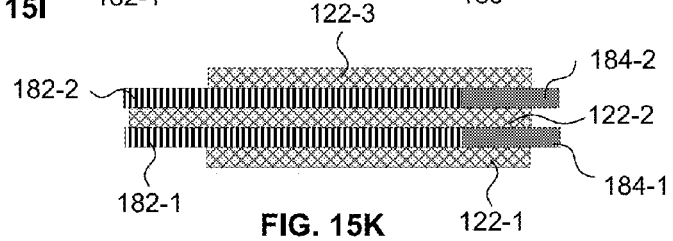

FIG. 15K depicts a schematic representation of the a side view of a structure formed from (1) three sheets of structural material 122-1, 122-2, and 122-3, (2) two intermediate regions of single or multi-layer, multi-material deposition regions 182-1 and 182-2 including two tip material regions 184-1 and 184-2 located at the distal ends of the multi-material deposition regions.

Numerous alternative to the configuration embodiments of FIGS. 15A-15K are possible. For example, where the individual FIGS illustrate the existence of regions formed from one or more multi-material layers, the regions may instead be formed from one or more single material layers or a combination of single and multi-material layers.

Additional Method Embodiments of the Invention

Structures similar to that of FIG. 13A may be formed according to steps of Method Embodiment 1 wherein the laser beam incident angle is normal to the surface of the sheet of structural material.

Figure 16A:
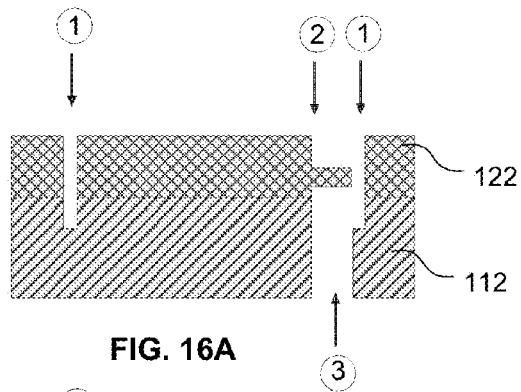
FIG. 16A provides a side cut view of a sheet STRMAT and a bridging SACMAT after laser cutting from above, trimming down the upper surface of the distal end from above, and trimming down the lower surface of the distal end from below such that a structure like that of FIG. 13B may be formed.
Figure 16B:
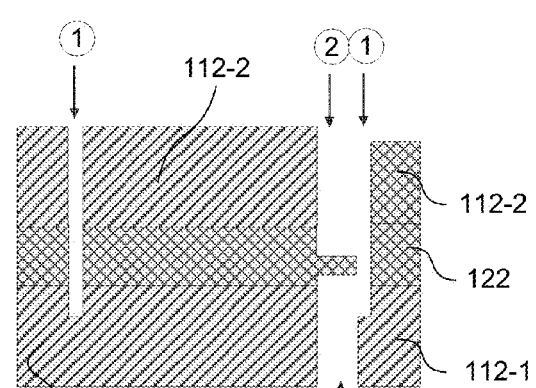
FIG. 16B provides a side cut view of a sheet STRMAT along with a bridging SACMAT and a capping SACMAT after laser cutting from above, trimming down the upper surface of the distal end from above, and trimming down the lower surface of the distal end from below such that a structure like that of FIG. 13B may be formed.

Structures similar to that of FIG. 13B may be formed in a variety according to a modified version of method of Embodiment 1 wherein in addition to cutting out the XY perimeters of the structures, ablation from above and below are used to narrow a region of the structure (e.g. a tip region of the structure. As shown in FIG. 16A, such narrowing from the back side may occur by ablating away a backside bridging SACMAT in the narrowed region. An alternative process for producing the structure of 13B is shown in FIG. 16B wherein a capping layer is provided in addition to the sheet structural material and the bridging structural material and wherein an example of cutting order is shown by the circled numbers. In some implementations the region requiring vertical narrowing may be relatively small laterally compared to the length of the structure but it may be relatively wide laterally compared to a width of the structures so that a single opening or set of trimmed down top and bottom regions may provide tips regions for a plurality of probes formed side by side. Alternatively such narrowing may occur before mounting or depositing a bridging SACMAT to the back side of the sheet structural material. Such narrowing of the selected regions of the back side may occur before, after or simultaneously with the cutting from the front side.

Figure 17:
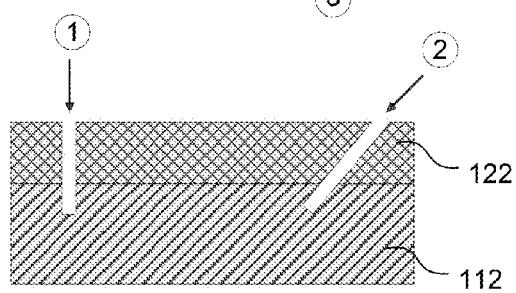
FIG. 17 provides a side cut view of a sheet STRMAT and a bridging SACMAT after laser cutting at two different angles whereby a proximal end of a structure is formed with a vertical end wall while a distal end has a sloped configuration such that a structure like that of FIG. 13C may be formed.

Structures similar to that of FIG. 13C may be formed in a variety of ways. All or most of the perimeter of the structure may be cut to a depth that penetrates into the bridging SACMAT using a beam with normal incidence from the top. The tapering of the tip region may be cut, from the top with an angled incidence and at a depth that provides for the desired tip angle. Such cuts are illustrated in FIG. 17 with a possible order of cutting shown by the circled numbers. Alternatively cutting of the tapering region may occur from the bottom.

Figure 18B:
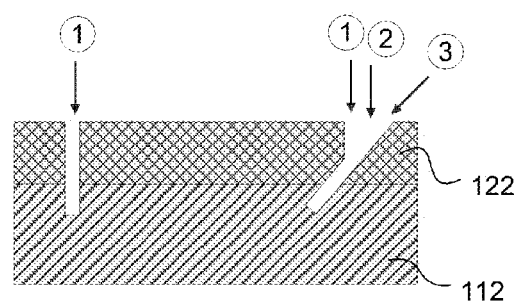
FIG. 18B provides a side cut view similar to that of FIG. 18A showing an additional laser cutting operation that may be used in forming a structure like that of FIG. 13D wherein a small region of material between the first and second distal end cuts of FIG. 18A is removed prior to performing the angled cut as seen in FIG. 18B.
Figure 18A:
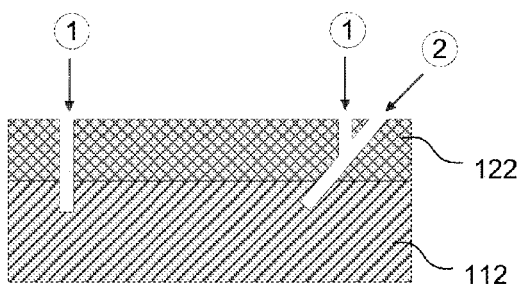
FIG. 18A provides a side cut view of a sheet STRMAT and a bridging SACMAT after laser cutting at two different angles whereby a proximal end of a structure is formed with a vertical end wall while a distal end has a vertical end wall near its upper surface and a sloped configuration near its lower surface such that a structure like that of FIG. 13D may be formed.

Structures similar to that of FIG. 13D may be formed in a variety of ways. Most of the perimeter of the structure may be cut to a depth that penetrates into the bridging SACMAT and if the perimeter includes the distal extreme of the tip region all of the perimeter may be cut using a beam with normal incidence from the top wherein the cutting depth would result in complete cutting through the sheet STRMAT but only part way into the bridging SACMAT. The tapering tip region may be cut from the top with an offset but angled incidence and at a depth that provides for the desired cutting depth. Such cuts are illustrated in FIG. 18A. In an alternative implementation, cutting along the angled path may occur before cutting along the vertical paths. However, in a most preferred implementation, to avoid a potentially small region located between the vertical and angled cuts from becoming displaced and possibly causing disruption of the cutting beam path and to avoid the cutting path unintentionally encountering a void region, ablation along the vertical paths can occur before ablation along the angled paths and ablation of the intermediate region can occur prior to cutting along the angled path as shown in FIG. 18B by the circled numbers showing the order of cutting.

Figure 19B:
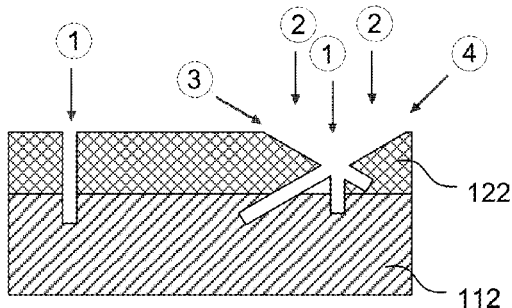
FIG. 19B has a similar relationship to FIG. 19A that FIG. 18B had to FIG. 18A wherein an ablation operation is used to remove the two small pieces of sheet material prior to performing either of the angled cuts 3 and 4 at the distal end of the structure.
Figure 19A:
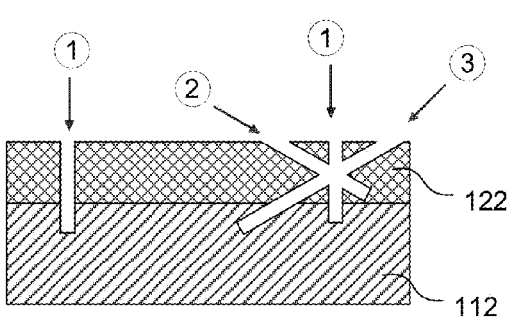
FIG. 19A provides a side cut view of a sheet STRMAT and a bridging SACMAT after laser cutting at three different angles whereby a proximal end of a structure is formed with a vertical end wall while a distal end has an upper facing angled surface and a downward facing angled surface such that a structure like that of FIG. 13E may be formed.

Structures similar to that of FIG. 13E may be formed in a variety of ways. Most of the perimeter of the structure may be cut to a depth that penetrates into the bridging SACMAT and if the perimeter includes the distal extreme of the tip region all of the perimeter may be cut using a beam with normal incidence from the top wherein the cutting depth would result in complete cutting through the sheet STRMAT but possibly only part way into the bridging SACMAT. The upward part of the tip region may be cut from above by a beam angled to the right while the lower half of the tip region may be cut from above by a beam angled to the left as can be seen in FIG. 19A wherein a possible order of cutting is shown by the circled numbers. Alternatively, the lower portion of the tip region may be cut from the bottom with a right facing beam directed through any bridging SACMAT and through the sheet STRMAT. In another alternative, the angled tip region may not be initially cut by a normally aligned beam. In still another alternative the cutting order may be changed. In even a further alternative, a small region between the angled cuts may be ablated before performing the angled cuts so that its displacement during cutting or variations in cutting depth do not provide unanticipated cutting or ablation of the intended structure as shown in FIG. 19B with the circled numbers showing the order of cutting.

Structures similar to that of FIGS. 13F-13G may be formed in a variety of ways. For example, a combination of the methods used for forming the structure of FIGS. 13B and 13E may be used.

Structures similar to that of FIGS. 13I and 13J may be formed in a variety of ways. Modifying extents of the structural regions of each sheet (as necessary) may occur by laser cutting or ablation of the openings in one sheet in regions where the other sheet has extended dimensions (where the extension will occur) before bonding the two sheets together followed by the cutting out of the perimeter from both sheets after bonding. Alternatively, cutting of the perimeter and trimming down may both occur after bonding using varied laser cutting or ablation parameters wherein the ablation of the lower sheet material in the tip region can occur using a beam that is incident from below while ablation of the upper sheet (as is necessary in the structure of FIG. 13J) can occur from above.

Structures similar to FIG. 13K can be formed using slightly modified versions of the methods noted for FIGS. 13I and 13J. For example openings may be formed in one or both the top and bottom sheet prior to bonding in regions where the tip will be located. After bonding, perimeter cutting and any additional laser trimming may be performed. Alternatively complete formation may occur after bonding by performing necessary perimeter cutting and ablations of both top and bottom sheets to form appropriate structural steps.

Structures similar to that of FIG. 13L may be formed in a variety of ways. Such structures may be formed using a method similar to that noted above with regard to FIG. 13E wherein after formation, tips or entire structures may be coated with a treatment material (e.g. carbon black) and then the tip regions or entire structures subject to heating at a sufficient level and in an appropriate atmosphere to allow creation of a shell of modified material (e.g. tungsten carbide) on the surface of the structure or on selected potions of the surface. Alternatively, tips regions may be trimmed down to form pockets on one or both sides, a treatment material may be applied to the pocket regions in the sheet with treatment material made to undergo modification processing. After the modification is complete, any additional laser processing may be completed. In some treatment steps, in this embodiment and in other embodiments set forth herein heating may be performed in a variety of manners including via oven heating, induction heating, laser beam heating, or the like. Some treatments may not involve a treatment material but simply a heating and/or cooling process potentially in a controlled atmosphere.

FIGS. 14A-15K illustrate structures formed from a combination of a sheet material and a deposited structural material and perhaps a deposited sacrificial material that may be different from any bridging sacrificial material that is used. Such structures may be formed by a variety of methods which may involve some elements of the first method embodiment, some elements of the methods discussed above in association with the formation of the structures of FIGS. 13A-13L, and the steps discussed above with regard to FIG. 1C. Some methods may involves variations in the order of combining one or more sheets of sheet STRMAT, one or more regions of deposited single material or multi-material layers, or one or more layers of bridging SACMAT. Some embodiments may vary when laser machining will be performed relative to the stacking of sheets, layers, regions or bridging SACMAT. Some embodiments may vary how structural material regions are defined, e.g. only by laser cutting and area ablation, by a combination of laser cutting and area ablation along with selective placement of structural materials. Some embodiments, like those of FIGS. 14J-14P may involve depositions of conformal coatings that coat top and bottom surfaces or shaped tip regions and which may also involve formation of through holes into which such coating may be deposited.

Figure 20A:
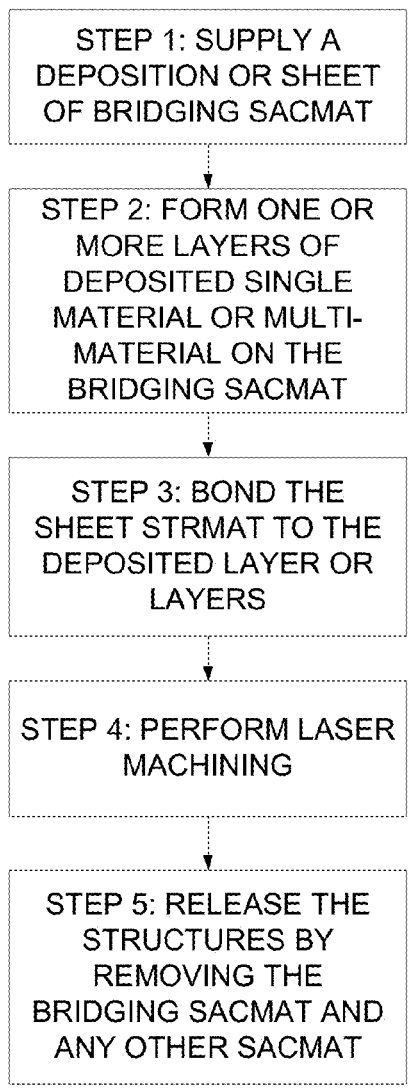
FIGS. 20A and 20B respectively provide a block diagram of major process steps and corresponding side cut views of various states of a process of forming an example structure according another method embodiment of the invention wherein a plurality of structures are formed from a sheet of structural material and a single region formed of one or more layers with each layer formed from a single material or formed from multiple materials wherein the process forms the single or multi-material region on a bridging SACMAT which in turn may be on a substrate (not shown) and after which bonding of the single or multi-material region to a sheet STRMAT occurs.
Figure 20B:
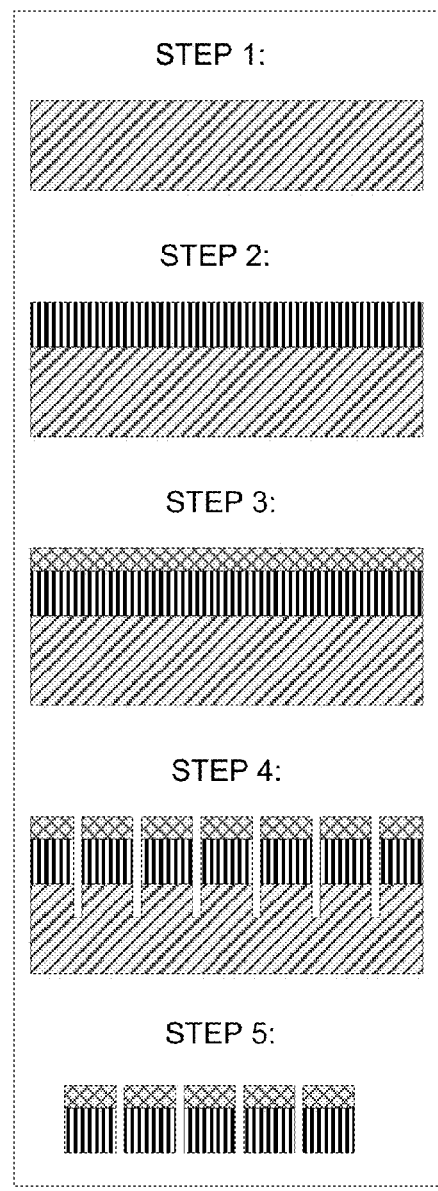

FIGS. 20A and 20B respectively provide a block diagram of major process steps and corresponding side cut views of various states of a process, as applied to the creation of an example structure, according another method embodiment of the invention wherein a plurality of structures are formed from a sheet of structural material and a single region formed of one or more layers with each layer formed from a single material or formed from multiple materials wherein the process forms the single or multi-material region on a bridging SACMAT which in turn may be on a substrate (not shown) and after which bonding of the single or multi-material region to a sheet STRMAT occurs.

Figures 21A, 21B:
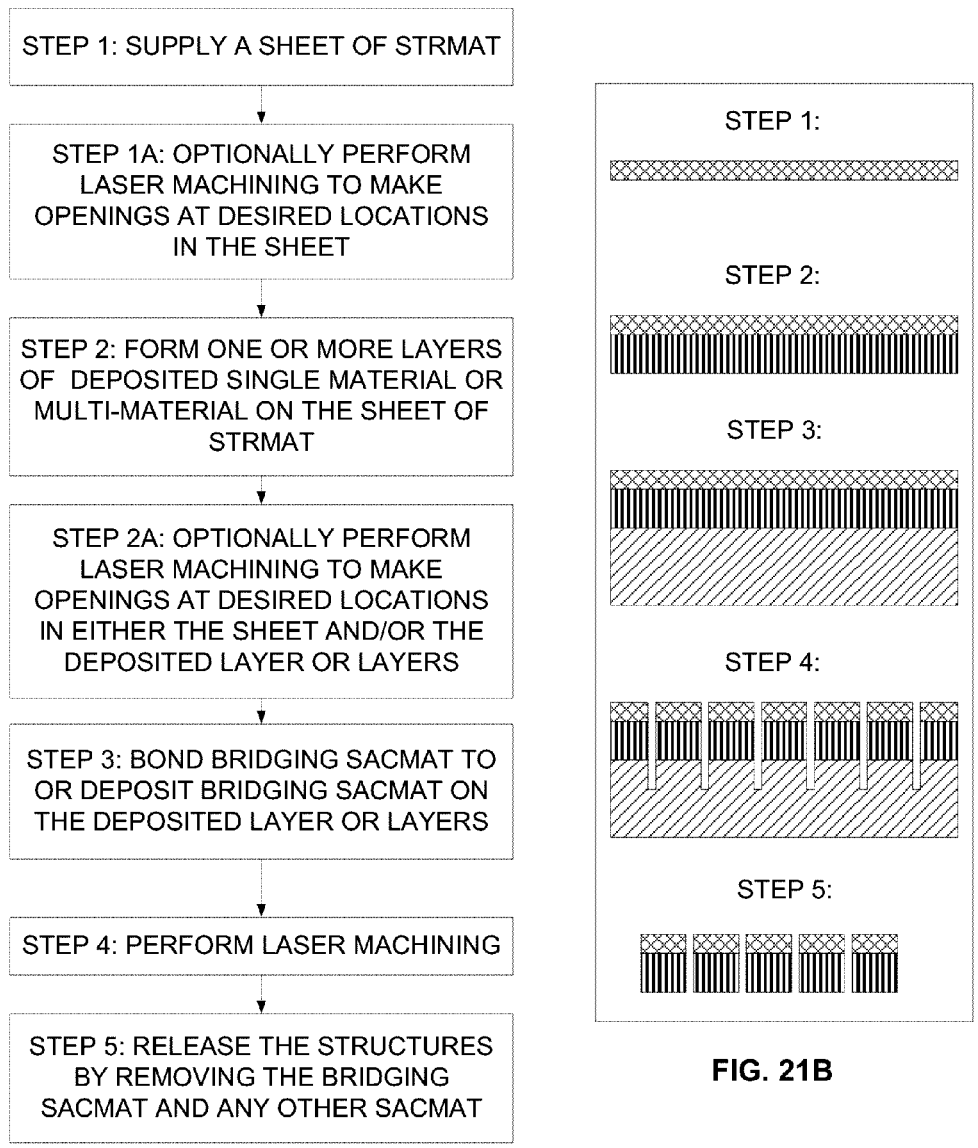
FIGS. 21A and 21B respectively provide a block diagram of major process steps and corresponding side cut views of various states of a process of forming an example structure according another method embodiment of the invention wherein a plurality of structures are formed from a sheet of structural material and a single region formed of one or more layers with each layer formed from a single material or formed from multiple materials wherein the process forms the single or multi-material region on a sheet STRMAT (with or without first providing an adhesion layer and/or a seed layer) and then the process attaches the single material region or the multi-material region to a bridging SACMAT or deposits the bridging SACMAT on to such a region.

FIGS. 21A and 21B respectively provide a block diagram of major process steps and corresponding side cut views of various states of a process, as applied to the creation of an example structure, according another method embodiment of the invention wherein a plurality of structures are formed from a sheet of structural material and a single region formed of one or more layers with each layer formed from a single material or formed from multiple materials wherein the process forms the single or multi-material region on a sheet STRMAT (with or without first providing an adhesion layer and/or a seed layer) and then the process attaches the single material region or the multi-material region to a bridging SACMAT or deposits the bridging SACMAT on to such a region.

Figure 22A:
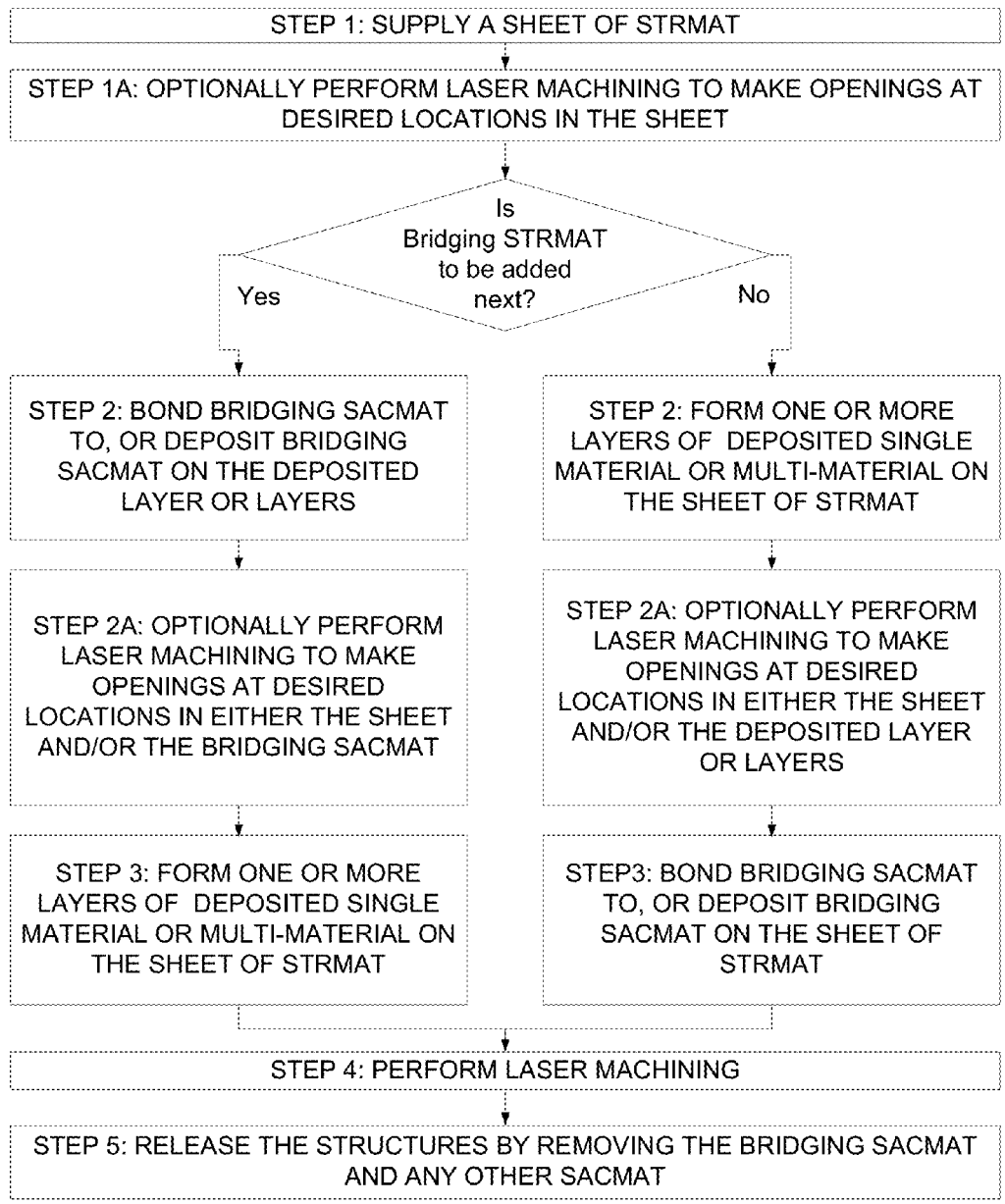
FIGS. 22A and 22B respectively provide a block diagram of major process steps and corresponding side cut views of various states of an additional two processes of forming an example structure according alternative method embodiments of the invention wherein a plurality of structures are formed from a sheet of structural material and a single region formed of one or more layers with each layer formed from a single material or formed from multiple materials wherein the process provides a sheet of SRTMAT on to which either bridging SACMAT is deposited or bonded or on to which a single material or multi-material region is deposited or bonded after which the other of the bridging SACMAT or the single material or multi-material regions is deposited or bonded to the other side of the sheet STRMAT.
Figure 22B:
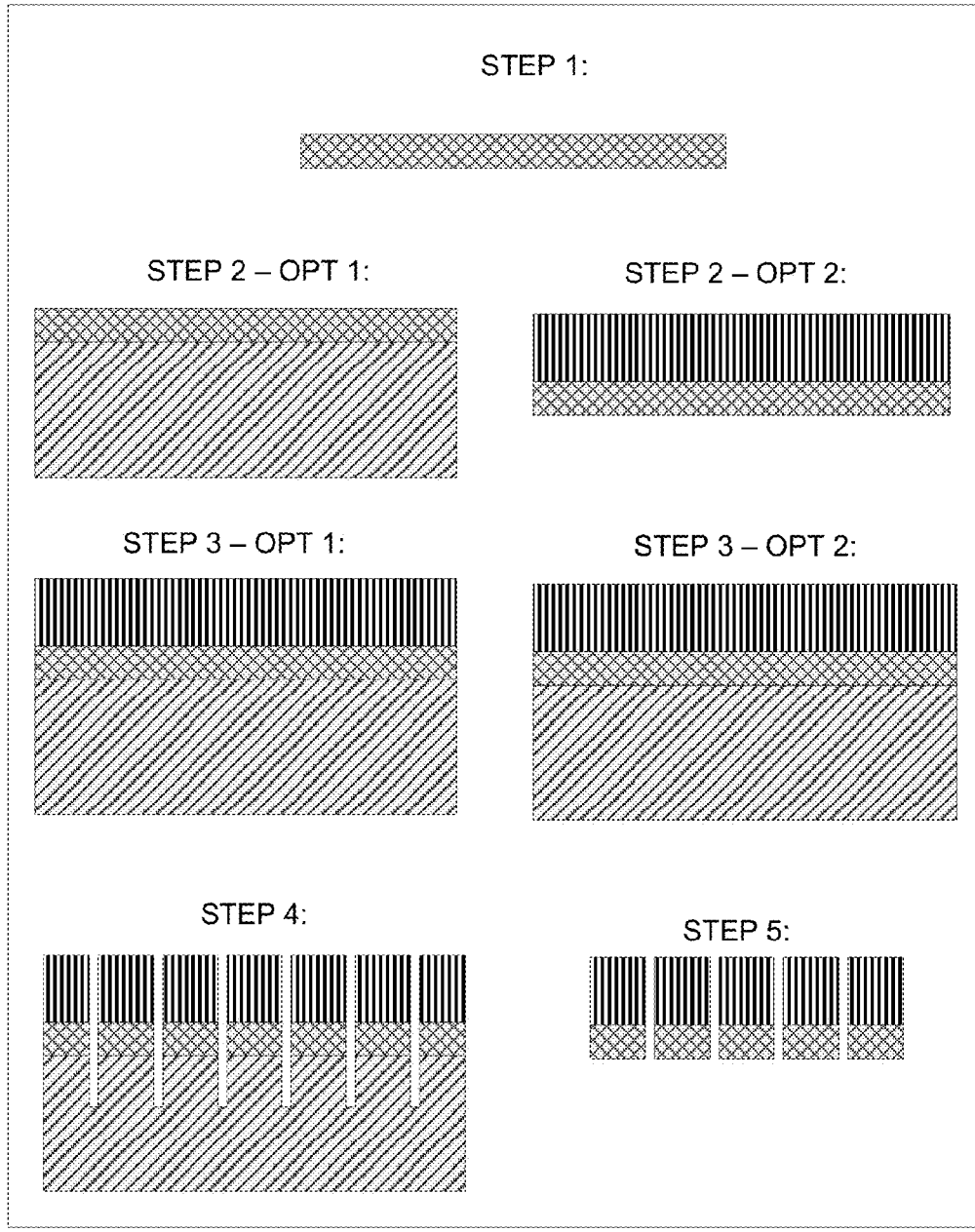

FIGS. 22A and 22B respectively provide a block diagram of major process steps and corresponding side cut views of various states of a further two processes of forming an example structure according another method embodiment of the invention wherein a plurality of structures are formed from a sheet of structural material and a single region formed of one or more layers with each layer formed from a single material or formed from multiple materials wherein the process provides a sheet of SRTMAT on to which either bridging SACMAT is deposited or bonded or on to which a single material or multi-material region is deposited or bonded after which the other of the bridging SACMAT or the single material or multi-material regions is deposited or bonded to the other side of the sheet STRMAT.

Numerous further alternatives to the embodiments of FIGS. 20A-22B exist. For example, like in FIGS. 16-19B angled cutting, bottom and top cutting, and trimming may be used to provide more complex structures such as those shown in FIGS. 14A, 14B, 14E-14G, and 15A. In still further variations, additional single material regions or multi-material regions may be bonded or formed on the sheet STRMAT or one or more additional sheets of STRMAT may be bonded to existing sheets of STRMAT or to existing single material or multi-material deposited layers such that the structural embodiments of FIGS. 14D, 14H, 14K, and 15B-15K could be formed. In some embodiments, depending on the XY configuration of the structures, the XY configuration of individual sheets or deposited materials, the order of laser cutting and sheet/layer adhesion or build up, laser cutting may be used to define all geometric features of a structure or some geometric features may be defined by the patterned configurations of structural materials deposited on multi-material layers.

Figure 23A:
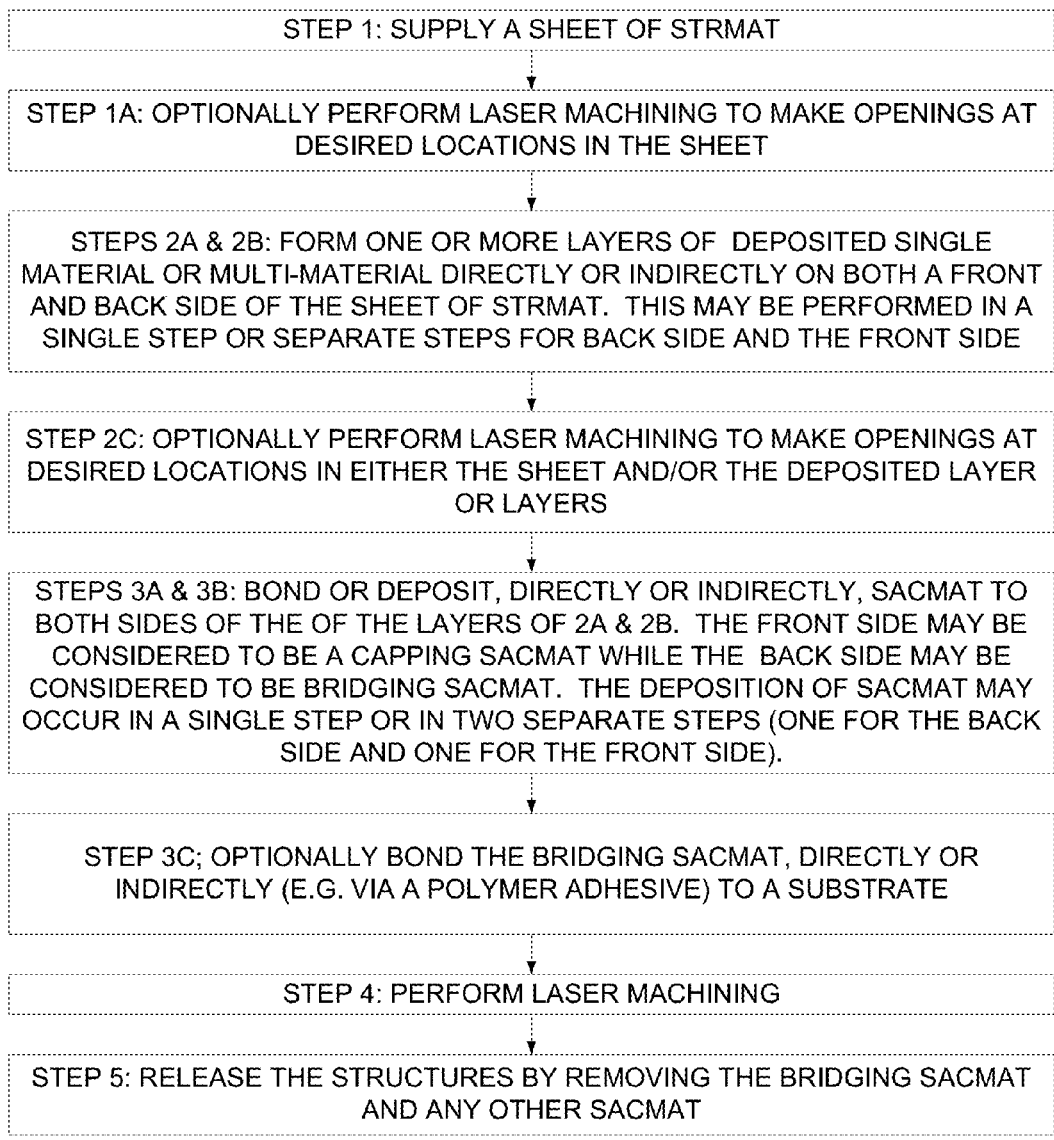
FIGS. 23A and 23B respectively provide a block diagram of major process steps and corresponding side cut views of various states of the process in forming an example structure according another method embodiment of the invention wherein a plurality of structures are formed from a sheet of structural material and two regions of multi-material layers or single material layers.
Figure 23B:
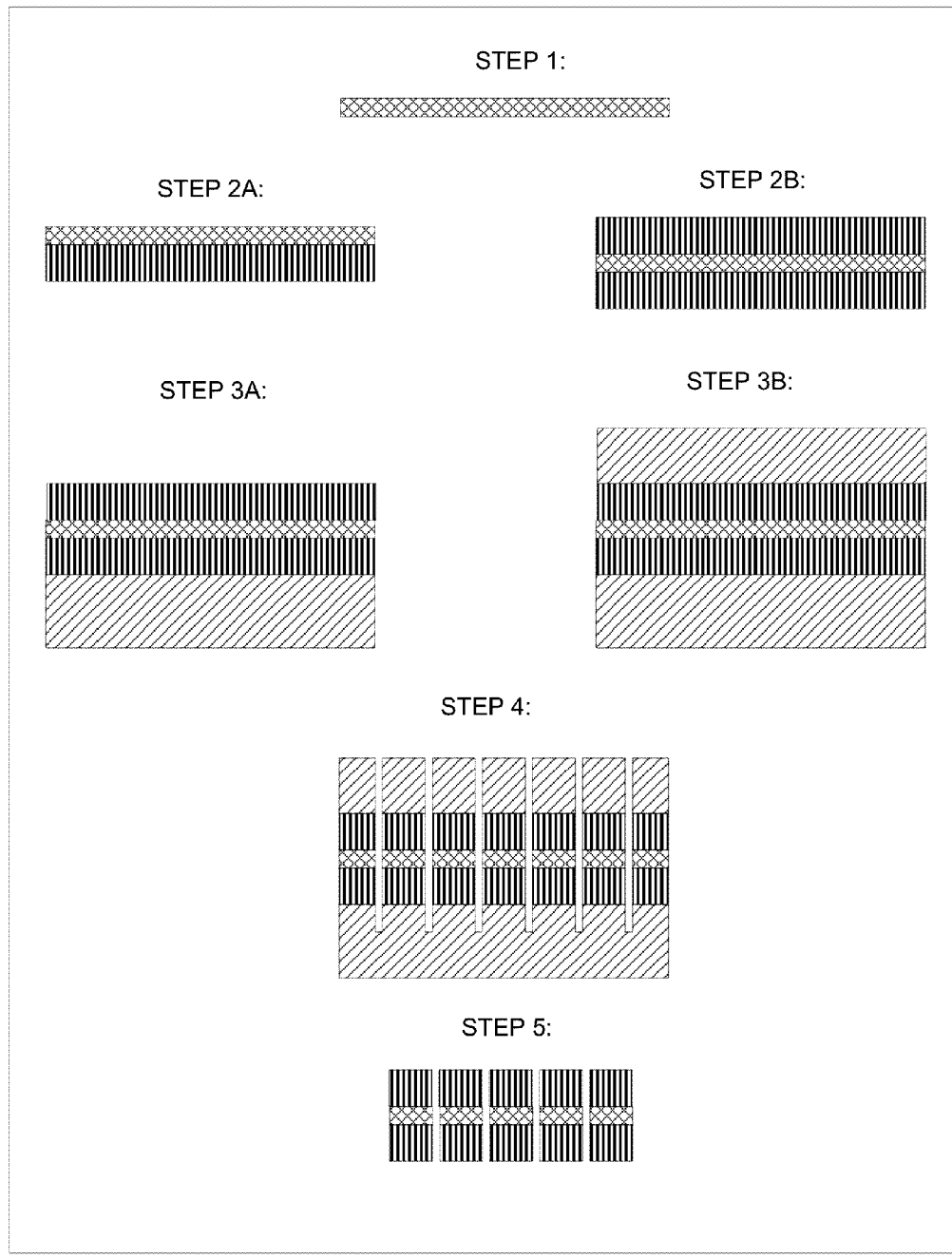

FIGS. 23A and 23B respectively provide a block diagram of major process steps and corresponding side cut views of various states of a process applied to the creation of an example structure according to another method embodiment of the invention wherein a plurality of structures are formed from a sheet of structural material and from two regions with one on either side of the sheet and with each formed of one or more layers and with each layer formed from a single material or formed from multiple materials. The regions on either side of the sheet may be formed with or without a first providing an adhesion layer and/or a seed layer on the sheet material depending on the materials involved and the deposition methods to be used. After creating the regions on the sheet material, the process then forms on or attaches bridging SACMAT and CAPPING SACMAT to the regions. After this laser cutting can occur. In some variations of this process, both the single material or multi-material regions and the sacrificial material on one side of the sheet may be formed before forming the equivalent elements on the other side of the sheet.

Figure 24A:
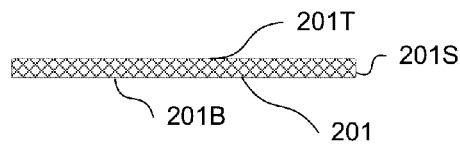
FIGS. 24A-24P illustrate the results of various process steps and optional process steps that are or may be used in forming a part according to some alternative embodiments of the invention.

Brief descriptions of methods for forming structures having the features of FIGS. 14J-14P were set forth above. The following process, as illustrated with the aid of FIGS. 24A-24P, provides a more detailed description of the steps of another embodiment that can be used to form structures like those of FIGS. 14J-14P as well other structures. In other words the process of the next embodiment of the invention provides for forming structures from a sheet material with at least one coating of material on each side and around the tip (e.g. the coating material may be, for example, a conductivity enhancer, a bonding material, or a tip material, or all of these). In some variations, the process may provide for one or more coating materials around not only a distal tip region but also a proximal base or secondary tip region.

Step 1 of the process (as illustrated in 24A) includes supplying at least one foil or sheet material 201 (e.g. tungsten, molybdenum, platinum, palladium, or the like) that may or may not be held by a frame. If multiple sheets are supplied they may be bonded together or pressed together for later bonding. They may be separated by one or more intermediate materials (e.g. bonding materials). The sheets or sheets as a whole have a top surface 201T and bottom surface 201B as well as side surfaces 201S.

Figure 24B:
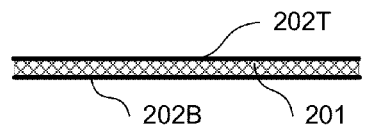

Step 2 of the process (as illustrated in FIG. 24B) includes optionally sputtering an adhesion promoter 202T and 202B (e.g. copper, tin, iron, gold, silver) on both faces (e.g. top and bottom) to a thickness of, e.g., 100-800 nm. This may be done one face at a time or both faces simultaneously.

Figure 24C:
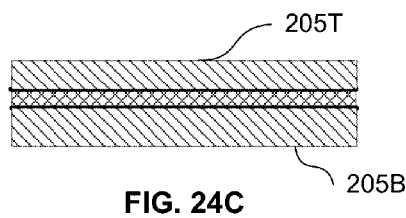

Step 3 of the process (as illustrated in FIG. 24C) includes plating a sacrificial protective coating 205B and 205T over both sides of the foil material (e.g. copper, tin, or iron, via electroplating) to a thickness of, e.g., 5-50 microns on both sides. This may be done one face at a time, both faces simultaneously, or both faces in part simultaneously with extra deposition going onto one face. The deposition thickness may be the same for both faces or the deposition for one face may be different than that of the other (e.g. the back side 201B may be supplied with thicker coating 205B). The thicknesses may for example in the range of 5-50 ums, and more preferably in the range of 10-30 ums. The sacrificial material on one side may function as a bridging material while that on the other side may function as a capping material. In embodiments where cutting may occur from both sides, each sacrificial material may play dual roles.

Figure 24D:
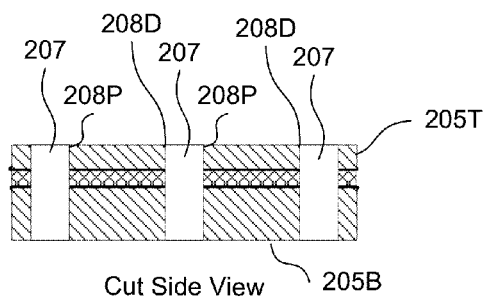
Figure 24D:
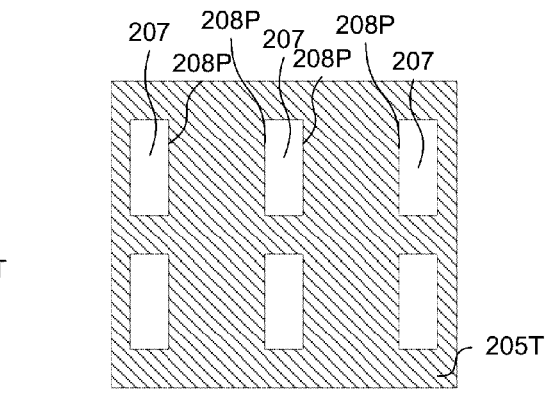

Step 4 of the process includes cutting completely through the foil, to form holes 207, in regions where one or more deposited materials are intended to cap not only the faces of the sheets but completely around distal and/or proximal ends of the structure. These regions may define distal regions (e.g. tip regions) or proximal regions (e.g. bonding regions) for example. Such holes are illustrated in the cut side view and top view of FIG. 24D. Holes 207 are shown having edges where parts of structures will be formed. Locations 208D represent edges of holes that will define distal regions of structures that will be formed of sheet material while 208P define proximal regions of structures the will be formed of the sheet material. In some structures only one such region may exist while in others two or more such regions may exist. These holes may be considered through holes as they go completely through the existing structural material though they may or may not extend completed through the bottom sacrificial material. Such holes may be made individually for each probe but to increase the number of probes that may be formed simultaneously (i.e. to improve packing density of the probes during formation) it may be desirable to form openings that can accommodate a plurality of probes. For example, each opening may define the end location of the foil material for 2-100 probes located side-by-side. In some implementations some holes, as in the present example, may define the proximal end of one or more structures and the distal end of one or more other structures. The through-hole length may be dictated in part by the configuration and layout of the probes it may also be dictated by the requirement that the foil retain structural integrity and dimensionality through the fabrication process. In some cases the through holes may simply be rectangular slots which result in probes having flat tip ends that are either perpendicular to their probe bodies or are otherwise angled relative to their probe bodies depending on the eventual orientation of probe bodies relative to the through holes. In other embodiments, probe tips may take on curved configurations, center pointed configurations, multi-point configurations or the like depending on the shape of the through holes and the alignment/orientation of the holes relative to the probes bodies that will be laser cut in a subsequent step. The cutting to form through holes may be by scanned laser cutting, by a physical cutting bit (particularly if the through holes represent rectangular openings), by water jet, by EDM, or the like. In some embodiments, cutting of such holes may be accompanied by the formation of fiducially marks or alignment marks for us in subsequent operations that require aligned positions relative to earlier operations.

Figure 24E:
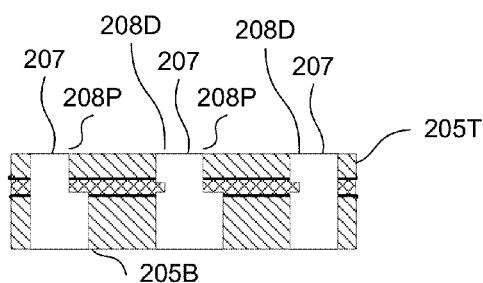

Step 5 of the process includes, after, or prior to, the cutting of the through holes, optionally laser trimming adjacent to the through hole locations from one or both sides of the sheet to provide thinned regions of foil which can be used to define narrowed or thinned structural features such as probe tips, narrowed mounting locations, narrowed mounting location stop ledges. This option is illustrated in the side view of FIG. 24E where distal regions are shown with two sided (i.e. top and bottom narrowing) while proximal regions are shown with one sided narrowing (i.e. bottom only in this example).

Figure 24F:
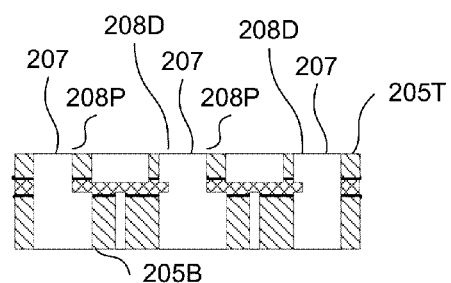

Step 6 of the process is optional and may be done in addition to or instead of step 5. It provides for optional laser trimming to form other narrowed regions in the foil which may form recesses in the probe bodies that may eventually receive subsequently deposited materials or remain deposit free. These recesses may form groves in probe bodies that can be used, for example, to modify the stiffness of the probe bodies or act as anchor locations for other materials to be subsequently deposited. This is illustrate in the side view of FIG. 24F wherein an intermediate region (i.e. between the proximal and distal ends is shown with an elongated narrowing on the top and a puncture or drill like narrowing on the bottom.

Figure 24G:
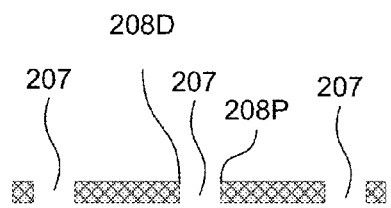

Step 7 of the process calls for the etching away of the top and bottom sacrificial materials from the foil or sheet and possibly the adhesion material or other coating materials as well. FIG. 24G illustrates the result of this step as applied to the example of FIG. 24D (i.e. as if the operations of FIGS. 24E and 24F didn't happen).

Figure 24H:

Step 8 of the process, after a possible cleaning and possible activation of the foil material, calls for a sputtering of a first adhesion material onto the surface of both sides of the foil and into the through-hole regions. This sputtering may provide a coating thickness, for example, in the range of 200 nm (nanometers) to 1 um (micron or micrometer). This coating material may for example be copper, gold, nickel-cobalt, or some other material that may act as a plating base for deposition of additional material. The result of this step is illustrated in FIG. 24H wherein material 201 is coated with material 212.

Figure 24I:
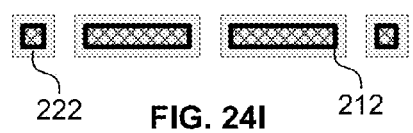

Step 9 of the process calls for depositing a first coating of material, e.g. by electrodeposition, over both surfaces of the foil and into the through hole region. This deposition may occur directly on the sputtered material or it may occur on a material that was deposited by a strike. This material may for example be a high conductivity material such as silver, gold or even copper depending on the sacrificial material that will be used in a subsequent step. As another example this coating material may be a contact or tip material such as rhodium or rhenium. This coating may be deposited to any appropriate thickness, e.g. from 1 um to 20 um or more. For example gold may be plated in the 3-8 ums range to provide a good conductivity enhancement over a foil of tungsten while rhodium may be deposited to a thickness of 2-6 ums to provide a good contact surface. The result of this step is shown in the cut side view of FIG. 24I with the first coating material 222 (i.e. the material of this step) being shown along with the adhesion promoter 212.

Figure 24J:
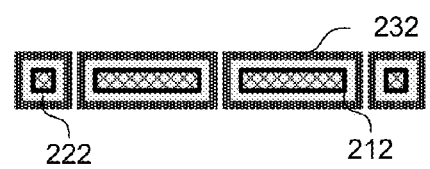

Step 10 of the process optionally calls for depositing a second coating of a different material onto the first coating on both sides of the foil and into the through-hole region. For example if the first coating was of a material to promote conductivity the second material may be a contact tip material. Alternatively, if the first coating were of a contact material, the second coating could be of a conductivity enhancer or material that promotes solderability or bonding in some other manner. In some circumstances it may be appropriate for the second material to not be the contact material and the contact material to be hidden thereunder particularly if the second coating material will wear off quickly under one or more preliminary contacts leaving behind a material that provides good physical/electrical contact in combination with good wear resistance. The thickness of this second coating can also be of any appropriate amount, e.g. from 1 um to 20 um or more. The result of this step is shown in the cut side view of FIG. 24J with the second coating material 232 being shown along with the first coating material 222 (i.e. the material of this step) and the adhesion promoter 212.

Step 11 of the process optionally calls for the depositing of any additional materials may be made.

Figure 24K:
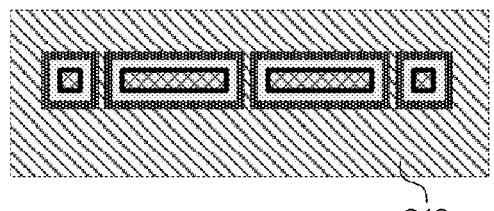

Step 12 of the process calls for depositing a sacrificial material (e.g. tin, iron, or copper) on both sides of the foil and into the through-hole region. Deposition may or may not occur on along the sidewall perimeter of the foil or sheet. This sacrificial material may act as a capping or splatter barrier on the front side of the foil and a bridging and/heat sink material on the backside of the foil. If cutting is to occur from both sides of the coated foil, both sides may provide a capping or splatter barrier as well as in some regions of the build a bridging material. If laser cutting is to occur from both sides, in some implementations the backside sacrificial material may act as an initial bridging material while the front side is cut, then a front side deposit of additional sacrificial material may occur so it can act as a bridging material while back side cutting occurs. This result of this depositing of material 242 is shown in FIG. 24K.

Figure 24L:
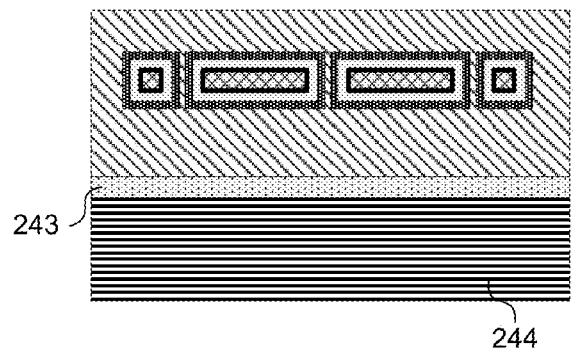
Figure 24M:
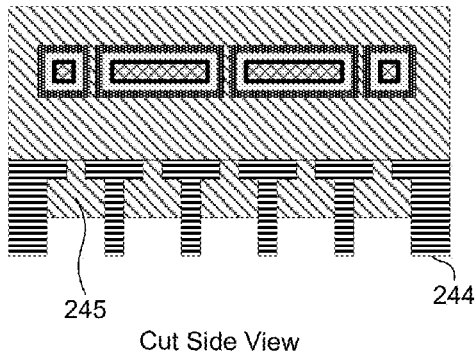
Figure 24N:
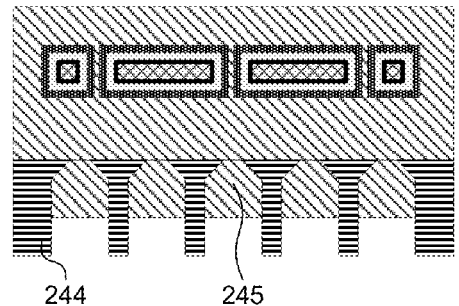

Step 13 of the process calls for the optional mounting of the backside of the coated foil to a substrate 244 which may occur for example via an adhesive 243, e.g. a polymer adhesive, prior to performing front side laser cutting. In an alternative implementation mounting to a porous substrate or substrate with slots or other openings may occur via electroplating sacrificial material 245 while the coated foil and substrate are pressed together. This first example is illustrated in FIG. 24L while the second is illustrated in FIGS. 24M and 24N using substrates 244 with different shaped hole patterns. The substrate of FIG. 24M has vertical holes with narrowed top openings while the substrate of FIG. 24N has holes with tapered slots or conical holes at their upper most extents.

Figure 24O:
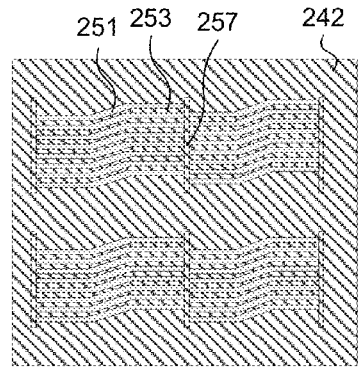
Figure 24P:
Figure 24P:
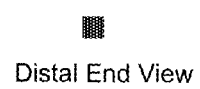
Figure 24P:
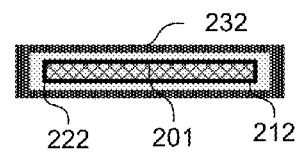

Step 14 of the process calls for performing front side laser cutting whereby the structural materials are completely cut through (including cutting through the front side deposited structural material or materials, the sheet material, and the backside deposited structural material or materials without cutting completely through the backside sacrificial material. The laser may or may not cut along the distal end of the tip region where the through-hole was located or proximal end region if a through-hole was located there as such regions are only bounded by sacrificial material which will be removed later in the process anyway. So if the boundary defined by the sacrificial material is acceptable tip regions need not be laser cut; however, if such sacrificial material boundaries are not considered acceptable then laser cutting of distal or proximal regions can occur. This cutting is illustrated in the top view of FIG. 24O where 242 represents the deposited sacrificial material, 257 represents locations where those portions of holes 207 were not filled in by deposits of structural material but instead were filled in only by the sacrificial material and thus do not necessarily require laser cutting to separate the parts, 251 represents laser cutting paths and 253 represents the lateral locations of parts (e.g. probes).

Step 15 calls for the optional mounting of the cut, coated foil to a front side substrate and releasing the cut, coated foil from the back side substrate. This mounting may be achieved in much the same manner as noted above for step 13. Precautions may be taken to ensure that release of the original substrate does result in excess removal of back side sacrificial material; however, if excess back side removal does occur, deposit of additional sacrificial material to the back side can occur. Such additional deposition, as with other deposition noted herein may be followed by optional planarization to smooth the surface, set a desired orientation for the surface, and/or set a net or known thickness for the deposit.

Step 16 optionally calls for the cutting of the structure boundaries from the back side either to complete the process of cutting through the sides of the structures or to clean up the cuts made from the other side (e.g. to improve wall to face perpendicularity, i.e. to remove sloped side walls or to improve top to bottom and bottom to top symmetry. As noted previously herein, appropriate alignment steps may be taken to ensure adequate registration of laser cutting regions.

Step 17 calls for the optional release of the cut, coated foil from the front side substrate. This may occur by melting or dissolving of a polymer bonding material, etching of a metal sacrificial material like that filling the openings of FIGS. 24M and 24N.

Step 18 calls for the optional performing of a good part/bad part disambiguation process. This, for example, may take the form of the one of the processes described in U.S. patent application Ser. No. 14/043,670, filed Oct. 1, 2013, entitled a "Multi-Layer, Multi-Material Micro-Scale and Millimeter-Scale Batch Part Fabrication Methods Including Disambiguation of Good Parts and Defective Parts" by Duy Le, et al. which is incorporated herein by reference.

Step 19 calls for the releasing of the plurality of formed probes from the sacrificial material. This may involve releasing all probes simultaneously, or releasing good or non-failed probes separately from bad or failed probes. FIG. 24P shows a top view, a side view, and an end view of an example structure formed by the layer stacking and cutting of this embodiment.

Numerous additional variations of this process exist. One set of variations includes planarizing one or more of the materials after deposition to either set a desired level of planarity and/or to set a desired net deposition thickness. Such planarization may be particularly useful if multi-material layers are to be formed.

Another set of variations involves performing one of more of the depositions as selective depositions or at least as effective selective depositions (after planarization) as opposed to as blanket depositions. This may allow, for example, tip material to only be located in proximity to a tip as opposed to be located along the entire length of the probe or bonding material to only be located in a bonding region as opposed to along the entire length of the probe. In these variations it is possible to provide some form of masking prior to performing one or more depositions to allow selective depositions to occur. This masking may be in the form of depositing or applying liquid or dry film photoresist, exposing the photoresist, and then developing the photoresist; depositing or applying a dielectric and then direct writing patterns into the dielectric using a laser beam; use of masking, dicing, or other adhesive tape; or direct and selective deposition of a dielectric material via inkjet, computer controlled extruder, or the like. If a hard to adhere material, e.g. Rhodium, is to be plated, one might selectively deposit a thin adhesion promotion layer (e.g. copper) then blanket deposit rhodium into voids and then planarize the resulting depositions.

Some implementations may involve use of strike depositions (e.g. acid based strikes) after sputtering but before electroplating to provide enhanced activation of the surface.

Some implementations may involve the use of cleaning solutions and processes after laser cutting to ensure removal of debris. Some such cleaning solutions may involve use of an acid based copper cleaning solution that includes surfactants to loosen debris. Some such cleaning processes may involve the use of ultrasonic vibrations to aid in debris removal.

Some implementations may involve use of acid based etchants including oxidizing agents (e.g. nitrate, peroxide, perosulfates, and the like (e.g. when the sacrificial material includes copper and an exposed structural material includes tungsten).

Some implementations may perform laser cutting from both sides and thus may benefit from the formation of a number of bore holes that extend completely through the sheet material and deposited material. Such holes may be used as positioning, orientation, and scaling marks for predictive laser beam positioning when switching laser cutting from one side to the other side. Such implementation may use image recognition, targeting, and/or position weighting algorithms to provide high resolution determination of relative hole locations so that final laser cutting parameters may be derived from a combination of drawing pattern data that is scaled, translated, and or rotated based on front side to back side hole location determinations. In some variations the holes need not be circular but instead may take on any other useful geometric form such as L shapes, cross-shapes, and the like. In some variations the bore holes may be associated with boundary regions of specific structures (e.g. probes) or they may be independent features but with a known geometric relationship to the part locations.

In some implementations, structures may be held in place by a bridging sacrificial material until that bridging sacrificial material is completely cut through or until the bridging sacrificial material is etched away. In some embodiments, even after removal of the sacrificial bridging material, probes may still be held in their relative positions by structural material tethering elements made of the sheet material, structural material tethering elements made of a deposited material, sacrificial material tethering elements made from a second sacrificial material that is not etched by the etchant that removed the bridging sacrificial material, or by the remaining sacrificial material underlaying the parts being bonded to a working subtract that has not been cut through. Tethers may be useful for allowing post laser cutting processes to occur to make enhanced probes, e.g. to allow blanket or selective deposition of one or more additional structural materials on one or both sides of a probe or on selected edge locations. If structural material tethers are used, they will need to be cut away (e.g. via laser cutting or mechanical cutting) to release the structures but if a second sacrificial material is used as a tethering element, release of the structures may occur by etching with a second etchant which may reduce fabrication time and/or improve yield, shipment of defective parts, as it removes the need for alignment correlations and risk of probe damage occurring by a misdirected cutting tool.

In some variations of the process, steps 4-6 may follow one or more depositions of steps 8-11 as opposed to preceding these steps after which at least one additional deposition could occur. Such a process variation could result in some material not coating through-holes but only the faces while another material coats not only the faces but the through holes as well. In still other variations, masking may be applied to one or both of the surfaces prior to making some deposits so that those deposits don't coat the entire surfaces but only portions of them. This, for example, could result in tip material being constrained to tip regions, bonding material being constrained to bonding regions, or to cause a selected material to be deposited not only to both faces but also in some wrap around regions

FURTHER COMMENTS AND CONCLUSIONS

While various specific embodiments and some variations have been set forth above, numerous other variations are possible. Some such variations may involve the addition of some steps or operations from one embodiment into another embodiment or the replacement of steps in one embodiment by steps from a different embodiment. In some embodiment variations and implementations structural materials may be electrodepositable materials such as nickel, nickel-cobalt, nickel manganese, silver, rhodium, copper, tin, and palladium while in other embodiments other metals, semiconductor materials, or dielectrics may be used which may or may not be electrodepositable. In some embodiments sacrificial material may include one or more of metals, such as copper or tin, iron, or various dielectrics. In some embodiments, material deposition may occur by one or more of electroplating, electroless plating, physical vapor deposition, chemical vapor deposition, spreading, spraying, ink jetting, extruding, fling coating, and the like. In some embodiments additional steps may be used to provide enhanced or improved part formation such as for example, cleaning steps, surface activation steps, alloying steps, diffusion bonding steps, heat treating steps, process tracking steps, temperature, or atmosphere control steps, alignment or fiducially marking steps, and the like. In some embodiments, especially those involving dielectrics, hard to plate on metals or groups of build materials with incompatibility issues, individual multi-material layers may be formed on barrier layers, adhesion layers and/or seed layers or layer portions. In some embodiments, different layers may have different thickness, more than two structural materials may be deposited on any given layer or on different layers and/or more than one sacrificial material may be used on any given layer or on different layers. In some embodiments, tracking of failed parts may occur manually, or automatically (e.g. by computer/program controlled inspection/test hardware, optics, and/or analysis or comparison methods). For example, parts on a wafer may be examined under a manual or automatic control of a computer programming based on an encoder (X and Y) tracked microscope reticle and when bad parts are identified, a position readout may be read and manually logged or alternatively, a button may be pressed or other command may be issued that causes the current microscope X & Y position to be automatically recorded as part of a list of bad structures or part positions.

In some embodiments, the processes set forth herein may be implemented via multiple independent machines (some or all of which may be manually operated or some or all of which may be computer controlled by programs operating on user supplied data and/or information generated by other system components). In some implementations a single multifunction computer controlled apparatus may be used.

The patent applications and patents set forth below are hereby incorporated by reference herein as if set forth in full. The teachings in these incorporated applications can be combined with the teachings of the instant application in many ways: For example, enhanced methods of producing structures may be derived from combinations of teachings, enhanced structures may be obtainable, enhanced apparatus may be derived, and the like.

| U.S. patent application No., Filing Date U.S. application Pub No., Pub Date U.S. Pat. No., Pub Date | Inventor, Title |
|---|---|
| 09/493,496-Jan. 28, 2000 — 6,790,377-Sep. 14, 2004 | Cohen, "Method For Electrochemical Fabrication" |
| 10/271,574-Oct. 15, 2002 2003-0127336-Jul. 10, 2003 Pat. 7,288,178-Oct. 30, 2007 | Cohen, "Methods of and Apparatus for Making High Aspect Ratio Microelectromechanical Structures" |
| 10/387,958-Mar. 13, 2003 2003-022168-Dec. 4, 2003 — | Cohen, "Electrochemical Fabrication Method and Application for Producing Three-Dimensional Structures Having Improved Surface Finish" |
| 10/434,103-May 7, 2004 2004-0020782-Feb. 5, 2004 7,160,429-Jan. 9, 2007 | Cohen, "Electrochemically Fabricated Hermetically Sealed Microstructures and Methods of and Apparatus for Producing Such |

| U.S. patent application No., Filing Date U.S. application Pub No., Pub Date U.S. Pat. No., Pub Date | Inventor, Title |
|---|---|
| | Structures" |
| 10/434,294-May 7, 2003 2004-0065550-Apr. 8, 2004 — | Zhang, "Electrochemical Fabrication Methods With Enhanced Post Deposition Processing" |
| 10/434,295-May 7, 2003 2004-0004001-Jan. 8, 2004 — | Cohen, "Method of and Apparatus for Forming Three-Dimensional Structures Integral With Semiconductor Based Circuitry" |
| 10/607,931-Jun. 27, 2003 2004-0140862-Jul. 22, 2004 7,239,219-Jul. 3, 2007 | Brown, "Miniature RF and Microwave Components and Methods for Fabricating Such Components" |
| 10/697,597-Dec. 20, 2002 2004-0146650-Jul. 29, 2004 — | Lockard, "EFAB Methods and Apparatus Including Spray Metal or Powder Coating Processes" |
| 10/830,262-Apr. 21, 2004 2004-0251142-Dec. 16, 2004 7,198,704-Apr. 3, 2007 | Cohen, "Methods of Reducing Interlayer Discontinuities in Electrochemically Fabricated Three-Dimensional Structures" |
| 10/841,006-May 7, 2004 2005-0067292-May 31, 2005 | Thompson, "Electrochemically Fabricated Structures Having Dielectric or Active Bases and Methods of and Apparatus for Producing Such Structures" |
| 10/841,100-May 7, 2004 2005-0032362-Feb. 10, 2005 7,109,118-Sep. 19, 2006 | Cohen, "Electrochemical Fabrication Methods Including Use of Surface Treatments to Reduce Overplating and/or Planarization During Formation of Multi-layer Three-Dimensional Structures" |
| 10/841,347-May 7, 2004 2005-0072681-Apr. 7, 2005 | Cohen, "Multi-step Release Method for Electrochemically Fabricated Structures" |
| 10/949,744-Sep. 24, 2004 2005-0126916-Jun. 16, 2005 7,498,714-Mar. 3, 2009 | Lockard, "Three-Dimensional Structures Having Feature Sizes Smaller Than a Minimum Feature Size and Methods for Fabricating |
| 10/995,609-Nov. 22, 2004 2005-0202660-Sep. 15, 2005 — | Cohen, "Electrochemical Fabrication Process Including Process Monitoring, Making Corrective Action Decisions, and Taking Appropriate Actions" |
| 11/028,957-Jan. 3, 2005 2005-0202667-Sep. 15, 2005 — | Cohen, "Electrochemical Fabrication Methods Incorporating Dielectric Materials and/or Using Dielectric Substrates" |
| 11/029,218-Jan. 3, 2005 2005-0199583-Sep. 15, 2005 7,524,427-Apr. 28, 2009 | Cohen, "Electrochemical Fabrication Methods Incorporating Dielectric Materials and/or Using Dielectric Substrates" |
| 11/029,220-Jan. 3, 2005 2005-014846-Jun. 30, 2005 7,271,888-Sep. 18, 2007 | Cohen, "Method and Apparatus for Maintaining Parallelism of Layers and/or Achieving Desired Thicknesses of Layers During the Electrochemical Fabrication of Structures" |
| 11/139,262-May 26, 2005 2006-0011486-Jan 19, 2006 7,501,328-Mar. 10, 2009 | Lockard, et al., "Methods for Electrochemically Fabricating Structures Using Adhered Masks, Incorporating Dielectric Sheets, and/or Seed Layers that are Partially Removed Via Planarization" |
| 11/506,586-Aug. 8, 2006 2007-0039828-Feb. 22, 2007 7,611,616-Nov. 3, 2009 | Cohen, "Mesoscale and Microscale Device Fabrication Methods Using Split Structures and Alignment Elements" |
| 11/733,195-Apr. 9, 2007 2008-0050524-Feb. 28, 2008 | Kumar, "Methods of Forming Three-Dimensional Structures Having Reduced Stress and/or Curvature" |
| 12/345,624-Dec. 29, 2008 — 8,070,931-Dec. 6, 2011 | Cohen, "Electrochemical Fabrication Method Including Elastic Joining of Structures" |
| 12/506,547 Jul. 21, 2009 2010-0051466-Mar. 4, 2010 — | Smalley, "Method of Forming Electrically Isolated Structures Using Thin Dielectric Coatings" |
| 12/906.970-Oct. 18, 2010 2011-0132767-Jun. 11, 2009 — | Wu, "Multi-Layer, Multi-Material Fabrication Methods for Producing Micro-Scale and Millimeter-Scale Devices with Enhanced Electrical or Mechanical Properties" |
| 13/021,939-May 7, 2004 2011-015580-Jun. 30, 2011 | Method of Electrochemically Fabricating Multilayer Structures Having Improved Interlayer Adhesion |

Though various portions of this specification have been provided with headers, it is not intended that the headers be used to limit the application of teachings found in one portion of the specification from applying to other portions of the specification. For example, it should be understood that alternatives acknowledged in association with one embodiment, are intended to apply to all embodiments to the extent that the features of the different embodiments make such application functional and do not otherwise contradict or remove all benefits of the adopted embodiment. Various other embodiments of the present invention exist. Some of these embodiments may be based on a combination of the teachings herein with various teachings incorporated herein by reference.

It is intended that the aspects of the invention set forth herein represent independent invention descriptions which Applicant contemplates as full and complete invention descriptions that Applicant believes may be set forth as independent claims without need of importing additional limitations or elements from other embodiments or aspects set forth herein for interpretation or clarification other when explicitly set forth in such independent claims once written. It is also understood that any variations of the aspects set forth herein represent individual and separate features that may be individually added to independent claims or dependent claims to further define an invention being claimed by those respective dependent claims should they be written.

In view of the teachings herein, many further embodiments, alternatives in design and uses of the embodiments of the instant invention will be apparent to those of skill in the art. As such, it is not intended that the invention be limited to the particular illustrative embodiments, alternatives, and uses described above but instead that it be solely limited by the claims presented hereafter.

We claim:

1. A method of forming at least one micro-scale or millimeter-scale structure, comprising:
   a) providing at least one sheet of structural material having a front side and a backside;
   b) using a laser beam to cut at least one opening completely through the at least one sheet from the front side to the back side in one or more regions to define at least one sheet material end of a structure to be formed;
   c) depositing at least one single material layer or multi-material layer directly or indirectly onto at least a portion of both sides of the at least one sheet material such the at least one single material not only is located on at least selected locations on both sides of the at least one sheet material but also occupies at least a portion of a side wall of the at least one opening in the at least one sheet material;
   d) locating a sacrificial material onto any exposed surface of the at least one single material layer or multi-material layer or onto a material that was previously deposited thereon;
   e) using a laser beam to cut completely through the at least one sheet of structural material, the at least one single material or multi-material layer, and completely through the sacrificial material located on at least a front side of the at least one sheet of structural material and at least partially through the sacrificial material located on the back side of the at least one sheet of structural material;
   f) removing the sacrificial material from the at least one single material layer or multi-material layer or other material that was previously deposited thereon, such that the structure is formed from a portion of the at least one sheet structural material and the at least a portion of the one single material layer or multi-material layers and wherein the at least one single material layer or multi-material layer defines a distal end of the structure or is located between a distal end of the structure and a distal end of the at least one sheet of structural material that forms part of the structure.

* * * * *